United States Patent
Mada et al.

(10) Patent No.: US 9,905,573 B1
(45) Date of Patent: Feb. 27, 2018

(54) THREE-DIMENSIONAL MEMORY DEVICE WITH ANGLED WORD LINES AND METHOD OF MAKING THEREOF

(71) Applicant: SANDISK TECHNOLOGIES LLC, Plano, TX (US)

(72) Inventors: Shogo Mada, Yokkaichi (JP); Akira Takahashi, Yokkaichi (JP); Motoki Umeyama, Yokkaichi (JP)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 15/251,374

(22) Filed: Aug. 30, 2016

(51) Int. Cl.
| | |
|---|---|
| H01L 27/115 | (2017.01) |
| H01L 27/11582 | (2017.01) |
| H01L 27/1157 | (2017.01) |
| H01L 27/11573 | (2017.01) |
| H01L 23/535 | (2006.01) |

(52) U.S. Cl.
CPC ...... H01L 27/11582 (2013.01); H01L 23/535 (2013.01); H01L 27/1157 (2013.01); H01L 27/11573 (2013.01)

(58) Field of Classification Search
CPC .......... H01L 27/11582; H01L 27/1157; H01L 27/11573; H01L 27/1158; H01L 27/11578
See application file for complete search history.

(56) References Cited

U.S. PATENT DOCUMENTS

| | | | |
|---|---|---|---|
| 5,915,167 A | 6/1999 | Leedy | |
| 7,952,136 B2 * | 5/2011 | Kito | G11C 16/10 257/326 |
| 8,187,932 B2 | 5/2012 | Nguyen et al. | |
| 8,284,601 B2 * | 10/2012 | Son | H01L 27/0207 365/185.05 |

(Continued)

FOREIGN PATENT DOCUMENTS

| | | |
|---|---|---|
| KR | 20100109745 A | 10/2010 |
| KR | 20110021444 A | 3/2011 |

OTHER PUBLICATIONS

Endoh et al., "Novel Ultra High Density Memory with a Stacked-Surrounding Gate Transistor (S-SGT) Structured Cell," IEDM Proc. (2001) 33-36.

(Continued)

*Primary Examiner* — Allison P Bernstein
(74) *Attorney, Agent, or Firm* — The Marbury Law Group PLLC

(57) ABSTRACT

A mesa structure is formed over peripheral devices on a substrate. An alternating stack of insulating layers and spacer material layers is formed over the substrate and the mesa structure. A region of the alternating stack overlying the mesa structure is removed to provide a region in which the layers in the alternating stack extend along a non-horizontal direction that is parallel to the dielectric sidewall of the mesa structure. Memory stack structures and backside contact via structures are formed through another region of the alternating stack that includes horizontally-extending (Continued)

portions of the layers within the alternating stack. The spacer material layers are provided as, or are replaced with, electrically conductive layers. Top surfaces of portions of the electrically conductive layers that extend parallel to the dielectric sidewall of the mesa structure can be contacted by word line contact via structures.

22 Claims, 41 Drawing Sheets

(56) References Cited

U.S. PATENT DOCUMENTS

| | | | |
|---|---|---|---|
| 8,394,716 | B2 | 3/2013 | Hwang et al. |
| 8,520,425 | B2 | 8/2013 | Xiao et al. |
| 8,884,357 | B2 | 11/2014 | Wang et al. |
| 8,946,023 | B2 | 2/2015 | Makala et al. |
| 9,230,987 | B2 | 1/2016 | Pachamuthu et al. |
| 2008/0149913 | A1 | 6/2008 | Tanaka et al. |
| 2009/0230449 | A1 | 9/2009 | Sakaguchi et al. |
| 2010/0090188 | A1 | 4/2010 | Futatsuyama |
| 2010/0254191 | A1 | 10/2010 | Son et al. |
| 2012/0195128 | A1 | 8/2012 | Fujiwara et al. |
| 2012/0256247 | A1 | 10/2012 | Alsmeier |
| 2013/0270714 | A1 | 10/2013 | Lee et al. |
| 2015/0179577 | A1 | 6/2015 | Tobitsuka et al. |
| 2015/0179659 | A1 | 6/2015 | Takaki et al. |
| 2016/0204117 | A1 | 7/2016 | Liu et al. |

OTHER PUBLICATIONS

Invitation to Pay Additional Fees and Search Report from the European Patent Office received in connection with International Application No. PCT/US2014/071397; dated Mar. 26, 2015.
International Search Report for PCT/US2014/071397, dated Mar. 18, 2015 (5 pages).
Written Opinion of the International Searching Authority for PCT/US2014/071397, dated Mar. 18, 2015 (11 pages).
International Preliminary Report on Patentability for International Application No. PCT/US2014/071397, 12 pages, dated Jun. 21, 2016.
Non-Final Office Action for corresponding U.S. Appl. No. 14/643,211, filed Mar. 10, 2015, dated Apr. 4, 2016, containing 22 pages.

* cited by examiner

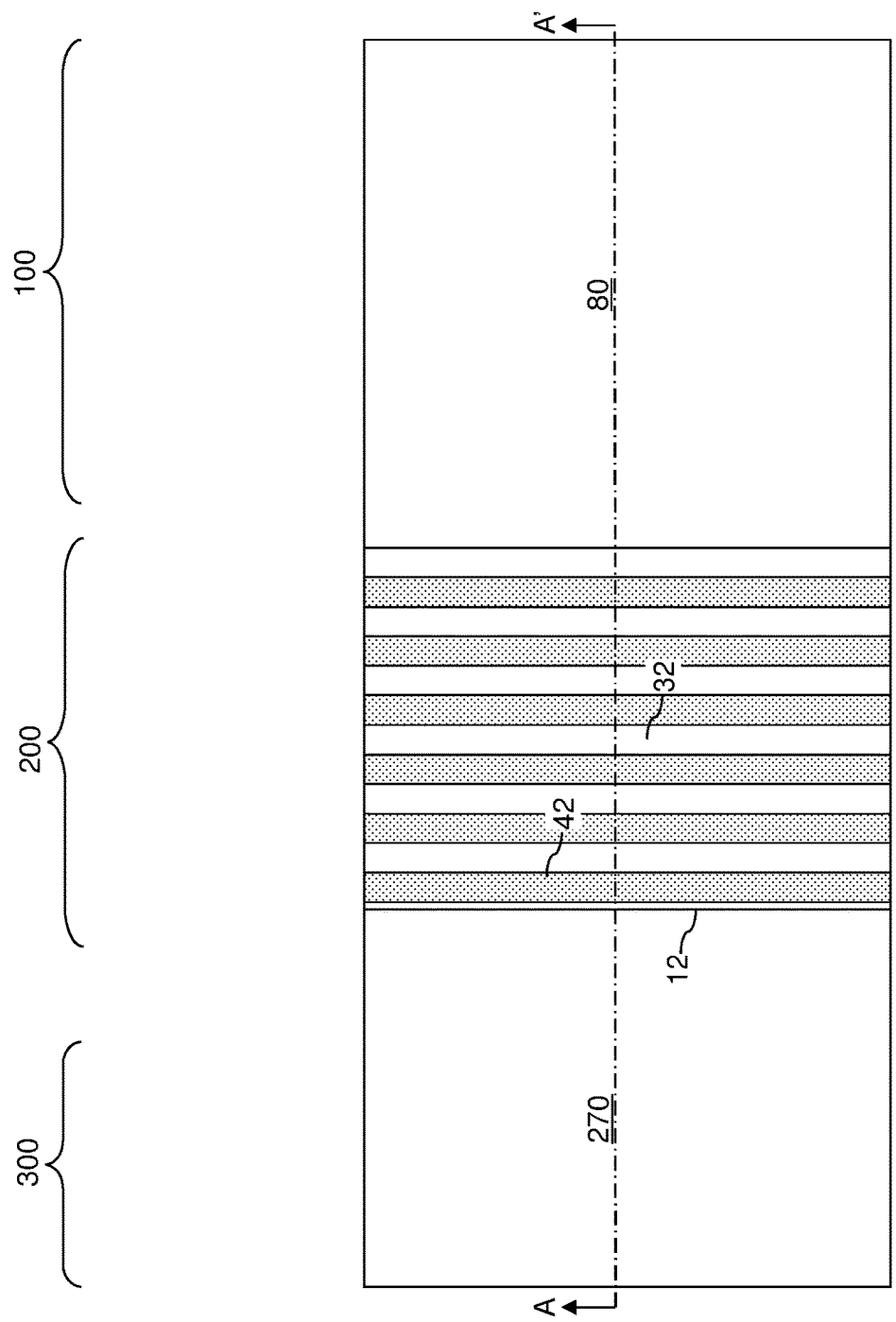

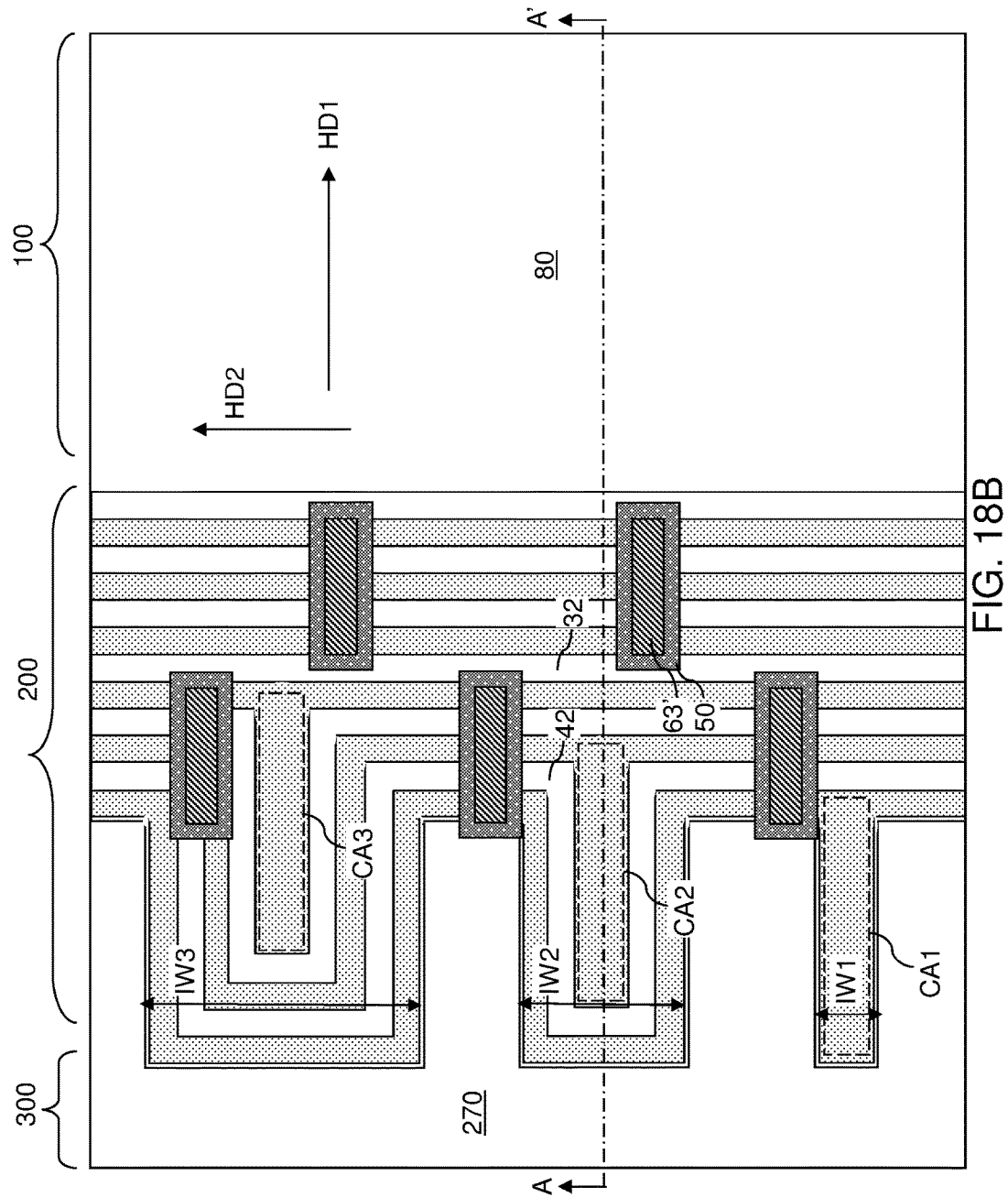

THREE-DIMENSIONAL MEMORY DEVICE WITH ANGLED WORD LINES AND METHOD OF MAKING THEREOF

FIELD

The present disclosure relates generally to the field of semiconductor devices, and particular to a three-dimensional memory device employing angled word lines and methods of manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a three-dimensional memory device is provided, which comprises: a mesa structure located over a substrate and having a top surface and at least one dielectric sidewall; an alternating stack of insulating layers and electrically conductive layers located over the substrate and on the at least one dielectric sidewall of the mesa structure, wherein each of the electrically conductive layers comprises a respective continuously-extending conductive material portion of a homogeneous composition that includes a respective horizontal sub-portion that extends parallel to a top surface of the substrate and a respective non-horizontal sub-portion that extends parallel to the at least one dielectric sidewall of the mesa structure; memory stack structures extending through a region of the alternating stack that includes the horizontal sub-portions of the electrically conductive layers, wherein each of the memory stack structures comprises a memory film and a vertical semiconductor channel; and word line contact via structures that contact top surfaces of non-horizontal sub-portions of the electrically conductive layers and embedded in a contact level dielectric layer overlying the alternating stack.

According to another aspect of the present disclosure, a method of forming a three-dimensional memory device is provided. A mesa structure is formed over a substrate. The mesa structure has a top surface and at least one dielectric sidewall. An alternating stack of insulating layers and spacer material layers is formed over a top surface of the substrate, the top surface of the mesa structure, and the at least one dielectric sidewall of the mesa structure. A peripheral portion of the alternating stack is removed from above a horizontal plane including the top surface of the mesa structure, while not removing an array portion of the alternating stack underneath the horizontal plane. Memory stack structures are formed through the array portion of the alternating stack. Each of the memory stack structures comprises a memory film and a vertical semiconductor channel, wherein the spacer material layers are replaced with, or formed as, electrically conductive layers, and top surfaces of the electrically conductive layers are physically exposed at or below the horizontal plane. Word line contact via structures are formed directly on the top surfaces of the electrically conductive layers.

BRIEF DESCRIPTION OF THE DRAWINGS

FIG. 4B is a top-down view of the first exemplary structure of FIG. 4A. The plane A-A' is the plane of the cross-section of FIG. 4A.

FIG. 18B is a top-down view of the third exemplary structure of FIG. 18A.

DETAILED DESCRIPTION

Figure 1:
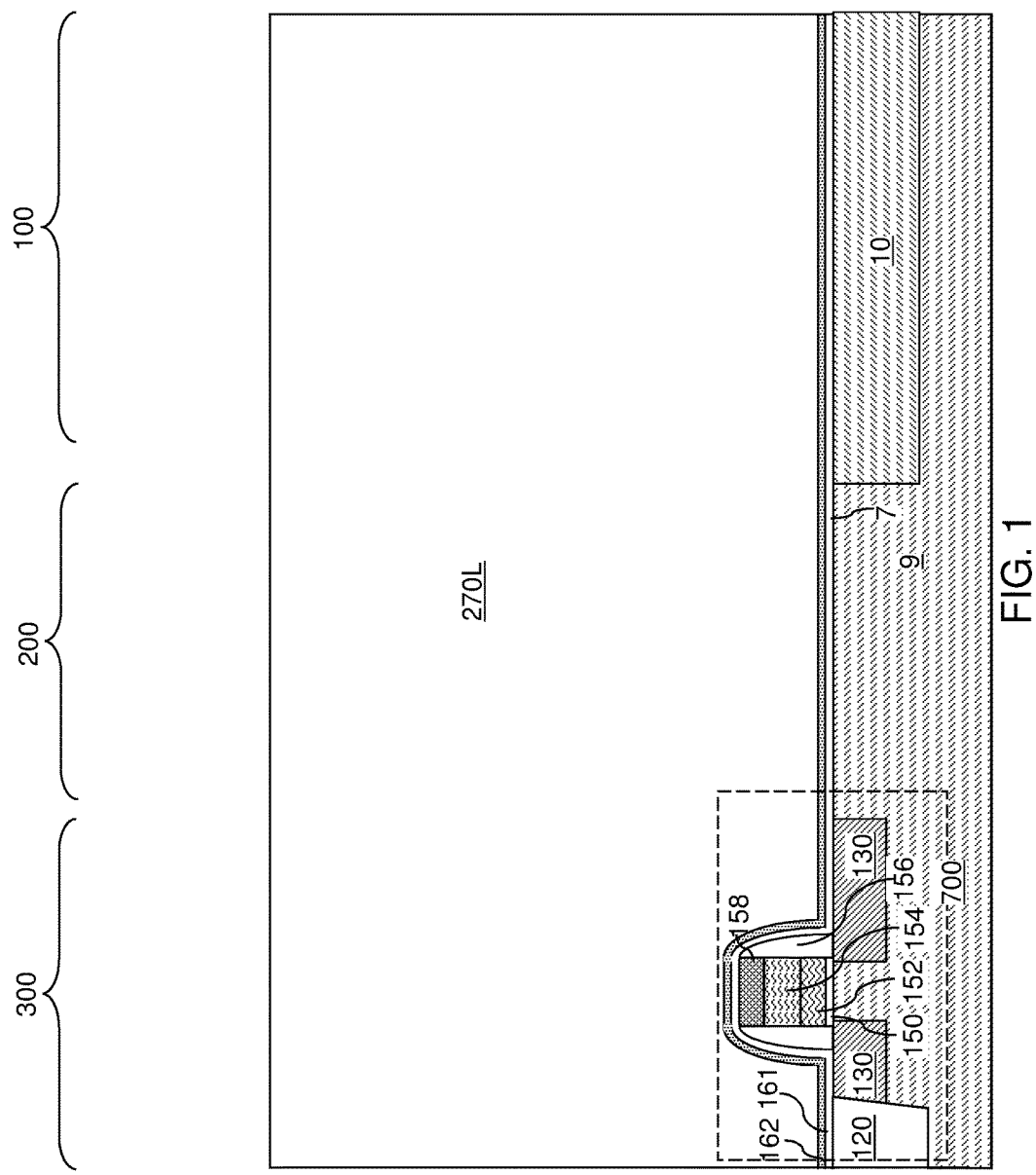
FIG. 1 is a schematic vertical cross-sectional view of a first exemplary structure after formation of at least one peripheral device and a planarization dielectric layer according to a first embodiment of the present disclosure.

As discussed above, the present disclosure is directed to three-dimensional memory devices including a vertical stack of multilevel memory arrays and methods of making thereof, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Referring to FIG. 1, an exemplary structure according to an embodiment of the present disclosure is illustrated, which can be employed, for example, to fabricate a device structure containing vertical NAND memory devices. The exemplary structure includes a substrate, which can be a semiconductor substrate (9, 10). The substrate can include a substrate semiconductor layer 9. The substrate semiconductor layer 9 maybe a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface. An optional doped semiconductor well 10 can be formed by implanting electrical dopants into an upper portion of the substrate semiconductor layer 9. In one embodiment, the doped semiconductor well 10 can have a doping of the same conductivity type (e.g., p-type) as the substrate semiconductor layer 9. In another embodiment, the doped semiconductor well 10 can have a doping of the opposite conductivity type than the substrate semiconductor layer 9. For example, the substrate semiconductor layer 9 can be n-doped and the doped semiconductor well 10 can be p-doped, or vice versa. In one embodiment, the doped semiconductor well 10 can be formed within a memory array region 100.

As used herein, a "semiconducting material" refers to a material having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from $1.0$ S/cm to $1.0 \times 10^{5}$ S/cm upon suitable doping with an electrical dopant. As used herein, an "electrical dopant" refers to a p-type dopant that adds a hole to a valance band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material, i.e., to have electrical conductivity greater than $1.0 \times 10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry can be formed on a portion of the substrate semiconductor layer 9. The at least one semiconductor device can include, for example, field effect transistors. For example, at least one shallow trench isolation structure 120 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (150, 152, 154, 158), each of which can include a gate dielectric 150, a gate electrode (152, 154), and a gate cap dielectric 158. The gate electrode (152, 154) may include a stack of a first gate electrode portion 152 and a second gate electrode portion 154. At least one gate spacer 156 can be formed around the at least one gate structure (150, 152, 154, 158) by depositing and anisotropically etching a dielectric liner. Active regions 130 can be formed in upper portions of the substrate semiconductor layer 9, for example, by introducing electrical dopants employing the at least one gate structure (150, 152, 154, 158) as masking structures. Additional masks may be employed as needed. The active region 130 can include source regions and drain regions of field effect transistors. A first dielectric liner 161 and a second dielectric liner 162 can be optionally formed. Each of the first and second dielectric liners (161, 162) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 161 can be a silicon oxide layer, and the second dielectric liner 162 can be a silicon nitride layer. The least one semiconductor device for the peripheral circuitry can contain a driver circuit for memory devices to be subsequently formed, which can include at least one NAND device.

The region (i.e., area) of the at least one semiconductor device 700 is herein referred to as a peripheral device region 200. The region in which a memory array is subsequently formed is herein referred to as a memory array region 100. A contact region 300 for subsequently forming stepped terraces of electrically conductive layers can be provided between the memory array region 100 and the peripheral device region 200.

A dielectric material can be deposited over the at least one semiconductor device 700, and can be subsequently planarized to form a planarization dielectric layer 270L. The planarization dielectric layer 270L includes a dielectric material that is self-planarizing, or is conducive to planarization. For example, the dielectric material of the planarization dielectric layer 270L can include a spin-on glass (SOG) that can be formed by spin coating and provides a planar top surface upon curing. Alternatively or additionally, the dielectric material of the planarization dielectric layer 270L can include a doped silicate glass such as borophosphosilicate glass or fluorosilicate glass, or undoped silicate glass (e.g., silicon oxide deposited using a TEOS source). In this case, the planarization dielectric layer 270L can be planarized, for example, by chemical mechanical planarization (CMP), to provide a planar to surface. The thickness of the planarization dielectric layer 270L, as measured between the top surface 7 of the substrate (9, 10) and the top surface of the planarization dielectric layer 270L in the memory array region 100, can be greater than the total thickness of an alternating stack of first material layers (such as insulating layers) and second material layers (such as sacrificial material layers) to be subsequently formed. For example, the thickness of the planarization dielectric layer 270L can be in a range from 800 nm to 20,000 nm, although lesser and greater thicknesses can also be employed.

Figure 2:
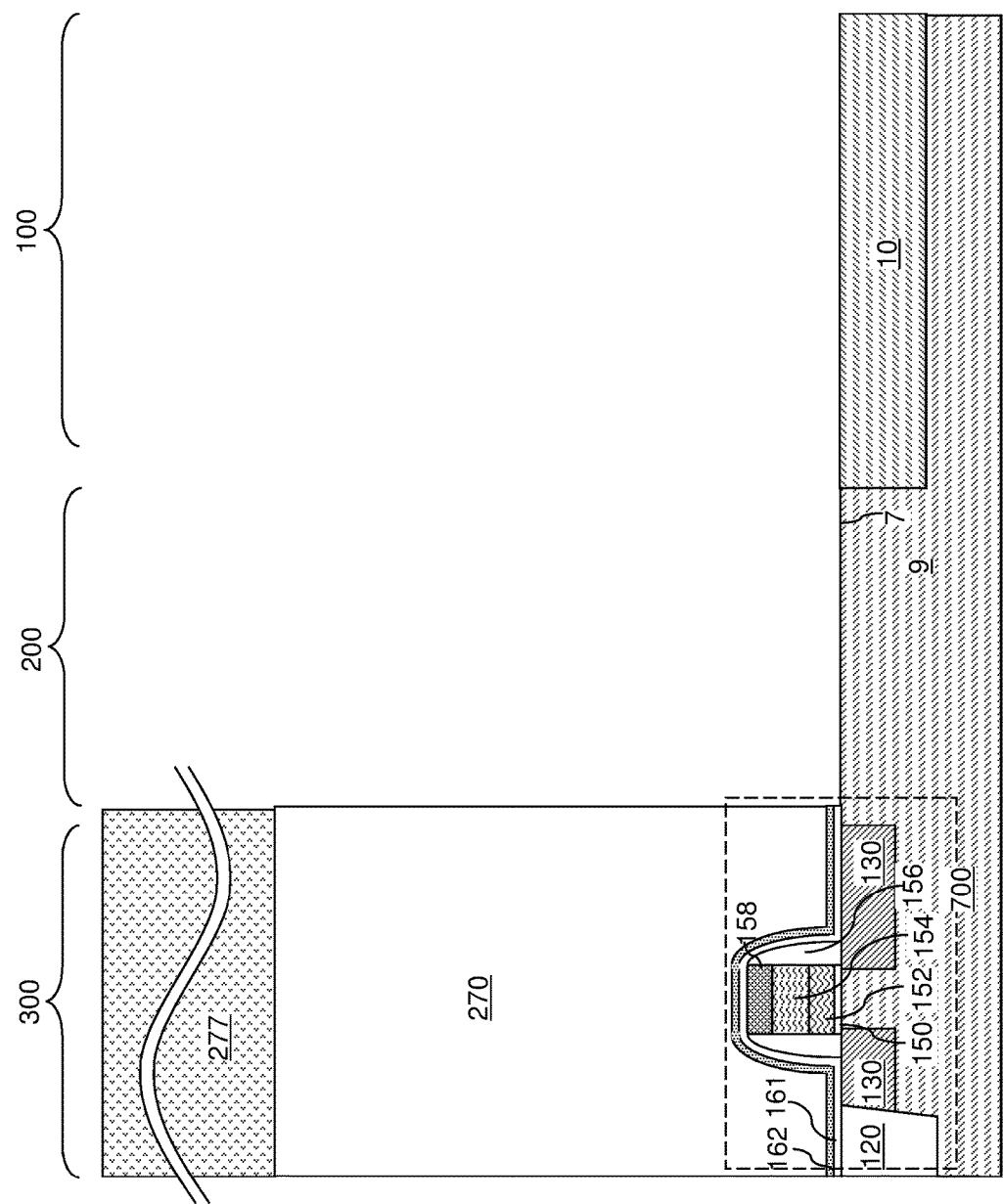
FIG. 2 is a schematic vertical cross-sectional view of the first exemplary structure after formation of a dielectric mesa structure according to the first embodiment of the present disclosure.

Referring to FIG. 2, a masking layer 277 such as a patterned photoresist layer can be formed over the planarization dielectric layer 270L. The masking layer 277 covers the peripheral device region 300 and does not cover the memory array region 100 or the contact region 200. At least one anisotropic etch and/or at least one isotropic etch can be performed employing the masking layer as an etch mask to remove physically exposed portions of the planarization dielectric layer 270L. As used herein, a "physically exposed portion" refers to a portion that adjoins vacuum or a fluid phase environment (i.e., a gas phase environment or a liquid phase environment) or a plasma phase environment. The material of the planarization dielectric layer 270L is removed from the memory array region 100 and the contact region 200. Portions of the dielectric liners (161, 162) can be removed from the memory array region 100 and the contact region 200. The remaining portion of the planarization dielectric layer 270L in the peripheral device region 300 constitutes a mesa structure 270, which has a top surface and at least one dielectric sidewall. If the entire mesa structure 270 is formed of a dielectric (i.e., insulating) material, then it comprises a dielectric mesa structure 270. While layer 270L is preferably a dielectric (i.e., insulating layer), in another embodiment, layer 270L may be a semiconductor or conductive layer which is etched to form the mesa structure followed by forming a dielectric (i.e., insulating) layer over the top and side of the mesa structure to form the dielectric sidewall of the mesa structure 270. Depending on the degree of lateral etching during the patterning of the dielectric mesa structure 270, the at least one sidewall of the dielectric mesa structure 270 can be substantially vertical, or can be tapered. As used herein, a sidewall is substantially vertical if the angle between the sidewall and a vertical line which is perpendicular to the top surface 7 of the substrate (9, 10) is not greater than 5 degrees, and is tapered if the angle between the sidewall and the vertical line is greater than 5 degrees.

Figure 3:
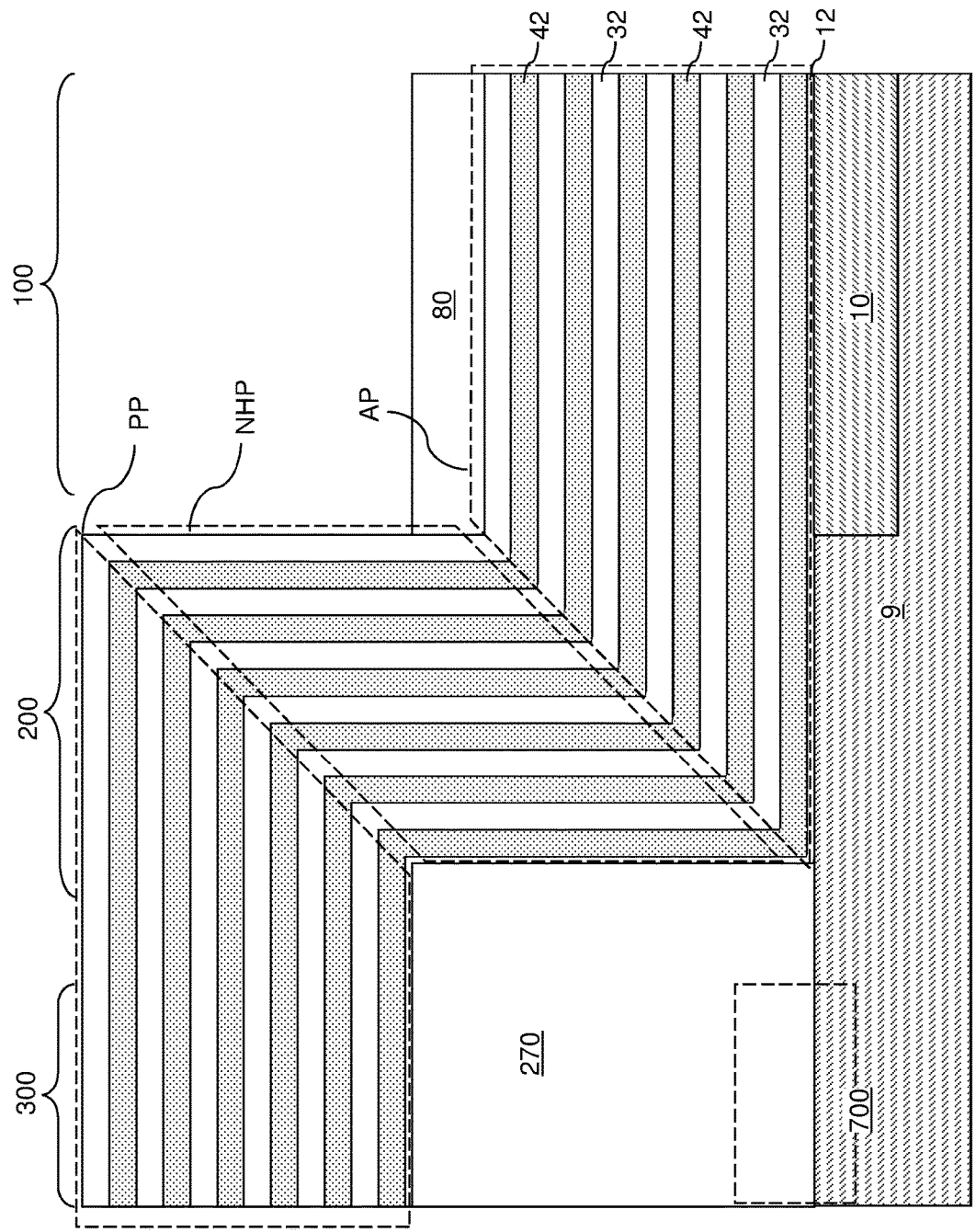
FIG. 3 is a schematic vertical cross-sectional view of the first exemplary structure after formation of an alternating stack of insulating layers and sacrificial material layers and a planarization stopping layer according to the first embodiment of the present disclosure.

Referring to FIG. 3, a gate dielectric layer 12 can be formed on the top surface of the substrate (9, 10) by deposition of a gate dielectric material and/or conversion of a surface portion of the substrate (9, 10) into a dielectric material layer. The gate dielectric layer 12 can include at least one dielectric semiconductor compound such as silicon oxide and/or silicon oxynitride, and/or at least one dielectric metal oxide such as aluminum oxide and/or hafnium oxide. If a dielectric material layer within the gate dielectric layer 12 is formed by deposition, a conformal deposition method can be employed to deposit such a dielectric material layer. The thickness of the gate dielectric layer 12 can be in a range from 1 nm to 6 nm, although lesser and greater thicknesses can also be employed. Alternatively, an insulating layer 32 can be deposited in lieu of the gate dielectric layer 12.

A stack of an alternating plurality of first material layers (which can be insulating layers 32) and second material layers (which can be sacrificial material layer 42) is formed over the top surface of the substrate (9, 10), the top surface of the dielectric mesa structure 270, and the at least one sidewall of the dielectric mesa structure 270. Each first material layer and each second material layer can be deposited by a conformal deposition method such as low pressure chemical vapor deposition (LPCVD) or atomic layer deposition (ALD). The alternating plurality of the first material layers and the second material layers can be formed on the top surface of the gate dielectric layer 12.

As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42. As used herein, a "prototype" structure or an "in-process" structure refers to a transient structure that is subsequently modified in the shape or composition of at least one component therein.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium. As used herein, a "spacer material layer" refers to a material layer that provides vertical separation between two layers, such as a pair of insulating layers 32. Thus, an alternating stack of insulating layers 32 and spacer material layers (as embodied as the sacrificial material layers 42) can be formed. In this case, the spacer material layers are formed as sacrificial material layers 42, and are subsequently replaced with the electrically conductive layers after formation of the memory stack structures.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

Each of the insulating layers 32 and the sacrificial material layers 42 include a first horizontal sub-portion having a respective uniform thickness and horizontally extending within the memory array region 100 and the contact region 200, a non-horizontal sub-portion having the respective uniform thickness and extending within the contact region 200 along a non-horizontal direction (such as the vertical direction), and a second horizontal sub-portion having the respective uniform thickness and horizontally extending over the dielectric mesa structure 270 and within the peripheral device region and the contact region 300. The portion of the alternating stack (32, 42) that includes the first horizontal sub-portions of the insulating layers 32 and the sacrificial material layers 42 is herein referred to as an array portion AP of the alternating stack (32, 42), and the portion of the alternating stack (32, 42) that includes the second horizontal sub-portions of the alternating stack (32, 42) is herein referred to as a peripheral portion PP of the alternating stack (32, 42). A non-horizontally extending portion NHP of the alternating stack (32, 42) includes the vertical sub-portions of the insulating layers 32 and the sacrificial material layers 42. In one embodiment, the non-horizontal sub-portions of the insulating layers 32 and the sacrificial material layers 42 can extend along the vertical direction or a substantially vertical direction. As used herein, a "sub-portion" refers to a subset of a portion that is less than the entirety of the portion.

A dielectric cap layer 80 can be formed over the first horizontal sub-portions of the insulating layers 32 and the sacrificial material layers 42 in the memory array region 100. The dielectric cap layer 80 can be deposited by a self-planarizing process such as spin coating. For example, the dielectric cap layer 80 can include spin-on glass (SOG). The thickness of the dielectric cap layer 80 can be selected such that the top surface of the dielectric cap layer 80 is formed at, or below, the horizontal plane including the top surface of the dielectric mesa structure 270. Thus, the dielectric cap layer 80 is formed over a region of the alternating stack (32, 42) that is laterally offset from the dielectric mesa structure 270. Alternatively, the dielectric cap layer 80 may comprise a silicon nitride or silicon oxynitride etch stop layer deposited over the peripheral portion PP, the non-horizontally extending portion NHP and the array portion AP of the alternating stack (32, 42).

Figure 4A:
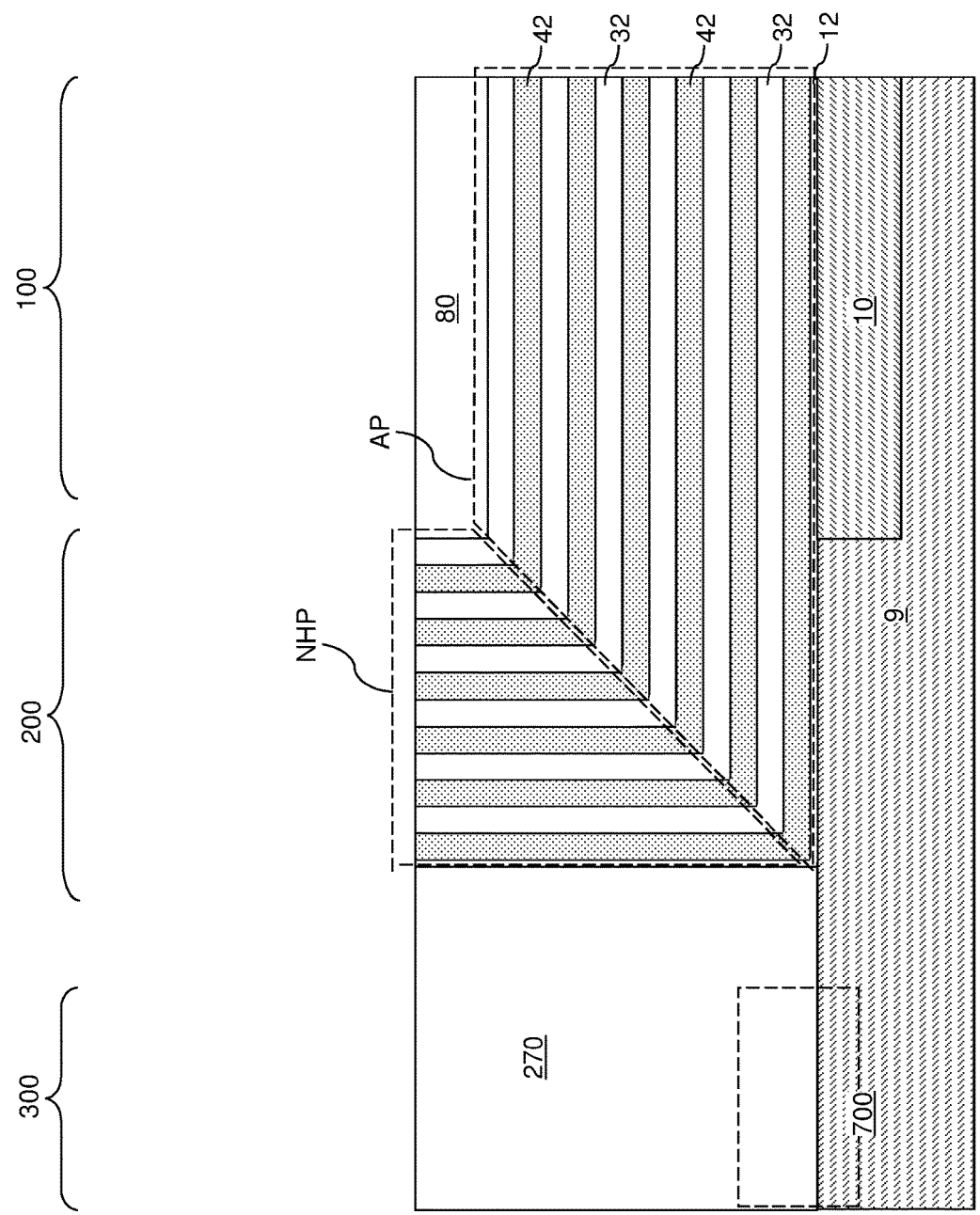
FIG. 4A is a schematic vertical cross-sectional view of the first exemplary structure after a planarization process according to the first embodiment of the present disclosure.

Referring to FIGS. 4A and 4B, the peripheral portion PP of the alternating stack (32, 42) is removed by a planarization process that employs the dielectric cap layer 80 as a stopping structure. For example, the peripheral portion PP of the alternating stack (32, 42) can be removed from above the horizontal plane including the top surface of the dielectric mesa structure 270, while the array portion AP of the alternating stack (32, 42) underneath the horizontal plane is not removed. In one embodiment, a patterned recess etch may be employed. In this case, a photoresist layer may be applied and to cover the area overlying the dielectric cap layer 80 and not to cover the peripheral portion PP of the alternating stack (32, 42), and an isotropic etch or an anisotropic etch may be performed to remove the peripheral portion PP of the alternating stack (32, 42) while the photoresist layer protects the array portion AP of the alternating stack (32, 42). The photoresist layer can be subsequently removed, for example, by ashing. Additionally or alternatively, chemical mechanical planarization (CMP) can be employed to remove all, or a residual portion, of the peripheral portion PP of the alternating stack (32, 42).

Use of the dielectric cap layer 80 as a stopping structure during the planarization process can provide a planarized structure in which top surfaces of the various layers in the non-horizontally extending portion NHP of the alternating stack (32, 42) are within the same horizontal plane as a top surface of the dielectric cap layer 80, which may be recessed with respect to the top surface of the dielectric cap layer 80 as formed at the processing step of FIG. 3. Optionally, the dielectric mesa structure 270 may be employed as an additional stopping structure during the planarization process. In one embodiment, the top surfaces of the remaining portions of the dielectric cap layer 80, the non-horizontally extending portion NHP of the alternating stack (32, 42), and the dielectric mesa structure 270 can be located within a same horizontal plane after the planarization process.

Figure 5A:
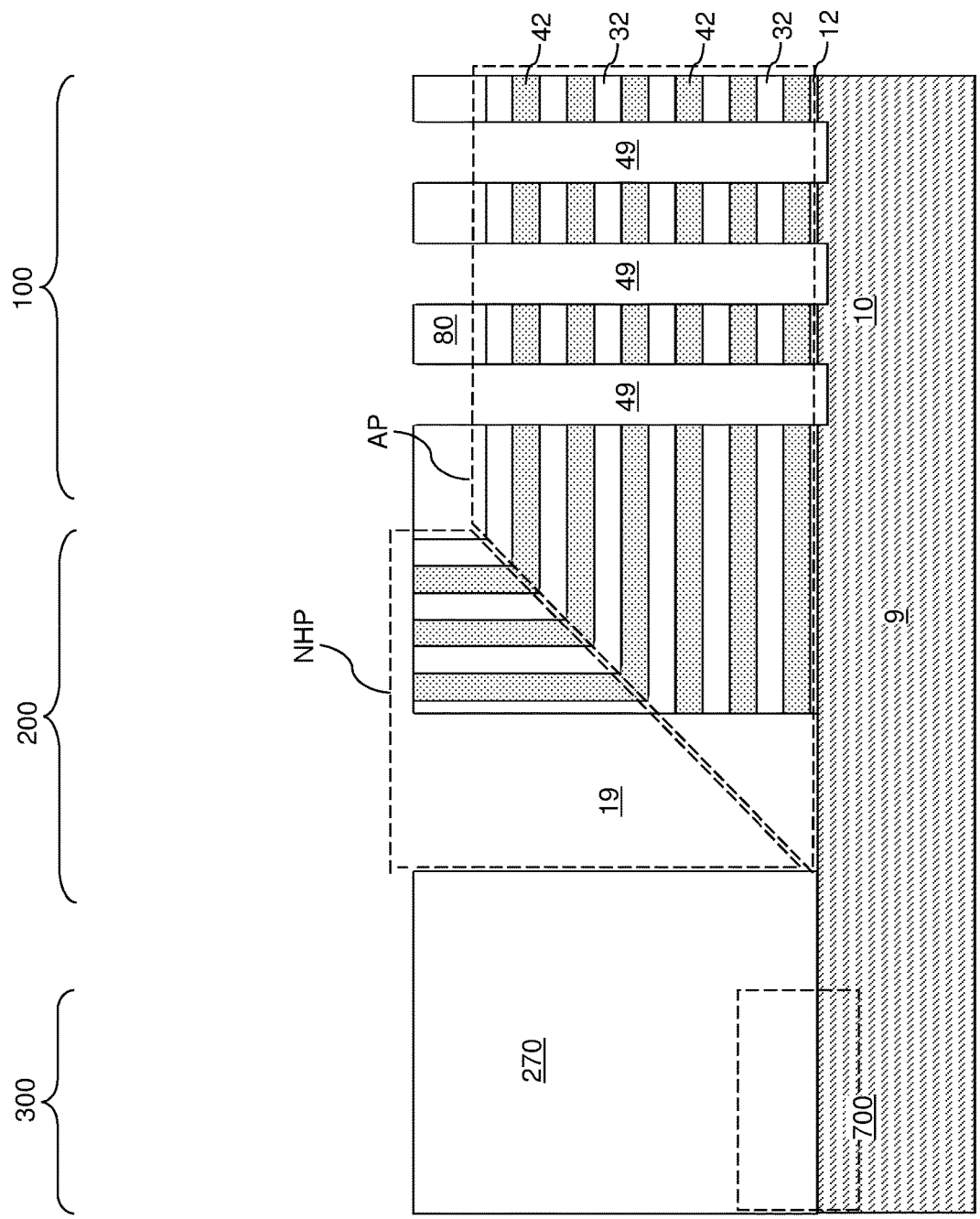
FIG. 5A is a schematic vertical cross-sectional view of the first exemplary structure after formation of memory openings and support openings according to the first embodiment of the present disclosure.
Figure 5B:
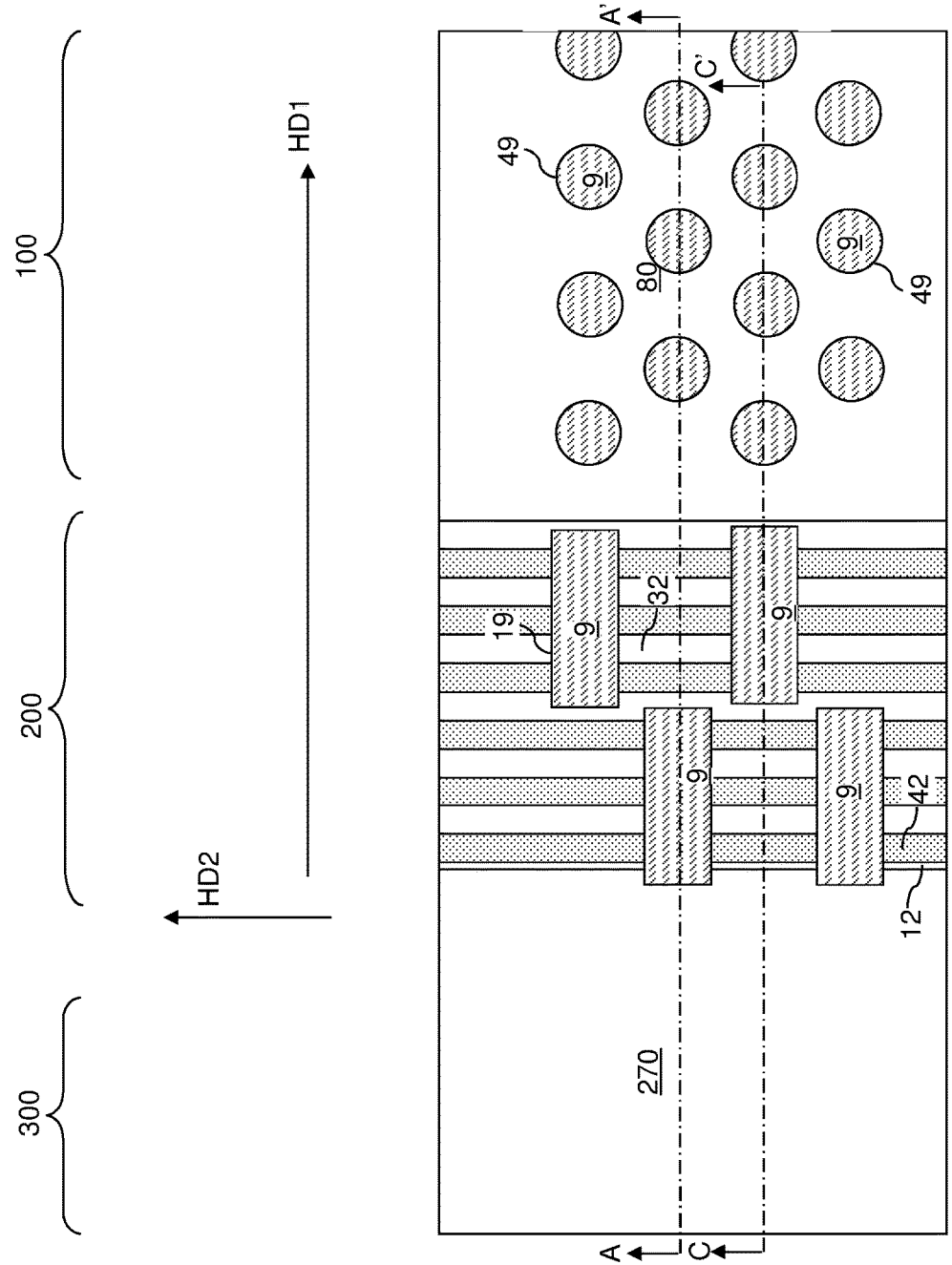
FIG. 5B is a top-down view of the first exemplary structure of FIG. 5A. The plane A-A' is the plane of the cross-section of FIG. 5A.
Figure 5C:
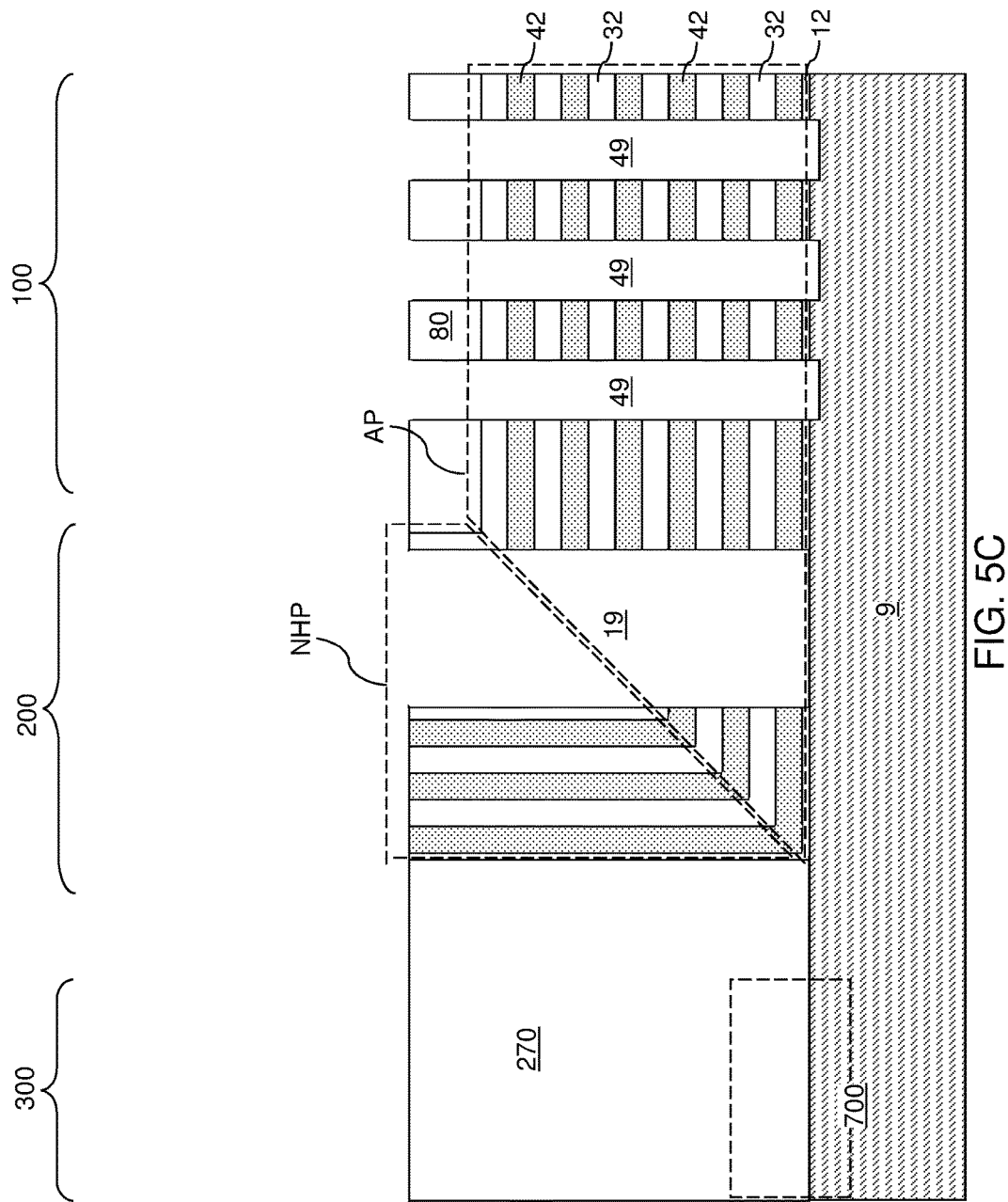
FIG. 5C is a schematic vertical cross-sectional view of the first exemplary structure of FIG. 5B along the plane C-C'.

Referring to FIGS. 5A-5C, a lithographic material stack (not shown) including at least a photoresist layer can be formed over the dielectric cap layer 80, and can be lithographically patterned to form openings within the memory array region 100 and the contact region 200. The pattern in the lithographic material stack can be transferred through the dielectric cap layer 80 and through entirety of the alternating stack (32, 42) by at least one anisotropic etch that employs the patterned lithographic material stack as an etch mask. Portions of the alternating stack (32, 42) underlying the openings in the patterned lithographic material stack are etched to form memory openings 49 and support openings 19. In other words, the transfer of the pattern in the patterned lithographic material stack through the alternating stack (32, 42) forms the memory openings 49 and the support openings 19 that extend through the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 can be substantially vertical, or can be tapered. The patterned lithographic material stack can be subsequently removed, for example, by ashing.

The memory openings 49 are formed through the array portion AP of the alternating stack (32, 42), which is located within the memory array region 100. The support openings 19 are formed through the non-horizontally extending portion NHP of the alternating stack (32, 42), which is located within the contact region 200. In one embodiment, the memory openings 49 can be formed with substantially elliptical or substantially circular horizontal cross-sectional areas. In one embodiment, the support openings 19 can be formed with substantially rectangular horizontal cross-sectional areas.

The memory openings 49 are formed through the gate dielectric layer 12 so that the memory openings 49 extend from the top surface of the alternating stack (32, 42) to at least the top surface of the doped semiconductor well 10. A top surface of the substrate (9, 10) is physically exposed at a bottom of each of the memory openings 49. In one embodiment, an overetch into the doped semiconductor well 10 may be optionally performed after the top surface of the doped semiconductor well 10 is physically exposed at a bottom of each memory opening 49. The overetch may be performed prior to, or after, removal of the lithographic material stack. In other words, the recessed surfaces of the doped semiconductor well 10 may be vertically offset from the undressed top surfaces of the doped semiconductor well 10 by a recess depth. The recess depth can be, for example, in a range from 1 nm to 50 nm, although lesser and greater recess depths can also be employed. The overetch is optional, and may be omitted. If the overetch is not performed, the bottom surface of each memory opening 49 can be coplanar with the topmost surface of the doped semiconductor well 10. Each of the memory openings 49 can include a sidewall (or a plurality of sidewalls) that extends substantially perpendicular to the topmost surface of the substrate. The array of memory openings 49 is formed in the memory array region 100. The substrate semiconductor layer 9 and the doped semiconductor well 10 collectively constitutes a substrate (9, 10), which can be a semiconductor substrate. Alternatively, the doped semiconductor well 10 may be omitted, and the memory openings 49 can be extend to a top surface of the substrate semiconductor layer 9.

The support openings 19 can be formed through the non-horizontally extending portion NHP of the alternating stack (32, 42) and a peripheral sub-portion of the array portion AP of the alternating stack (32, 42). In an illustrative example, a sidewall of the dielectric mesa structure 270 can be substantially perpendicular to a first horizontal direction HD1 (i.e., word line direction), and can be parallel to a second horizontal direction HD2 (i.e., bit line direction). The support openings can extend through the non-horizontally extending portion NHP of the alternating stack (32, 42) and an underlying peripheral sub-portion of the array portion AP of the alternating stack (32, 42). In one embodiment, the support openings 19 can be formed with the substantially rectangular horizontal cross-sectional areas having a length which is greater than the width by at least two times, such as by three to one hundred times. The length extends in the first horizontal direction HD1, and the width extends in the second horizontal direction HD2. Thus, the support openings 19 cut through plural pairs of insulating layers 32 and sacrificial layers 42, as shown in FIG. 5B.

Figure 6A:
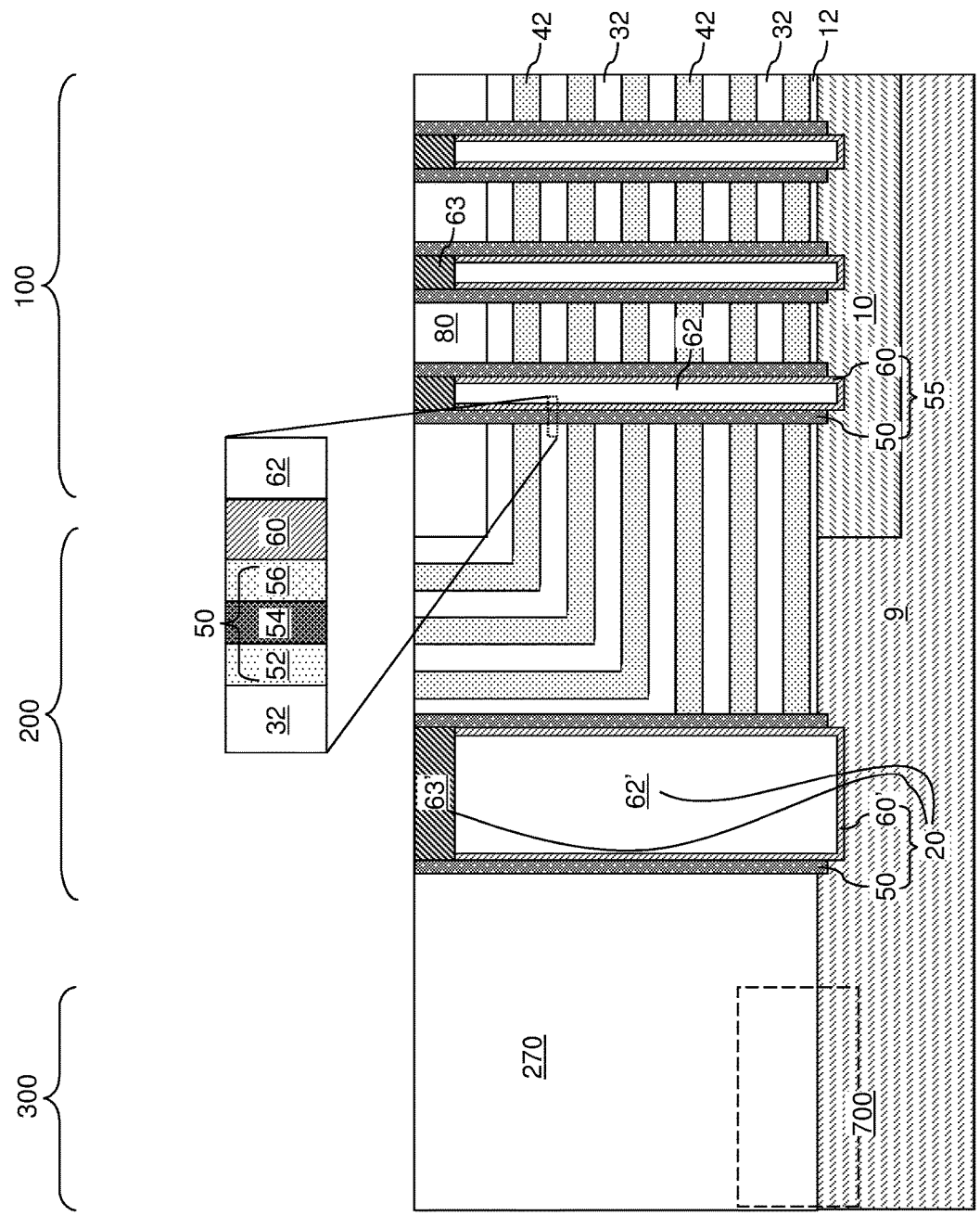
FIG. 6A is a schematic vertical cross-sectional view of the first exemplary structure after formation of memory stack structures and support pillar structures according to the first embodiment of the present disclosure.
Figure 6B:
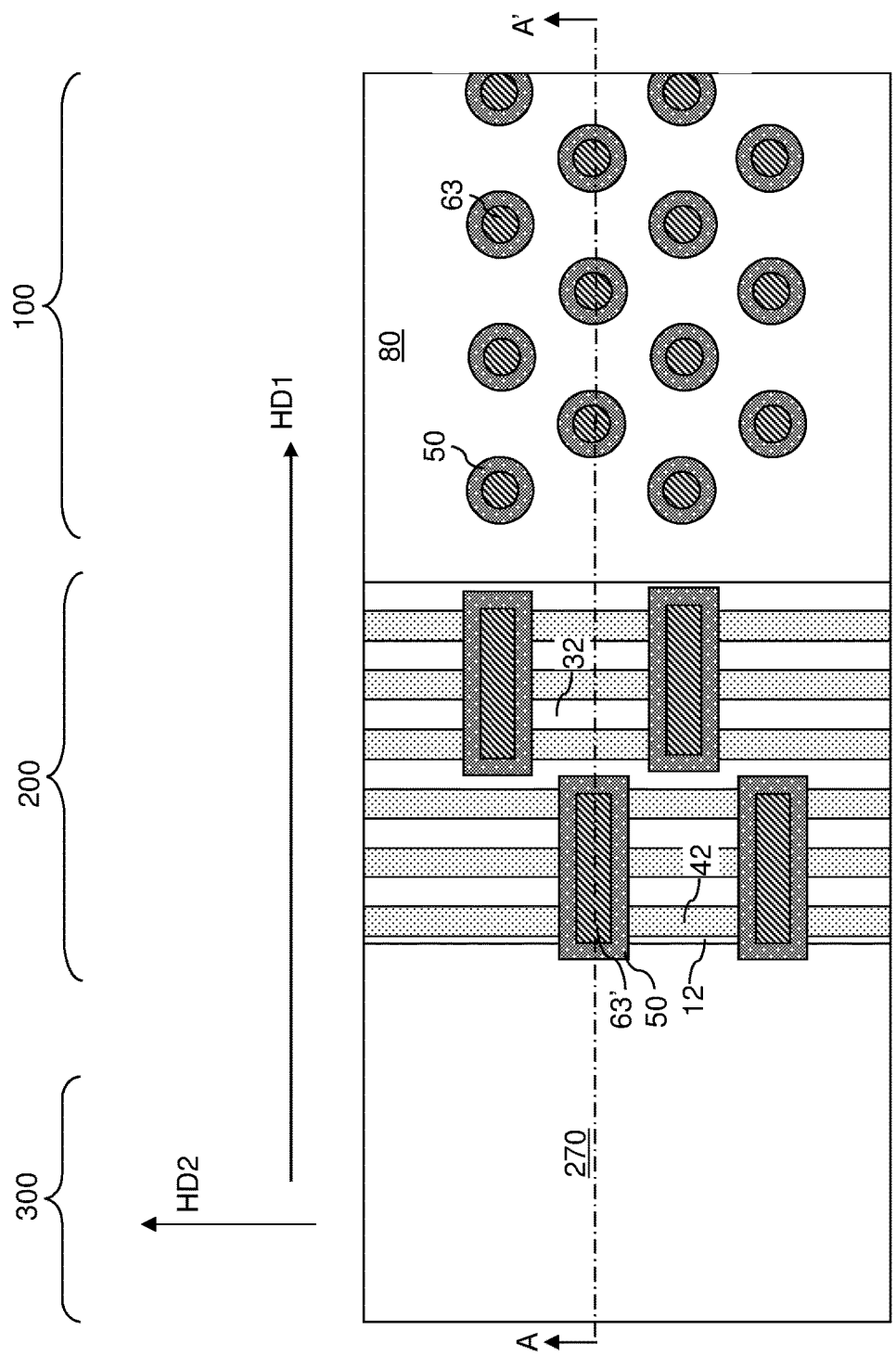
FIG. 6B is a top-down view of the first exemplary structure of FIG. 6A. The plane A-A' is the plane of the cross-section of FIG. 6A.

Referring to FIGS. 6A and 6B, memory stack structures 55 and support pillar structures 20 are formed in the memory openings 49 and in the support openings 19, respectively. Specifically, a stack of layers including a blocking dielectric layer 52, a charge storage layer 54, and a tunneling dielectric layer 56 can be sequentially deposited in each of the memory openings 49 and the support openings 19.

The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions.

Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed. Alternatively, the blocking dielectric layer 52 can be omitted, and a backside blocking dielectric layer can be formed after formation of backside recesses on surfaces of memory films to be subsequently formed.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within backside recesses into sacrificial material layers 42. In one embodiment, the charge storage layer 54 includes a silicon nitride layer. In one embodiment, the sacrificial material layers 42 and the insulating layers 32 can have vertically coincident sidewalls, and the charge storage layer 54 can be formed as a single continuous layer.

In another embodiment, the sacrificial material layers 42 can be laterally recessed with respect to the sidewalls of the insulating layers 32, and a combination of a deposition process and an anisotropic etch process can be employed to form the charge storage layer 54 as a plurality of memory material portions that are vertically spaced apart. While the present disclosure is described employing an embodiment in which the charge storage layer 54 is a single continuous layer, embodiments are expressly contemplated herein in which the charge storage layer 54 is replaced with a plurality of memory material portions (which can be charge trapping material portions or electrically isolated conductive material portions) that are vertically spaced apart.

The charge storage layer 54 can be formed as a single charge storage layer of homogeneous composition, or can include a stack of multiple charge storage layers. The multiple charge storage layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer 54 may comprise an insulating charge trapping material, such as one or more silicon nitride segments. Alternatively, the charge storage layer 54 may comprise conductive nanoparticles such as metal nanoparticles, which can be, for example, ruthenium nanoparticles. The charge storage layer 54 can be formed, for example, by chemical vapor deposition (CVD), atomic layer deposition (ALD), physical vapor deposition (PVD), or any suitable deposition technique for storing electrical charges therein. The thickness of the charge storage layer 54 can be in a range from 2 nm to 20 nm, although lesser and greater thicknesses can also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

An optional first semiconductor channel layer may be deposited on the tunneling dielectric. The optional first semiconductor channel layer, the tunneling dielectric layer 56, the charge storage layer 54, and the blocking dielectric layer 52 are sequentially anisotropically etched employing at least one anisotropic etch process. The portions of the optional first semiconductor channel layer, the tunneling dielectric layer 56, the charge storage layer 54, and the blocking dielectric layer 52 located above the top surface of the dielectric cap layer 80 can be removed by the at least one anisotropic etch process or a chemical mechanical planarization (CMP) process. Further, the horizontal portions of the optional first semiconductor channel layer, the tunneling dielectric layer 56, the charge storage layer 54, and the blocking dielectric layer 52 at a bottom of each memory opening 49 can be removed to form openings in remaining portions thereof. A semiconductor surface of the substrate (9, 10) (such as a top surface of the doped semiconductor well 10) can be physically exposed at the bottom of each memory opening 49.

A semiconductor channel material layer can be deposited directly on the semiconductor surface of the substrate (9, 10). If the optional first semiconductor channel layer is present, then the semiconductor channel material layer comprises a second semiconductor channel layer formed on a surface of the optional first semiconductor channel layer. If the optional first semiconductor channel layer is not present, then the semiconductor channel material layer is formed directly on the tunneling dielectric layer 56. The semiconductor channel material layer includes a semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel material layer includes amorphous silicon or polysilicon. The semiconductor channel material layer can be formed by a conformal deposition method such as low pressure chemical vapor deposition (LPCVD). The thickness of the semiconductor channel material layer can be in a range from 2 nm to 10 nm, although lesser and greater thicknesses can also be employed. The semiconductor channel material layer may partially fill cavities in the memory opening 49 and/or the support openings 19, or may fully fill the cavities in the memory opening 49 and/or the support openings 19. The material of the semiconductor channel material layer is referred to as a semiconductor channel material. The semiconductor channel material layer can include a single semiconductor layer, or can include a stack of multiple semiconductor layers. Any remaining semiconductor material of the semiconductor channel material layer located above the top surface of the dielectric cap layer 80 can be removed by a planarization process, which can employ a recess etch or chemical mechanical planarization (CMP). Each remaining portion of the semiconductor channel material layer in the memory openings 49 constitutes a vertical semiconductor channel 60. Each remaining portion of the semiconductor channel material layer in the support openings 19 constitutes a semiconductor fill structure 60'.

In case the cavities in each memory opening 49 and/or the support openings 19 are not completely filled by the vertical semiconductor channel 60 and/or the semiconductor fill structure 60', respectively, a dielectric core layer can be deposited in the cavity to fill any remaining portion of the cavity within each memory opening. The dielectric core layer includes a dielectric material such as silicon oxide or organosilicate glass. The dielectric core layer can be deposited by a conformal deposition method such as low pressure chemical vapor deposition (LPCVD), or by a self-planarizing deposition process such as spin coating. Subsequently, the horizontal portion of the dielectric core layer can be removed, for example, by a recess etch from above the top surface of the dielectric cap layer 80. Each remaining portion of the dielectric core layer in the memory openings 49 constitutes a dielectric core 62. Each remaining portion of the dielectric core layer in the support openings constitutes a dielectric fill structure 62'.

Each vertical semiconductor channel 60 formed in the memory openings 49 is a channel of a vertical field effect transistor through which electrical current can flow when a vertical NAND device including the vertical semiconductor channel 60 is turned on. A tunneling dielectric layer 56 is surrounded by a charge storage layer 54, and laterally surrounds a portion of the vertical semiconductor channel 60. Each adjoining set of a blocking dielectric layer 52, a charge storage layer 54, and a tunneling dielectric layer 56 within a memory opening 49 or within a support opening 19 collectively constitutes a memory film 50, which can store electrical charges with a macroscopic retention time. Each memory film 50 within the memory openings 49 is employed to store electrical charges, while each memory film 50 within the support openings 19 is employed as dielectric fill material layers, and is not employed to store electrical charges in the memory device of the present disclosure.

In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours. Each combination of a memory film 50 and a vertical semiconductor channel 60 located within a same memory opening 49 constitutes a memory stack structure 55. Each semiconductor fill structure 60' is a dummy structures that is not electrically active, i.e., does not function as a portion of an active semiconductor device.

The top surface of each dielectric core 62 and each dielectric fill structure 62' can be further recessed within each memory opening, for example, by a recess etch to a depth that is located between the top surface of the dielectric cap layer 80 and the bottom surface of the dielectric cap layer 80. Drain regions 63 can be formed by depositing a doped semiconductor material within each recessed region above the dielectric cores 62. Dummy drain regions 63' can be formed within each recessed region above the dielectric fill structure 62' concurrent with formation of the drain regions 63. The doped semiconductor material can be, for example, doped polysilicon. Excess portions of the deposited semiconductor material can be removed from above the top surface of the dielectric cap layer 80, for example, by chemical mechanical planarization (CMP) or a recess etch to form the drain regions 63. In one embodiment, the dummy drain region 63' is a dummy structure that is not electrically active, and thus, is not contacted by any electrically active component from above in the semiconductor device of the present disclosure.

Each combination of a memory film 50 and a vertical semiconductor channel 60 within a memory opening 49 constitutes a memory stack structure 55. Each combination of a memory film 50, a semiconductor fill structure 60', a dielectric fill structure 62', and a dummy drain region 63' constitutes a support pillar structure 20. The support pillar structures 20 can laterally extend along the first horizontal direction HD1 through less than the entire set of sacrificial material layers 42, and can be laterally staggered along the first horizontal direction to provide mechanical support to each insulating layer 32 within the alternating stack. The support pillar structures 20 can be laterally spaced along the second horizontal direction HD2. The support pillar structures 20 provide mechanical support during subsequent processing steps employed to replace the sacrificial material layers 42 with electrically conductive layers. In one embodiment, the support pillar structure 20 can be formed with the substantially rectangular horizontal cross-sectional areas having a length which is greater than the width by at least two times, such as by three to one hundred times. The length extends in the first horizontal direction HD1, and the width extends in the second horizontal direction HD2. Thus, the support pillar structures 20 can have a rail shape that cuts through plural pairs of insulating layers 32 and sacrificial layers 42 in the length direction, as shown in FIG. 6B.

Figure 7A:
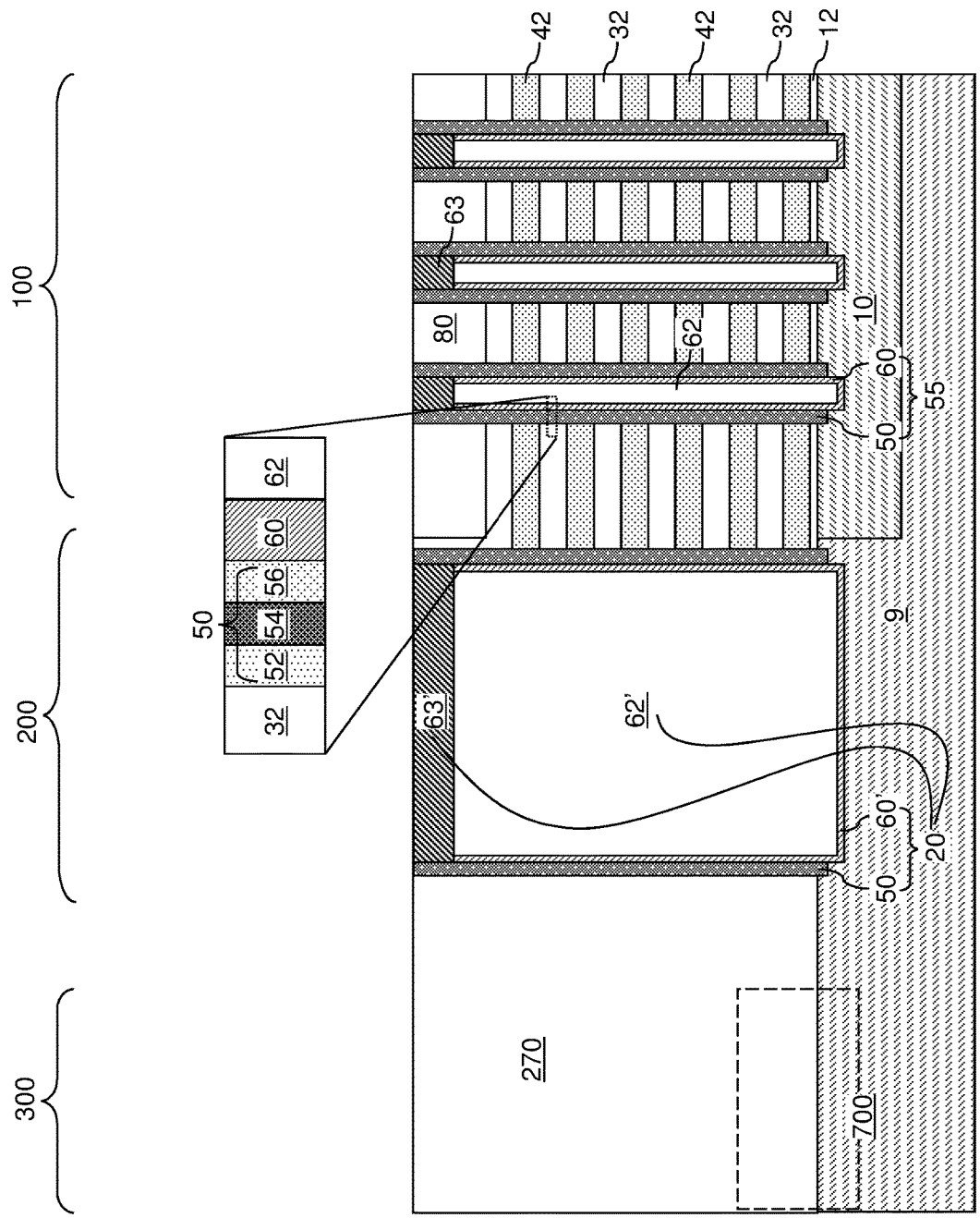
FIG. 7A is a schematic vertical cross-sectional view of an alternative embodiment of the first exemplary structure after formation of memory stack structures and support pillar structures according to the first embodiment of the present disclosure.
Figure 7B:
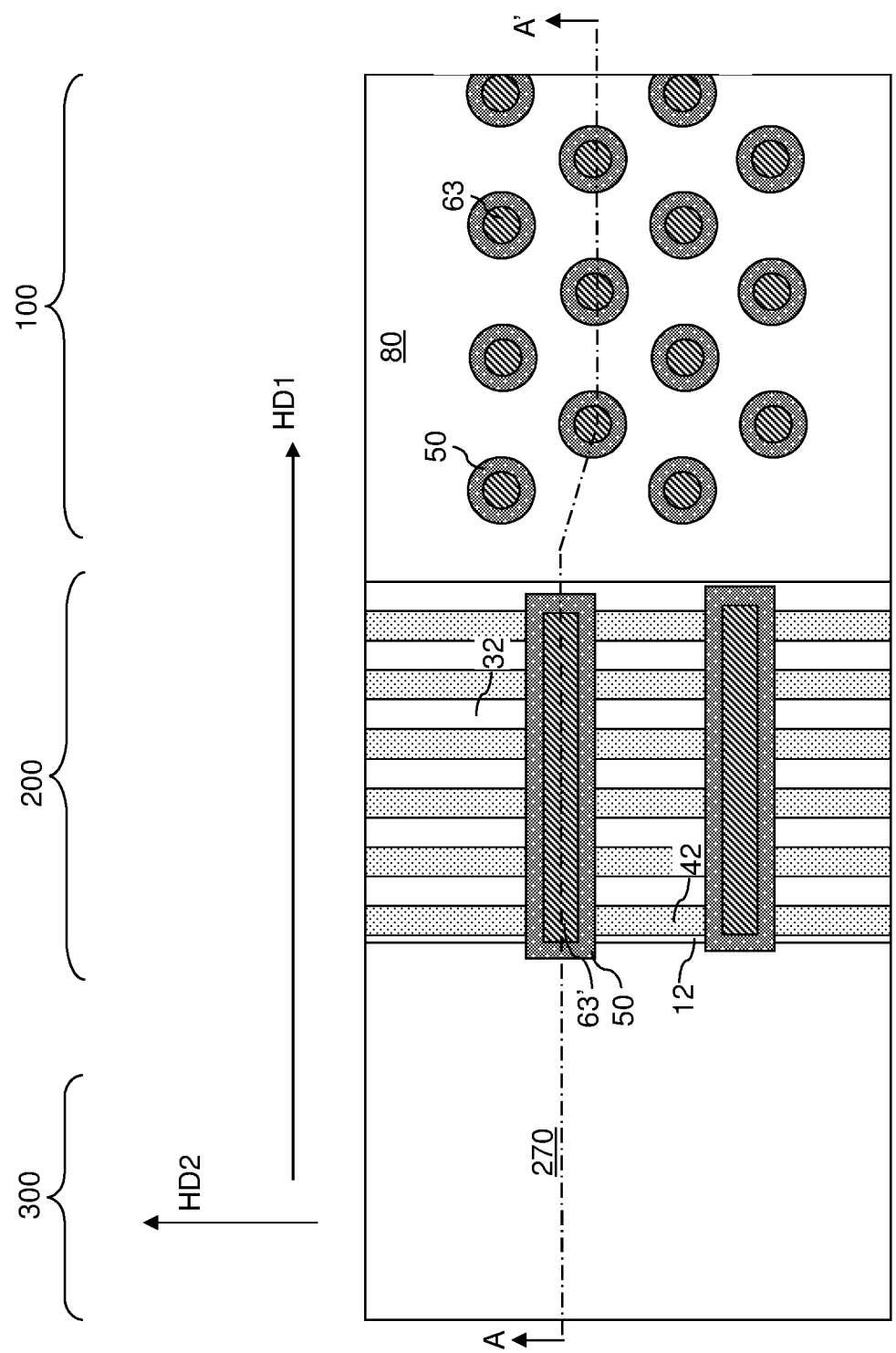
FIG. 7B is a top-down view of the alternative embodiment of the first exemplary structure of FIG. 7A. The plane A-A' is the plane of the cross-section of FIG. 7A.

Referring to FIGS. 7A and 7B, an alternate embodiment of the first exemplary structure is illustrated at the processing steps of FIGS. 6A and 6B. In the alternate embodiment of the first exemplary structure, the support pillar structures 20 can laterally extend along the first horizontal direction HD1 through each sacrificial material layer 42 within the alternating stack (32, 42).

While the present disclosure is described employing particular configurations for the support pillar structures 20, support pillar structures 20 of any shape can be employed in the contact region 200 provided that each of the sacrificial material layers 42 continuously extends from the array portion AP of the alternating stack (32, 42) to a physically exposed surface that is within the same plane as the top surface of the dielectric cap layer 80.

Figure 8A:
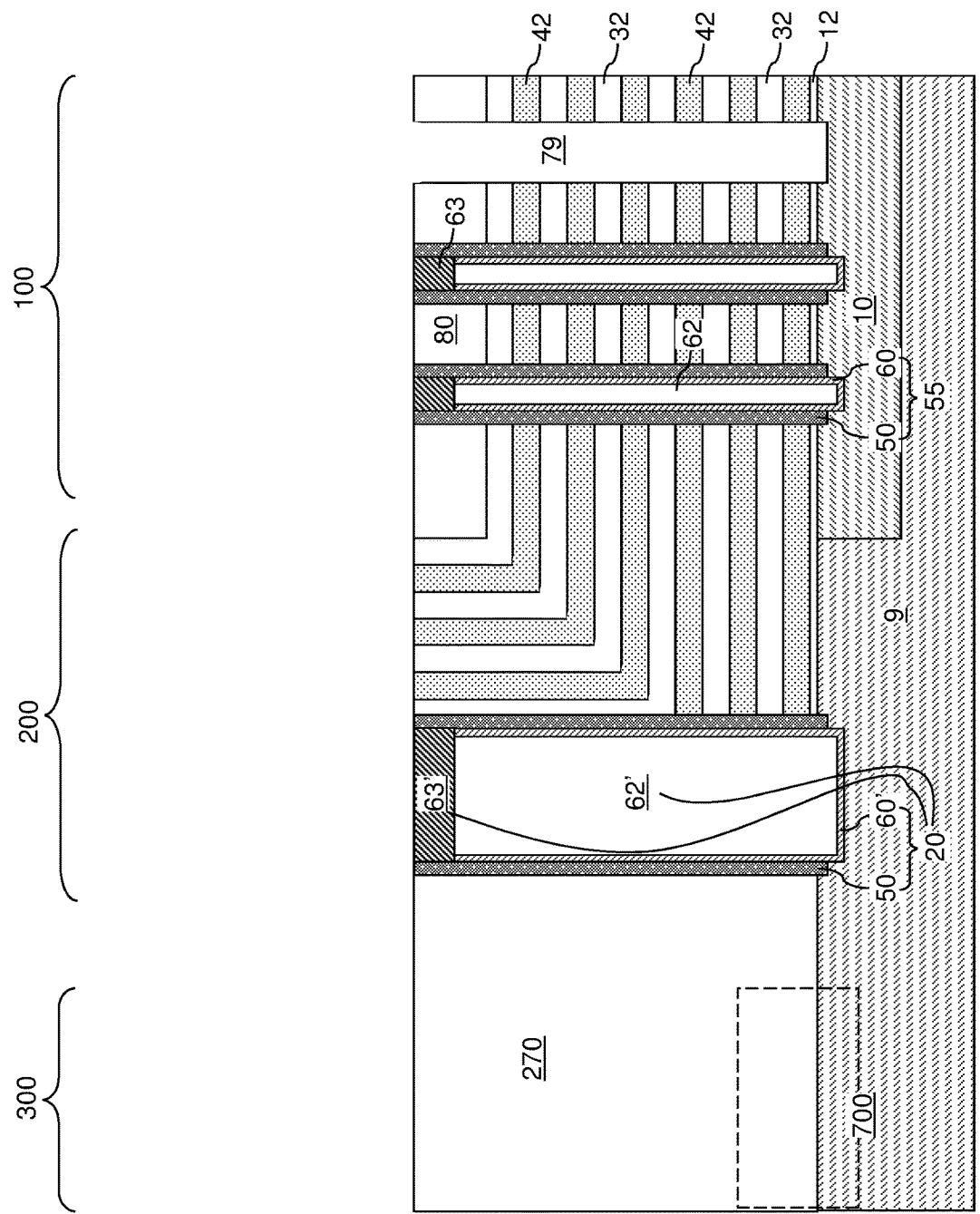
FIG. 8A is a schematic vertical cross-sectional view of the first exemplary structure after formation of backside trenches according to the first embodiment of the present disclosure.
Figure 8B:
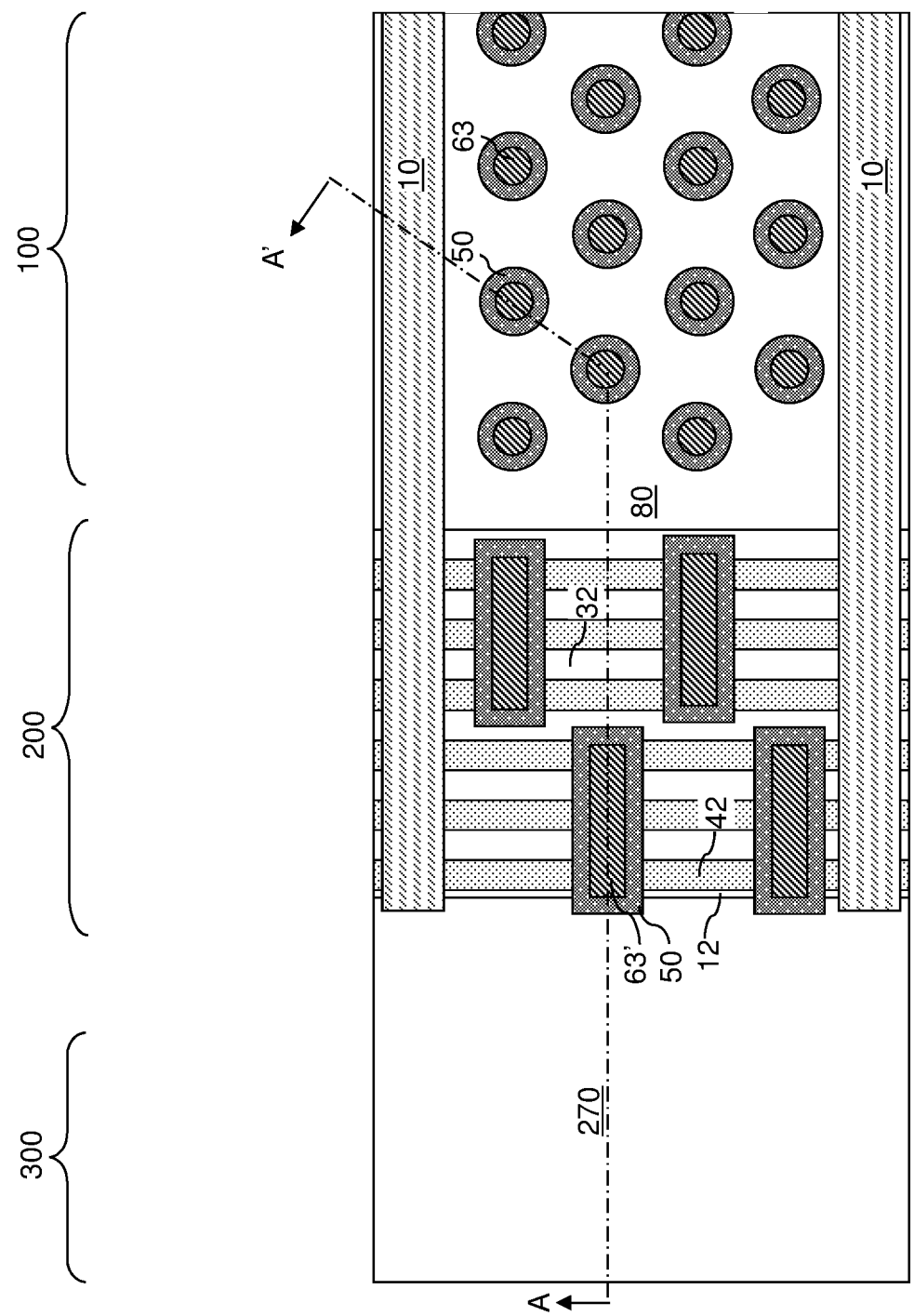
FIG. 8B is a top-down view of the first exemplary structure of FIG. 8A. The plane A-A' is the plane of the cross-section of FIG. 8A.

Referring to FIGS. 8A and 8B, a photoresist layer (not shown) can be applied over the alternating stack (32, 42) and the dielectric mesa structure 270 of FIGS. 6A and 6B (or of FIGS. 7A and 7B), and is lithographically patterned to form elongated openings in between clusters of memory stack structures 55 within the memory array region 100. The pattern in the photoresist layer can be transferred through the dielectric cap layer 80 and the alternating stack (32, 42) employing an anisotropic etch to form backside trenches 79, which extends at least to the top surface of the substrate (9, 10). In one embodiment, the backside trenches 79 can be adjoined to the dielectric mesa structure 270. In one embodiment, the at least one backside trench 79 can include a source contact opening in which a source contact via structure can be subsequently formed.

Figure 9:
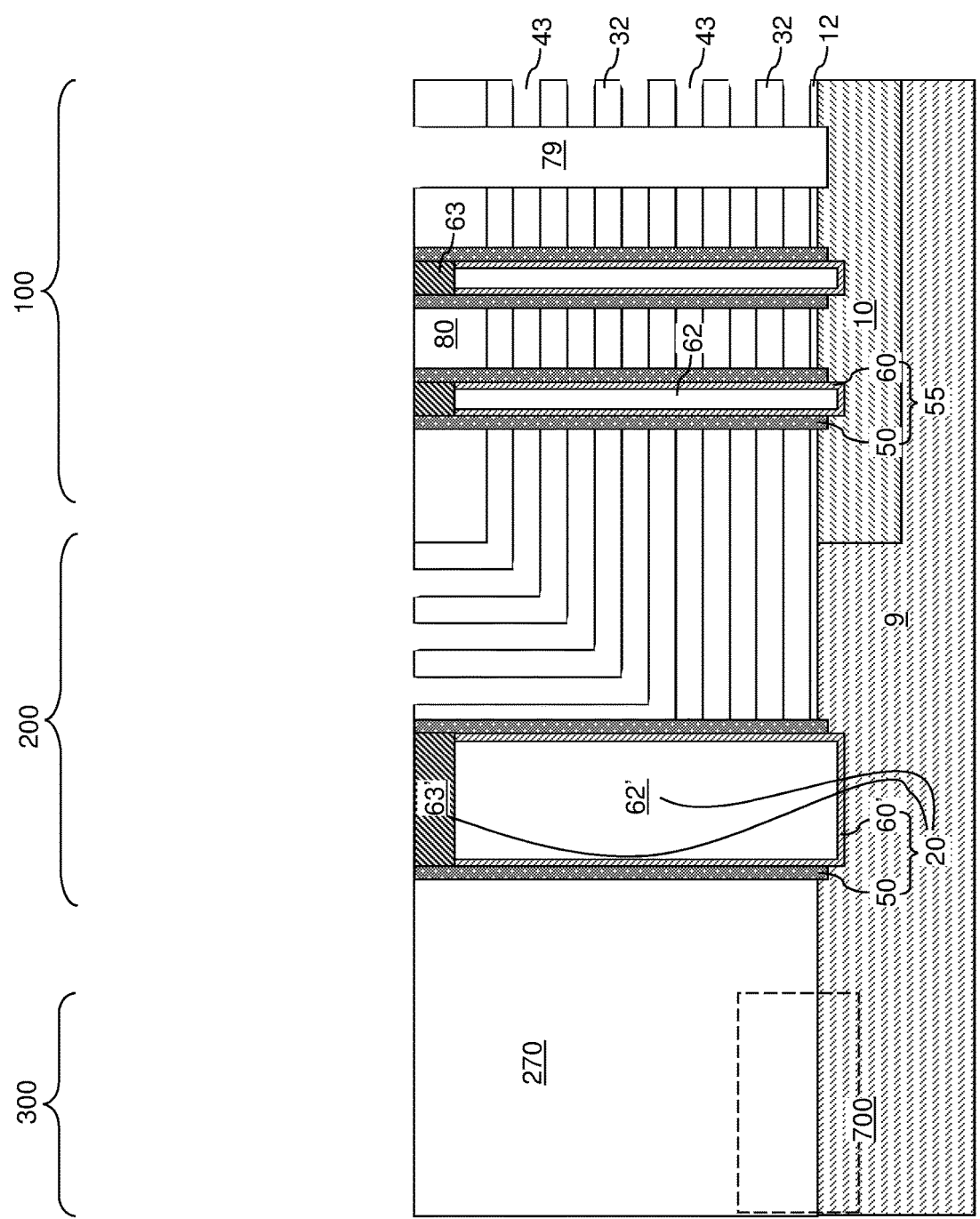
FIG. 9 is a schematic vertical cross-sectional view of the first exemplary structure after formation of backside recesses according to the first embodiment of the present disclosure.

Referring to FIG. 9, in case the spacer material layers are formed as sacrificial material layers 42, the spacer material layers can be replaced with the electrically conductive layers 46. For example, an etchant that selectively etches the second material of the sacrificial material layers 42 with respect to the first material of the insulating layers 32 can be introduced into the at least one backside trench 79, for example, employing an etch process. Backside recesses 43 are formed in volumes from which the sacrificial material layers 42 are removed. The removal of the second material of the sacrificial material layers 42 can be selective to the first material of the insulating layers 32, the semiconductor material of the doped semiconductor well 10, and the material of the outermost layer of the memory films 50. In one embodiment, the sacrificial material layers 42 can include silicon nitride, and the materials of the insulating layers 32 can be selected from silicon oxide and dielectric metal oxides.

The etch process that removes the second material selective to the first material and the outermost layer of the memory films 50 can be a wet etch process employing a wet etch solution, or can be a gas phase (dry) etch process in which the etchant is introduced in a vapor phase into the at least one backside trench 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The support pillar structures 20 and the memory stack structures 55 provide structural support to prevent collapse of the insulating layers 32 while the backside recesses 43 are present within volumes previously occupied by the sacrificial material layers 42.

Each backside recess 43 can include a horizontally extending portion and a non-horizontally extending portion, which may extend vertically or substantially vertically. Each backside recess 43 extends to the horizontal plane including the top surface of the dielectric cap layer 80, the top surface of the dielectric mesa structure 270, and the top surfaces of the support pillar structures 20. A plurality of backside recesses 43 can be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each horizontally extending portion of the backside recesses 43 can extend substantially parallel to the top surface of the substrate (9, 10). Each horizontally extending portion of the backside recesses 43 can be vertically bounded by a top surface of an underlying insulating layer 32 and a bottom surface of an overlying insulating layer 32. In one embodiment, each horizontally extending portion of the backside recesses 43 can have a uniform height throughout.

Each non-horizontally extending portion of the backside recesses 43 can extend vertically or substantially vertically. Each non-horizontally extending portion of the backside recesses 43 can be laterally bounded by sidewalls of a neighboring pair of insulating layers 32. In one embodiment, each non-horizontally extending portion of the backside recesses 43 can have a uniform width throughout, which can be the same as the uniform height of an adjoining horizontally-extending portion of the same backside recess 43.

Figure 10:
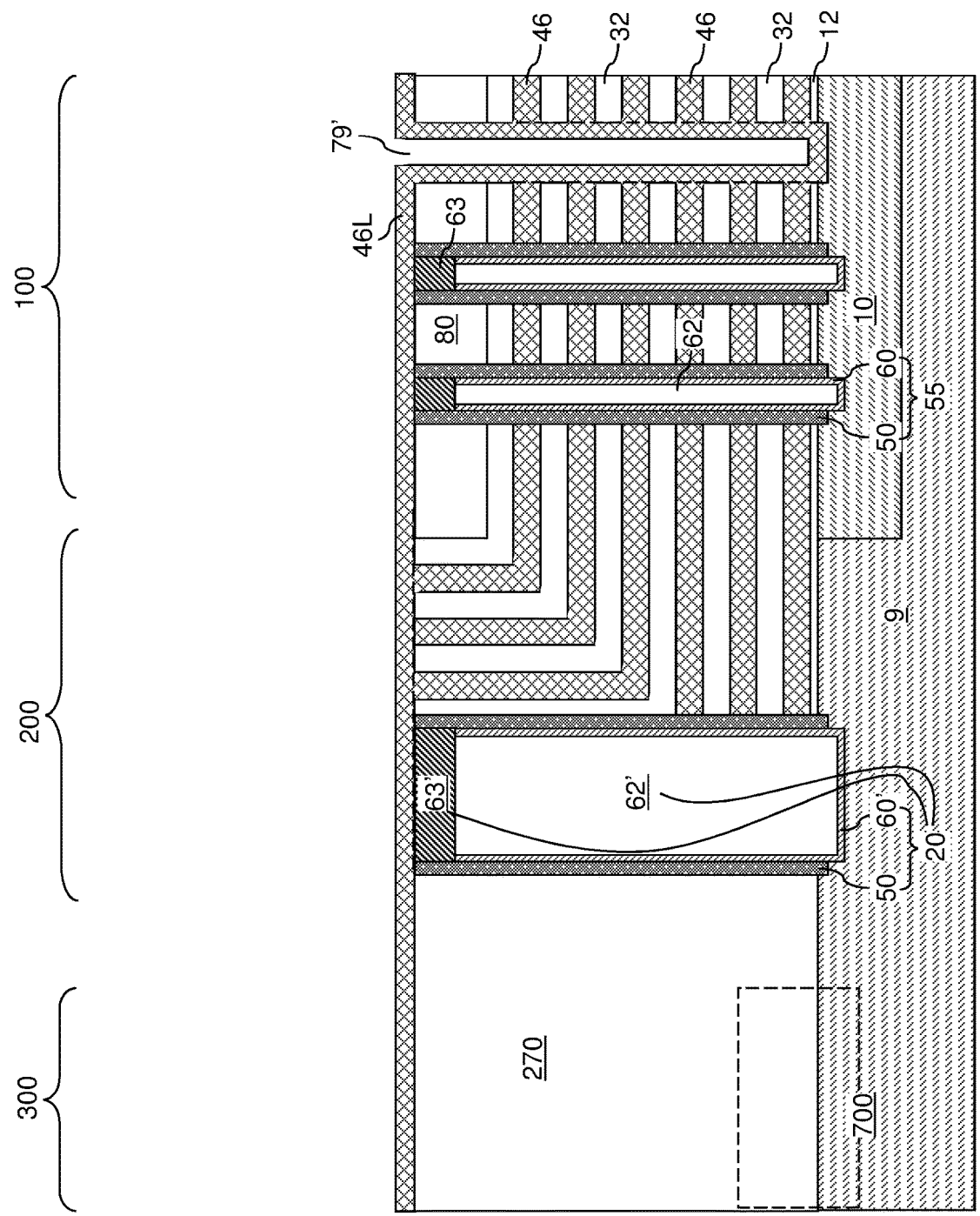
FIG. 10 is a schematic vertical cross-sectional view of the first exemplary structure after deposition of at least one conductive material in the backside recesses according to the first embodiment of the present disclosure.

Referring to FIG. 10, a backside blocking dielectric layer (not shown) can be optionally formed. The backside blocking dielectric layer, if present, comprises a dielectric material that functions as a control gate dielectric for the control gates to be subsequently formed in the backside recesses 43. In case the blocking dielectric layer 52 is present within each memory opening, the backside blocking dielectric layer is optional. In case the blocking dielectric layer 52 is omitted, the backside blocking dielectric layer is present. The backside blocking dielectric layer can be formed in the backside recesses 43 and on a sidewall of the backside trench 79. The backside blocking dielectric layer can be formed directly on horizontal surfaces of the insulating layers 32 and sidewalls of the memory stack structures 55 within the backside recesses 43. In one embodiment, the backside blocking dielectric layer can be formed by a conformal deposition process such as atomic layer deposition (ALD). The backside blocking dielectric layer can consist essentially of aluminum oxide. The thickness of the backside blocking dielectric layer can be in a range from 1 nm to 15 nm, such as 2 to 6 nm, although lesser and greater thicknesses can also be employed.

The dielectric material of the backside blocking dielectric layer can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer can include a silicon oxide layer. The backside blocking dielectric layer can be deposited by a conformal deposition method such as chemical vapor deposition or atomic layer deposition. The thickness of the backside blocking dielectric layer can be in a range from 1 nm to 10 nm, although lesser and greater thicknesses can also be employed. A backside cavity is present within the portion of each backside trench 79 that is not filled with the backside blocking dielectric layer.

At least one conductive material is deposited within the backside recesses 43 to form electrically conductive layers 46. The at least one conductive material deposited in the backside trenches 79 and over the dielectric cap layer 80 constitutes a continuous conductive material layer 46L. A backside cavity 79' is present within each backside trench 79. The at least one conductive material can include, for example, a metallic liner material such as a conductive metal nitride (e.g., TiN, TaN, or WN) and a metallic fill material that consists essentially of at least one metal. The metallic fill material can consist essentially of a single elemental metal (such as Cu, Co, W, or Al) or an intermetallic alloy of at least two elemental metals. In one embodiment, the at least one conductive material can include a titanium nitride liner and a tungsten fill material. The at least one conductive material can be deposited by a conductive deposition process such as chemical vapor deposition (CVD) and/or atomic layer deposition (ALD). The at least one conductive material fills each of the backside recesses 43. Each continuous portion of the deposited at least one conductive material located within a backside recess 43 constitutes an electrically conductive layer 46. Each electrically conductive layer 46 can include a metallic liner portion 46A that include the metallic liner material and a metallic fill portion 46B that includes the metallic fill material.

Figure 11:
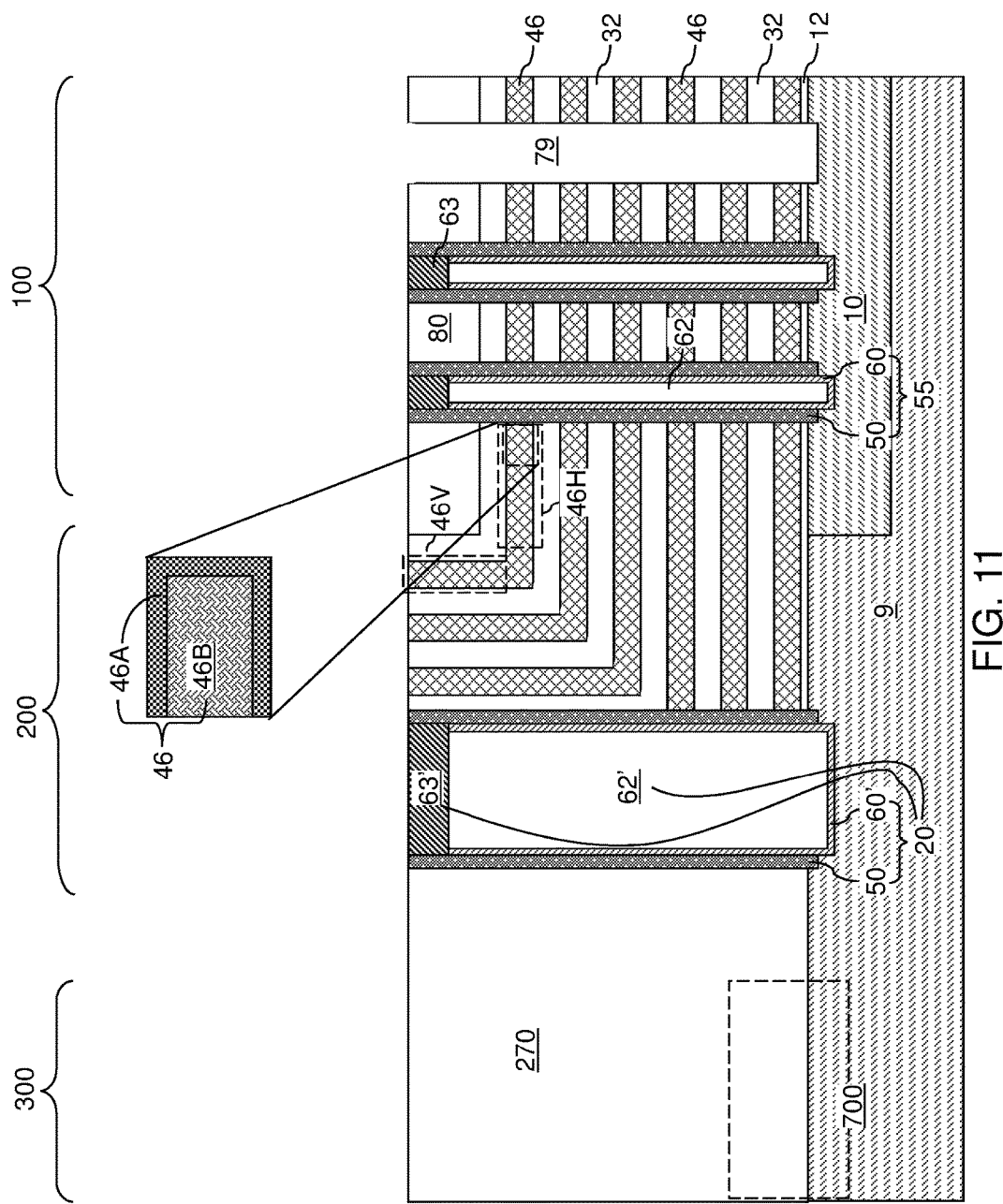
FIG. 11 is a schematic vertical cross-sectional view of the first exemplary structure after removal of the at least one conductive material from the backside trenches and from above the dielectric cap layer according to the first embodiment of the present disclosure.

Referring to FIG. 11, the continuous conductive material layer 46L (i.e., the continuous portion of the at least one conductive material deposited in the backside trenches 79 or over the horizontal plane including the top surfaces of the dielectric cap layer 80 and the dielectric mesa structure 270) can be removed by an etch process, which may be an isotropic etch process. Each of the electrically conductive layers 46 comprises a respective continuously-extending conductive material portion of a homogeneous composition that includes a respective horizontal sub-portion that extend parallel to the top surface of the substrate (9, 10) and a respective non-horizontal sub-portion that extend parallel to the at least one sidewall of the dielectric mesa structure 270. As used herein, a "continuously-extending" element or an "integral" refers to an element that consists of a single continuous structure such that each point within the structure can be connected to any other point within the structure by a line that is contained entirely within the volume of the structure. As used herein, a "homogeneous composition" refers to a composition that is the same throughout the entirety of an element.

Specifically, each metallic liner portion 46A within the electrically conductive layers 46 is a continuously-extending conductive material portion of a homogeneous composition that includes a respective horizontal sub-portion that extend parallel to the top surface of the substrate (9, 10) (and located within a horizontal sub-portion 46H of the respective electrically conductive layer 46) and a respective non-horizontal sub-portion that extend parallel to the at least one sidewall of the dielectric mesa structure 270 (and located within a non-horizontal sub-portion 46V of the respective electrically conductive layer 46). Further, each metallic fill portion 46B within the electrically conductive layers 46 is a continuously-extending conductive material portion of a homogeneous composition that includes a respective horizontal sub-portion that extend parallel to the top surface of the substrate (9, 10) (and located within a horizontal sub-portion 46H of the respective electrically conductive layer 46) and a respective non-horizontal sub-portion that extend parallel to the at least one sidewall of the dielectric mesa structure 270 (and located within a non-horizontal sub-portion 46V of the respective electrically conductive layer 46). Each of the continuously-extending conductive material portions, as embodied as a metallic liner portion 46A or as a metallic fill portion 46B, is free of any physical interface therein. As used herein, a "physical interface" in an element refers to a region including at least one physically observable inhomogeneity therein such as an interfacial compositional change or an interfacial microstructural change.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices.

Figure 12A:
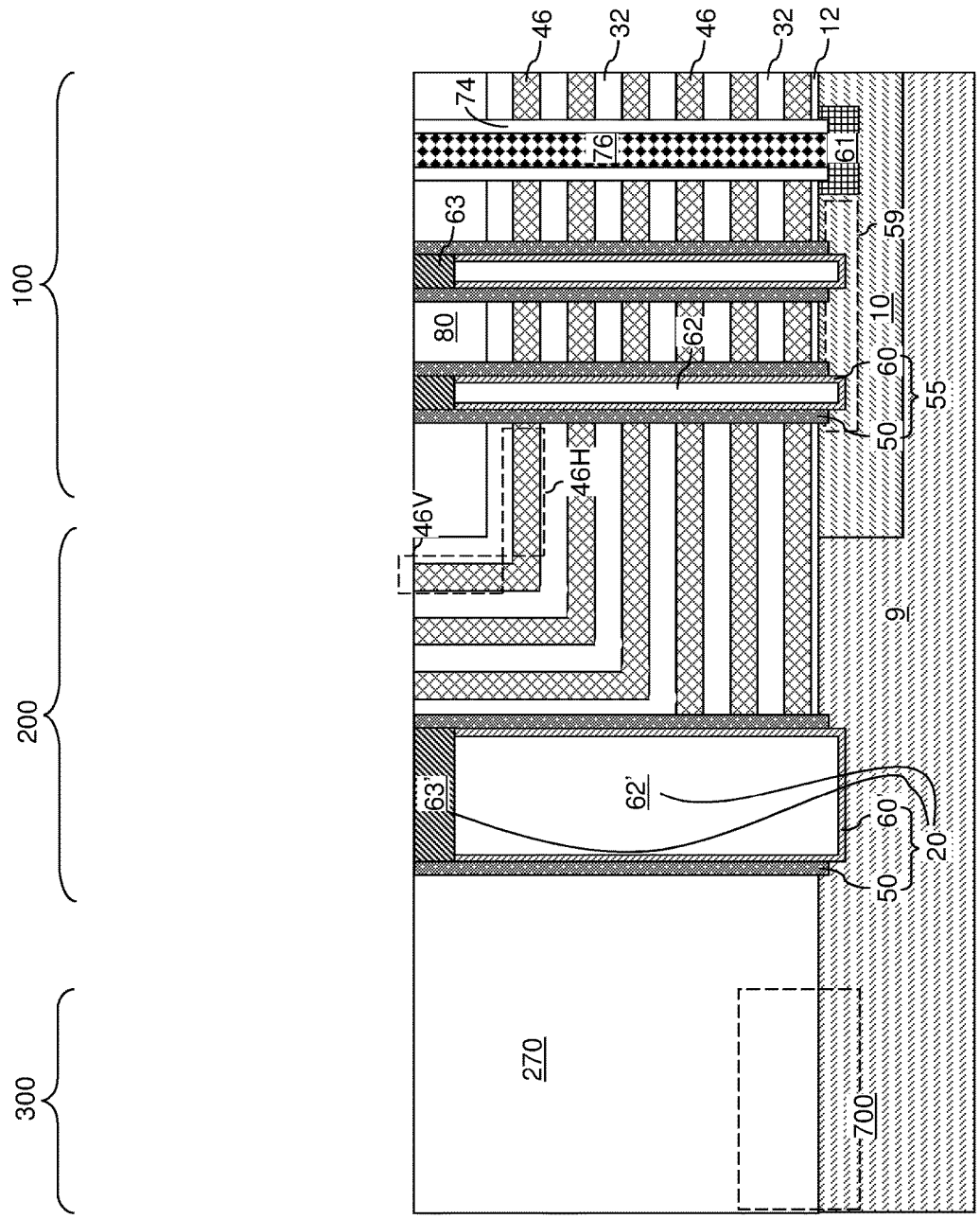
FIG. 12A is a schematic vertical cross-sectional view of the first exemplary structure after formation of backside contact via structures according to the first embodiment of the present disclosure.
Figure 12B:
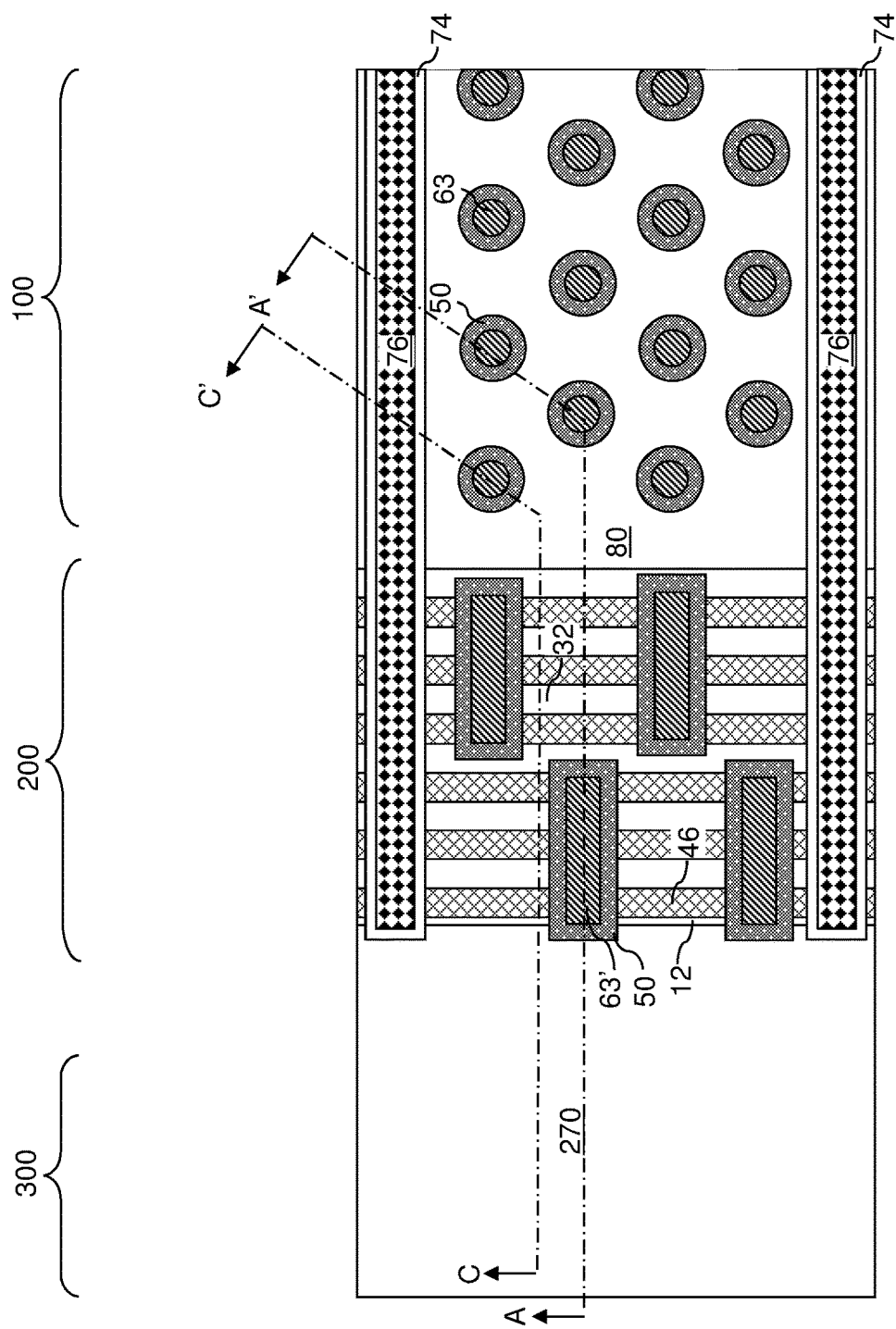
FIG. 12B is a top-down view of the first exemplary structure of FIG. 12A. The plane A-A' is the plane of the cross-section of FIG. 12A.
Figure 12C:
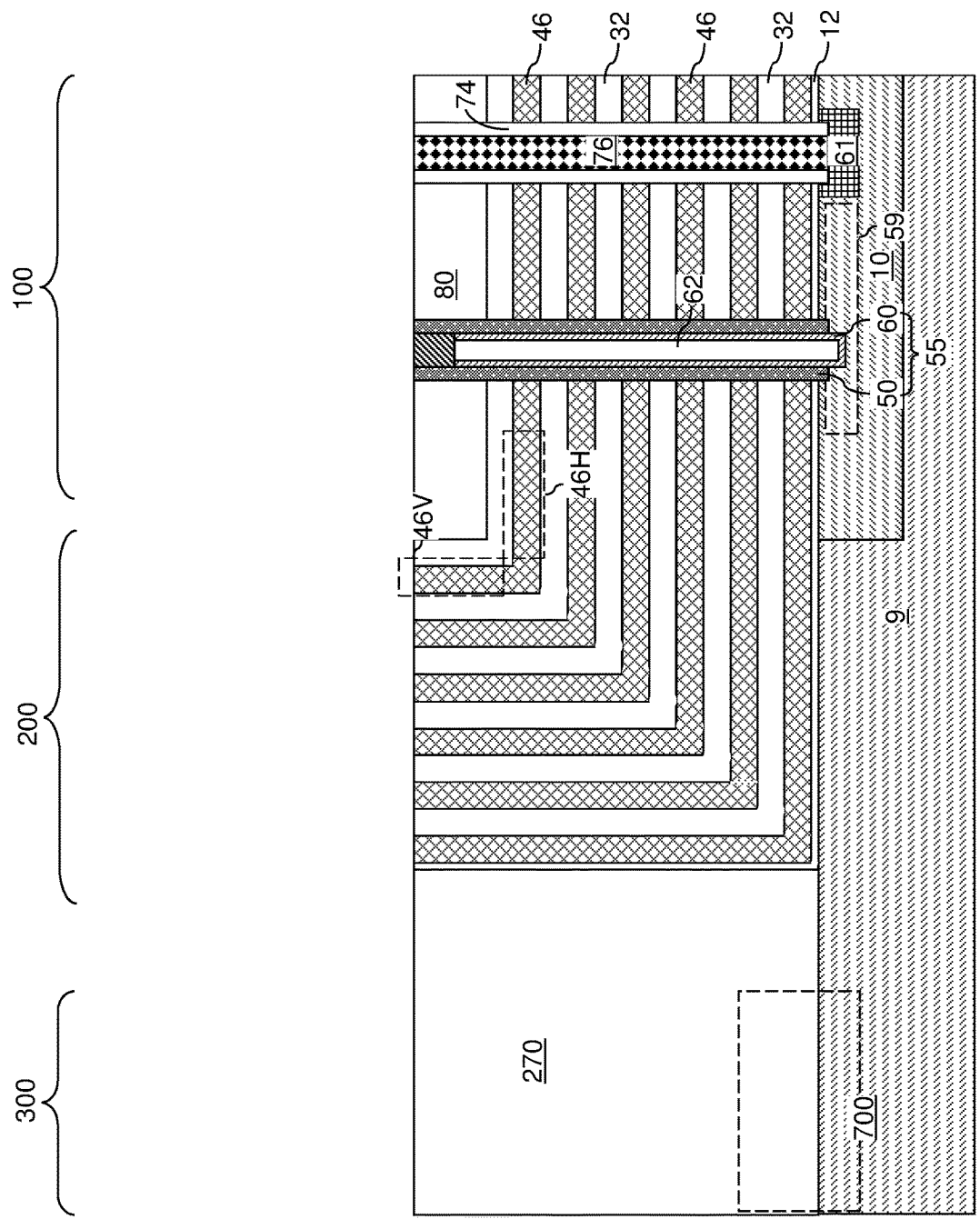
FIG. 12C is a schematic vertical cross-sectional view of the first exemplary structure of FIG. 12B along the plane C-C'.

Referring to FIGS. 12A-12C, an insulating material layer can be formed in the at least one backside trench 79 and over the dielectric cap layer 80 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed. An anisotropic etch is performed to remove horizontal portions of the insulating material layer from above the dielectric cap layer 80 and at the bottom of each backside trench 79. Each remaining portion of the insulating material layer constitutes an insulating spacer 74. Thus, an insulating spacer 74 is formed in each backside trench 79 directly on physically exposed sidewalls of the electrically conductive layers 46.

A source region 61 can be formed underneath each backside trench 79 by implantation of electrical dopants into physically exposed surface portions of the doped semiconductor well 10. Each source region 61 is formed in a surface portion of the substrate (9, 10) that underlies a respective opening through the insulating spacer 74. Due to the straggle of the implanted dopant atoms during the implantation process and lateral diffusion of the implanted dopant atoms during a subsequent activation anneal process, each source region 61 can contact a bottom surface of the insulating spacer 74. Each surface portion of the doped semiconductor well 10 that is located between each source region 60 and vertical semiconductor channels 60 within adjacent memory stack structures 55 constitutes a horizontal semiconductor channel 59.

A backside contact via structure 76 can be formed within each backside cavity, which is the unfilled volume of a respective backside trench 79. Each contact via structure 76 can fill a respective backside cavity. The backside contact via structures 76 can be formed by depositing at least one conductive material in the remaining unfilled volume (i.e., the backside cavity) of the backside trench 79. For example, the at least one conductive material can include a conductive liner and a conductive fill material portion. The conductive liner can include a metallic liner such as TiN, TaN, WN, TiC, TaC, WC, an alloy thereof, or a stack thereof. The thickness of the conductive liner can be in a range from 3 nm to 30 nm, although lesser and greater thicknesses can also be employed. The conductive fill material portion can include a metal or a metallic alloy. For example, the conductive fill material portion can include W, Cu, Al, Co, Ru, Ni, an alloy thereof, or a stack thereof.

The at least one conductive material can be planarized employing the dielectric cap layer 80 overlying the alternating stack (32, 46) and the dielectric mesa structures 270 as stopping structures. If chemical mechanical planarization (CMP) process is employed, the dielectric cap layer 80 and the dielectric mesa structure 270 can be employed as CMP stopping structures. Each remaining continuous portion of the at least one conductive material in the backside trenches 79 constitutes a backside contact via structure 76. Each backside contact via structure 76 can be formed directly on a top surface of a source region 61. Each backside contact via structure 76 can contact a respective source region 61, and can be laterally surrounded by a respective insulating spacer 74. The support pillar structures 20 extend through a first region of the alternating stack (32, 46) that includes the non-horizontal sub-portions 46V of the electrically conductive layers 46 and laterally separating each of the electrically conductive layers 46 in the word line direction (i.e., in horizontal direction HD1).

Figure 13A:
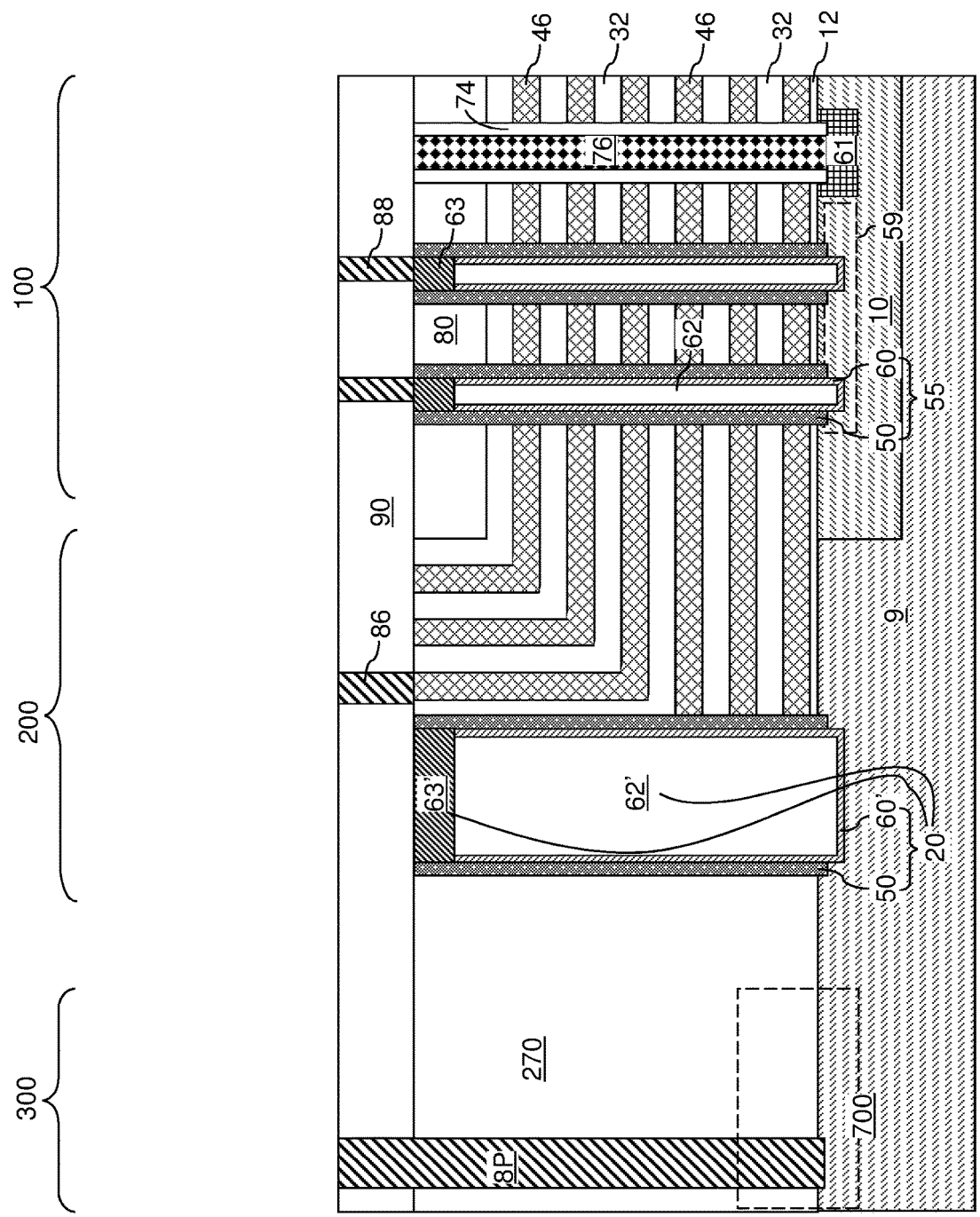
FIG. 13A is a schematic vertical cross-sectional view of the first exemplary structure after formation of various contact via structures according to the first embodiment of the present disclosure.
Figure 13B:
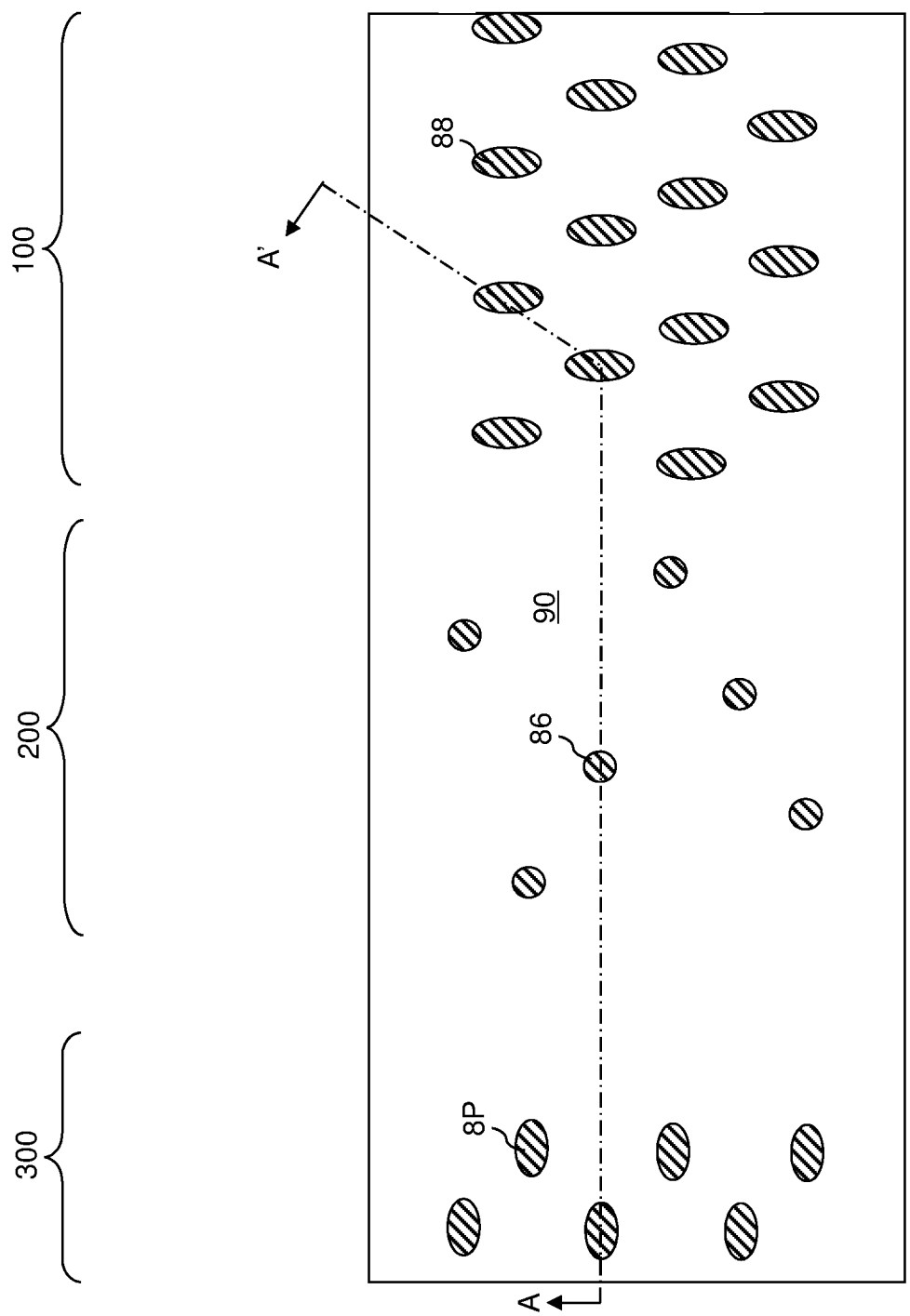
FIG. 13B is a top-down view of the first exemplary structure of FIG. 13A. The plane A-A' is the plane of the cross-section of FIG. 13A.

Referring to FIGS. 13A and 13B, a contact level dielectric layer 90 can be formed over the dielectric cap layer 80 and the dielectric mesa structure 270. The contact level dielectric layer 90 can include a dielectric material such as undoped silicate glass, doped silicate glass, organosilicate glass, silicon nitride, and/or a dielectric metal oxide. In one embodiment, the contact level dielectric layer 90 can be a layer stack of multiple dielectric layers including a silicon oxide layer and a diffusion barrier layer such as a silicon nitride layer.

Additional contact via structures (88, 86, 8P) can be formed through the contact level dielectric layer 90, and optionally through the dielectric mesa structure 270. For example, drain contact via structures 88 can be formed through the contact level dielectric layer 90 on each drain region 63. Word line contact via structures 86 can be formed through the contact level dielectric layer 90 on the electrically conductive layers 46. Device contact via structures 8P can be formed through the contact level dielectric layer 90 and the dielectric mesa structure 270 directly on respective nodes of the peripheral devices, which are semiconductor devices and may include the driver circuit for the NAND devices including the memory stack structures 55. The bottom surfaces of the word line contact via structures 88 can be within the same horizontal plane, i.e., within the horizontal plane including the interface. No electrical contacts are formed to the dummy drain structures 63' in the support pillar structures 20.

Figure 14A:
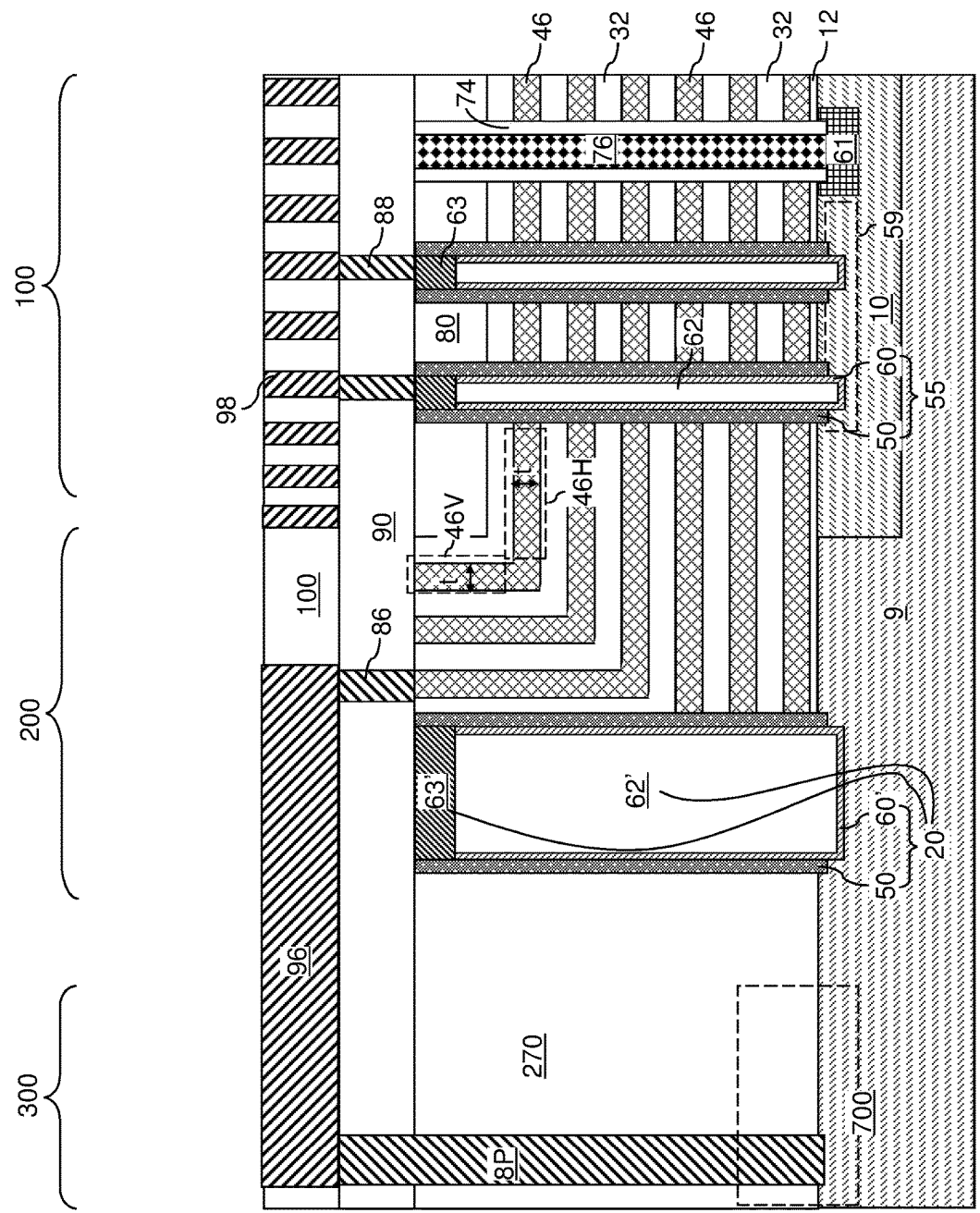
FIG. 14A is a schematic vertical cross-sectional view of the first exemplary structure after formation of various interconnect line structures according to the first embodiment of the present disclosure.
Figure 14B:
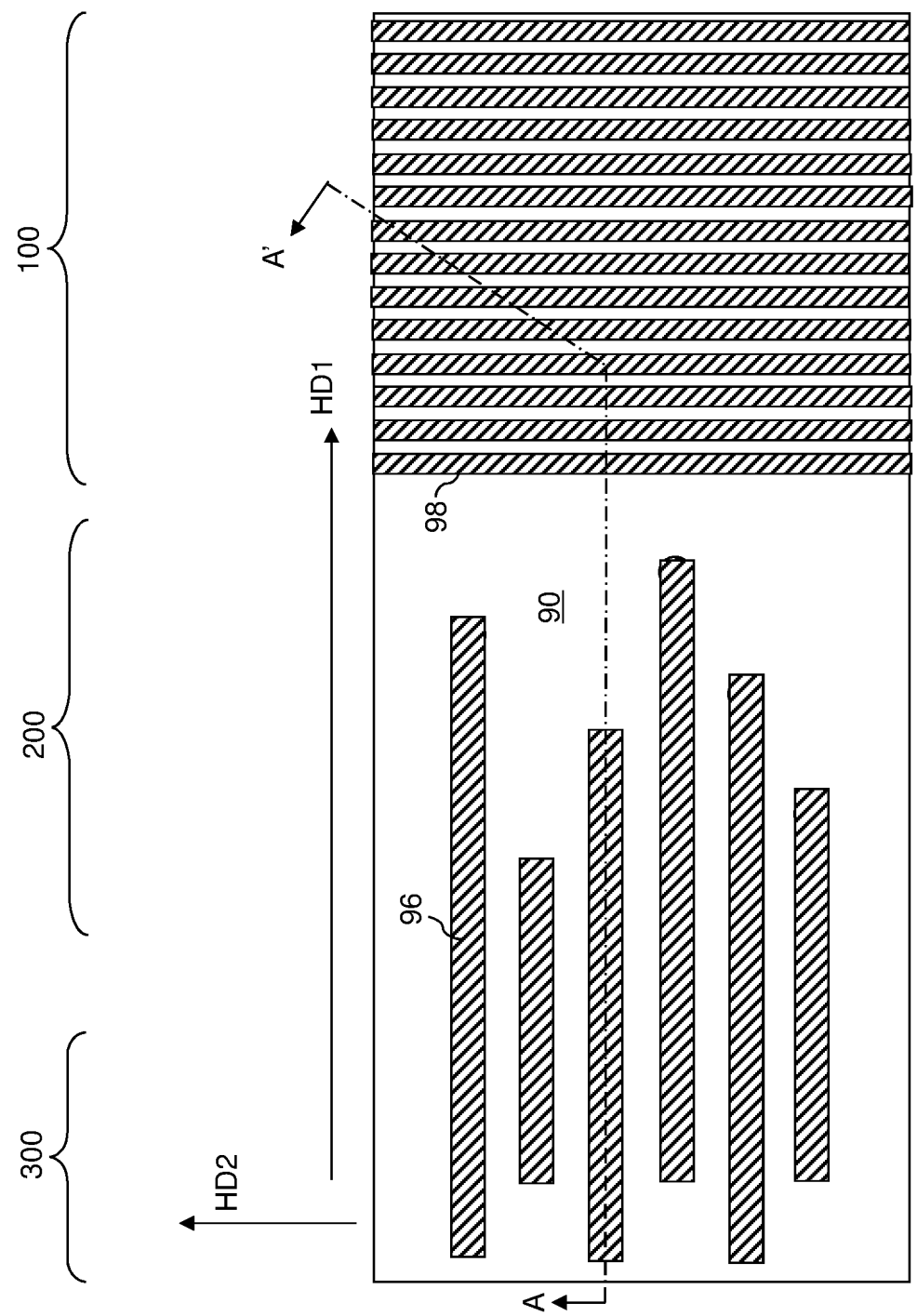
FIG. 14B is a top-down view of the first exemplary structure of FIG. 14A. The plane A-A' is the plane of the cross-section of FIG. 14A.

Referring to FIGS. 14A and 14B, a line level dielectric layer 100 can be deposited over the contact level dielectric layer 90. The line level dielectric layer 100 includes a dielectric material such as silicon oxide, organosilicate glass, silicon nitride, and/or a dielectric metal oxide. For example, the contact level dielectric layer 90 and the line level dielectric layer 100 can be composed primarily of silicon oxide or organosilicate glass or a porous derivative thereof. Various interconnect line structures (96, 98) can be formed in the line level dielectric layer 100. The interconnect line structures (96, 98) can include word line interconnect lines 96 that connect the word line contact via structures 86 and the device contact via structures 8P and extend along the first horizontal direction HD1. Further, the interconnect line structures (96, 98) can include bit lines 98 that extend along the second horizontal direction HD2 and contacting a respective drain contact via structure 88. In one embodiment, each drain contact via structure 88 is contacted by a single bit line 98 to enable unique access of each drain region 63 connected to a respective vertical semiconductor channel 60.

Each of the insulating layers 32 and the electrically conductive layers 46 include a horizontal sub-portion having a respective uniform thickness and horizontally extending within the memory array region 100 and the contact region 200, a non-horizontal sub-portion having the respective uniform thickness and extending within the contact region 200 along a non-horizontal direction (such as the vertical direction). For example, each electrically conductive layer 46 can include a horizontal electrically conductive sub-portion 46H having a uniform thickness t, and a non-horizontal electrically conductive sub-portion 46V having the uniform thickness t.

While the present disclosure is described employing a particular configuration for the support pillar structures 20, the shapes of the support pillar structures 20 can be modified into various shapes to provide suitable structural support during replacement of the sacrificial material layers 42 with electrically conductive layers 46. Further, while the present disclosure is described employing an embodiment in which the support pillar structures are formed concurrently with formation of memory stack structures 55, and had the same set of material layers and material portions as the combination of a memory stack structure 55, a dielectric core 62, and a drain region 63, embodiments are expressly contemplated herein in which the support pillar structures are formed prior to or after formation of memory stack structures. In this case, each of the support pillar structures may consist of a dielectric pillar structure.

Figure 15:
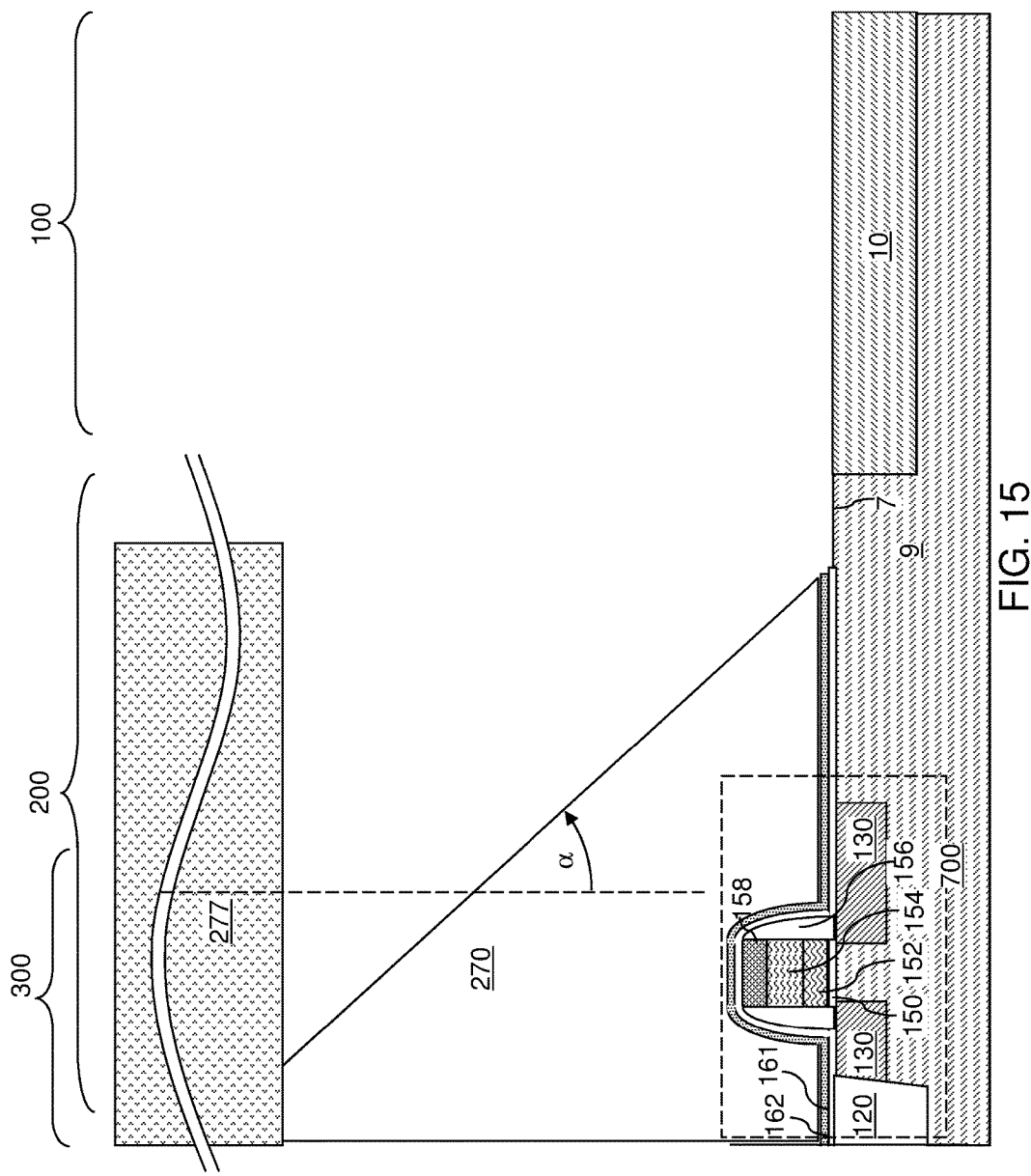
FIG. 15 is a vertical cross-sectional view of a second exemplary structure after formation of a tapered dielectric mesa structure according to a second embodiment of the present disclosure.

Referring to FIG. 15, a second exemplary structure according to a second embodiment of the present disclosure can be derived from the first exemplary structure of FIG. 1. Specifically, a masking layer 277 such as a patterned photoresist layer can be formed over the planarization dielectric layer 270L. The masking layer 277 covers the peripheral device region 300 and does not cover the memory array region 100 or the contact region 200. An etch process that includes a lateral etch component can be employed to etch the planarization dielectric layer 270L with a tapered sidewall. At least one anisotropic etch and/or at least one isotropic etch can be performed employing the masking layer 277 as an etch mask to remove physically exposed portions of the planarization dielectric layer 270L with a lateral etch component. A mesa structure 270 having at least one tapered dielectric sidewall is formed over the substrate (9, 10).

In one embodiment, the tapered sidewalls of the dielectric mesa structure 270 can have a taper angle α in a range from 30 degrees to 75 degrees with respect to the vertical direction, which is a direction that is perpendicular to the top surface 7 of the substrate (9, 10). The physically exposed portions of the dielectric liners (161, 162) can be removed from the memory array region 100. Subsequently, the masking layer 277 can be removed, for example, by ashing.

Figure 16:
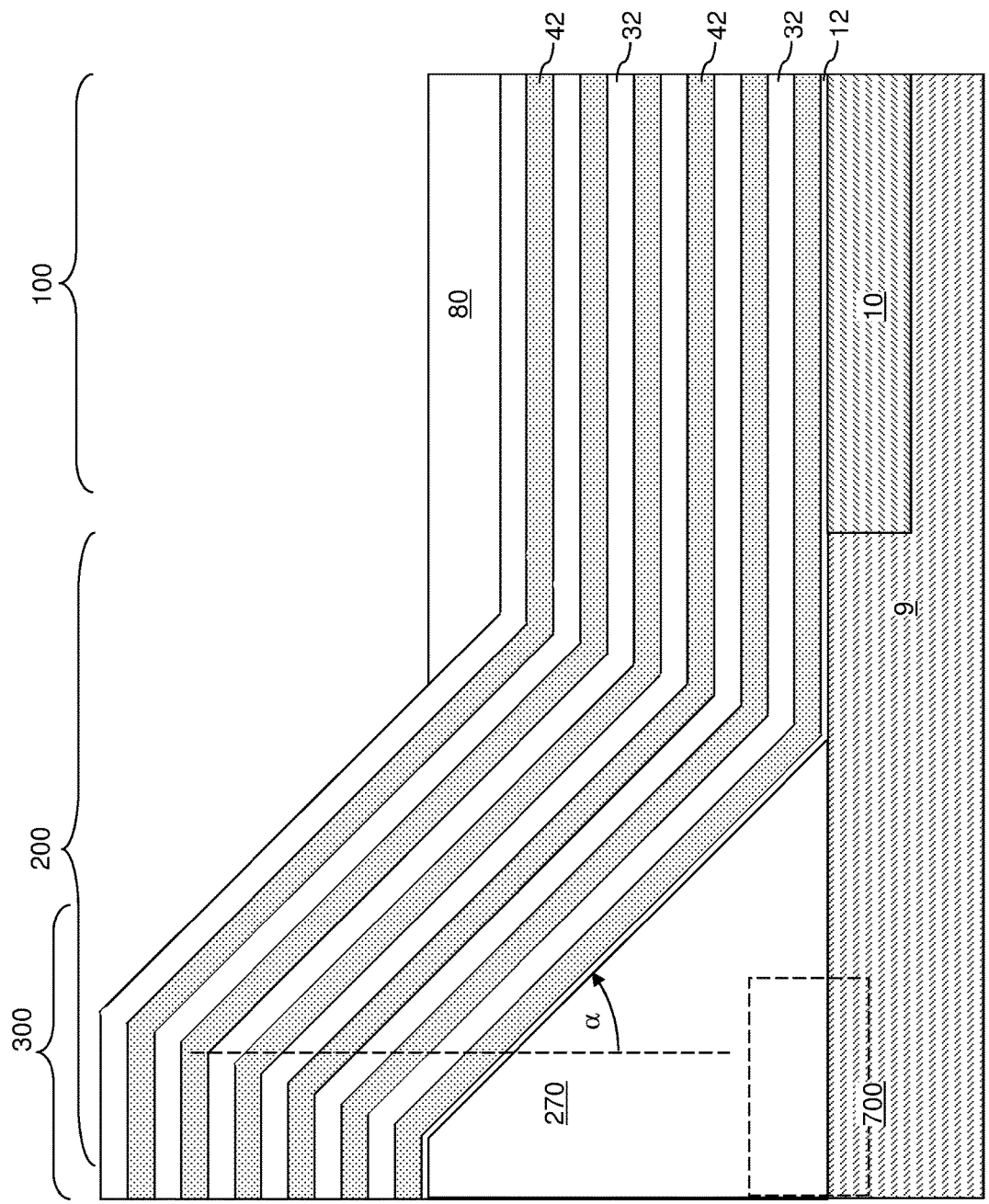
FIG. 16 is a schematic vertical cross-sectional view of the second exemplary structure after formation of an alternating stack of insulating layers and sacrificial material layers and a planarization stopping layer according to the second embodiment of the present disclosure.

Referring to FIG. 16, the processing steps of FIG. 3 can be performed to form a gate dielectric layer 12 and an alternating stack of insulating layers 32 and sacrificial material layers 42 over the top surface of the substrate (9, 10), the top surface of the dielectric mesa structure 270, and the at least one sidewall of the dielectric mesa structure 270. In case the at least one sidewall of the dielectric mesa structure 270 has a taper angle α in a range from 30 degrees to 75 degrees with respect to the vertical direction, each non-horizontal sub-portion of the layers within the alternating stack (32, 42) can extend along a direction that is the same taper angle as the at least one sidewall of the dielectric mesa structure 270.

Figure 17:
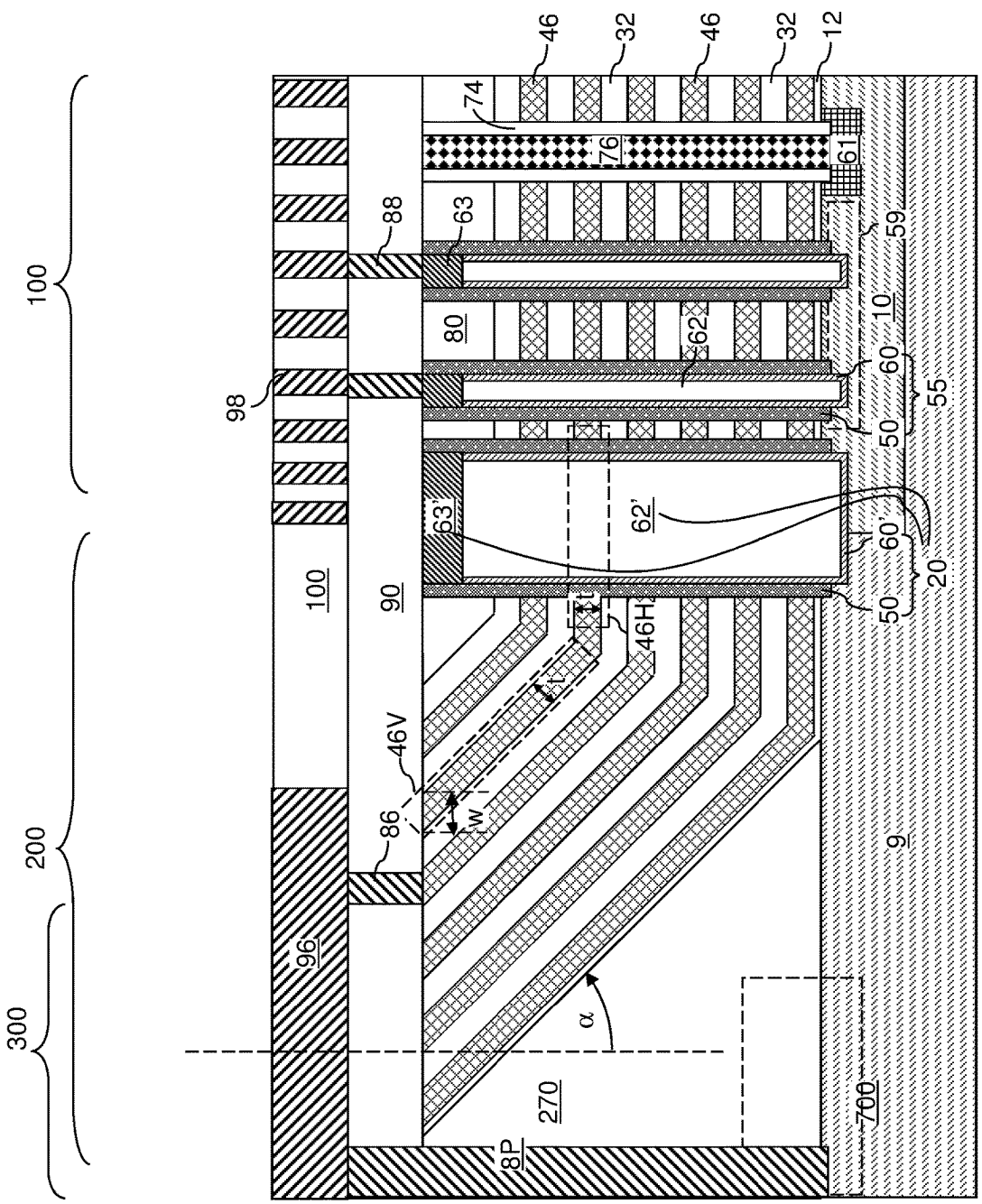
FIG. 17 is a schematic vertical cross-sectional view of the second exemplary structure after formation of various interconnect line structures according to the second embodiment of the present disclosure.

Subsequently, the processing steps of FIGS. 4A, 4B, 5A-5C, 6, 7A, 7B, 8A, 8B, 9, 10, 11, 12A-12C, 13A, 13B, 14A, and 14B can be sequentially performed to form the structure illustrated in FIG. 17. The width w of each top surface of an electrically conductive layer 46 is $1/(\cos\alpha)$ times the uniform thickness t of the electrically conductive layer 46. Thus, the width w of each top surface of each electrically conductive layer 46 can be greater than the uniform thickness t of the respective electrically conductive layer 46. By increasing the width w of the top surface of the electrically conductive layers 46 above the thickness of the electrically conductive layers 46, the overlay requirement during formation of the word line contact via structures 86 can be relaxed. Correspondingly, yield and reliability of the contact between the electrically conductive layers 46 and the word line contact via structures 86 can be enhanced by employing a non-zero taper angle α.

Figure 18A:
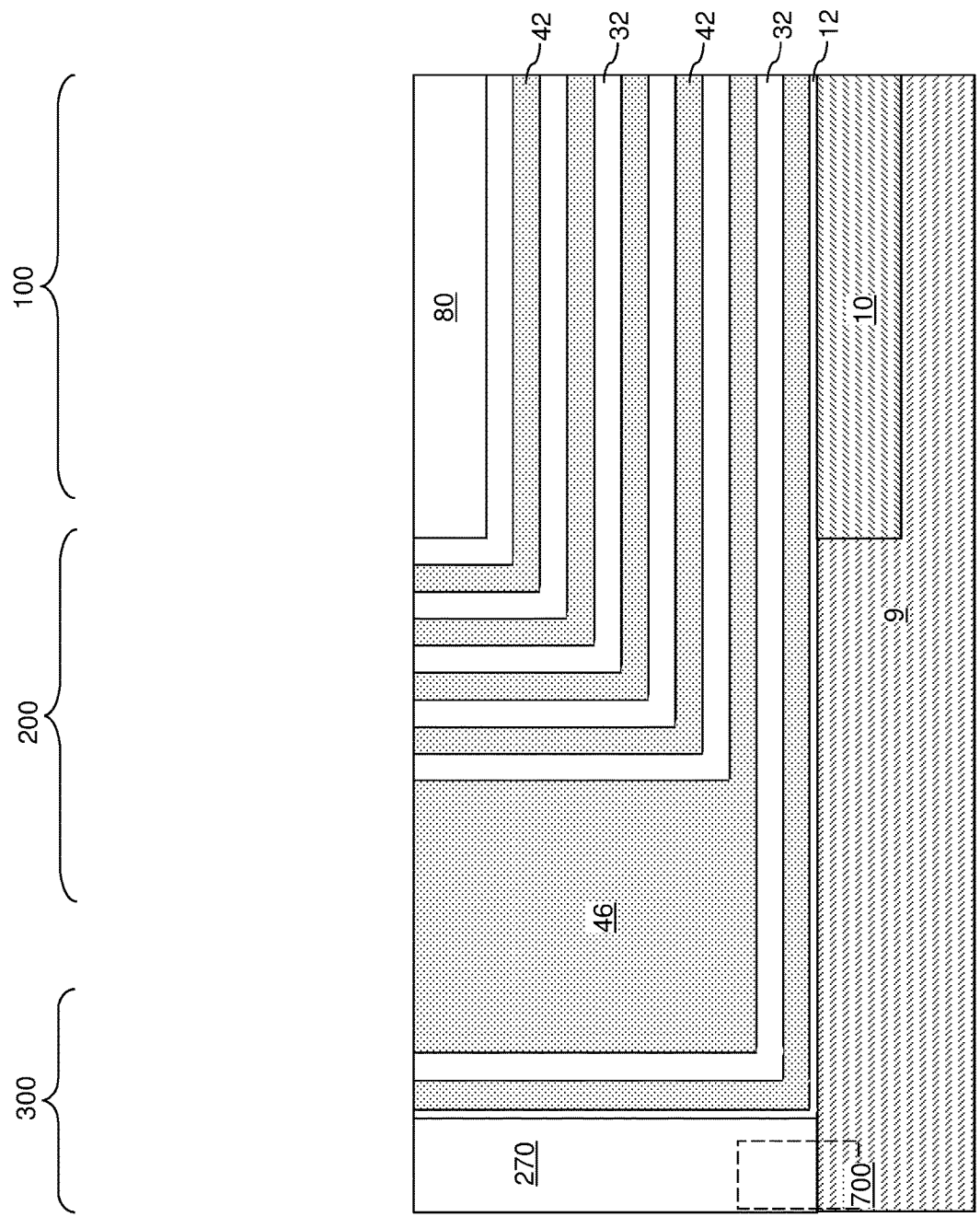
FIG. 18A is a vertical cross-sectional view of a third exemplary structure after planarization of an alternating stack of insulating layers and sacrificial material layers according to a third embodiment of the present disclosure.

Referring to FIGS. 18A and 18B, a third exemplary structure according to a third embodiment of the present disclosure can be derived by modifying the first or second exemplary structure of the present disclosure such that the dielectric mesa structure 270 includes a plurality of sidewalls that forms a plurality of lateral indentations. The pattern of the lateral indentations on the dielectric mesa structure 270 can be formed, for example, by patterning the masking layer 277 (illustrated in FIGS. 2 and 15) with indentations, and by transferring the pattern of the masking layer 277 through the planarization dielectric layer 270 employing an etch process with, or without, a taper angle. The patterned portion of the planarization dielectric layer 270L constitutes the dielectric mesa structure 270. The pattern of the lateral indentations can be formed inward from the outer sidewalls of the dielectric mesa structure 270. A gate dielectric layer 12 and an alternating stack of insulating layers 32 and sacrificial material layers 42 can be formed over the top surface of the substrate (9, 10), the top surface of the dielectric mesa structure 270, and the sidewalls of the dielectric mesa structure 270 as in the first and second embodiments.

A dielectric cap layer 80 can be formed over a region of the alternating stack (32, 42) that is laterally offset from the dielectric mesa structure 270, i.e., within the memory array region 100 as in the first and second embodiments. A peripheral portion of the alternating stack (32, 42) is removed from above the horizontal plane including the top surface of the dielectric mesa structure 270, while not removing an array portion of the alternating stack (32, 42) underneath the horizontal plane that includes the top surface of dielectric cap layer 80. In one embodiment, the peripheral portion of the alternating stack (32, 42) can be removed by a planarization process that employs the dielectric cap layer 80 as a stopping structure as in the first and second embodiments. Optionally, the planarization process can employ the dielectric mesa structure 270 as an additional stopping structure.

The dielectric mesa structure 270 has multiple sets of sidewalls such that each set of sidewalls forms a respective lateral indentation having a respective indentation width (IW1, IW2, IW3). The plurality of lateral indentations can have different widths so that the innermost material layer that laterally protrudes into each lateral indentation can be different material layers within the alternating stack (32, 42). In one embodiment, the widths of the lateral indentations on the dielectric mesa structure 270 and the thicknesses of the layers in the alternating stack (32, 42) can be selected such that each innermost material layer within the lateral indentations can be sacrificial material layers 42. Further, the widths of the lateral indentations on the dielectric mesa structure 270 and the thicknesses of the layers in the alternating stack (32, 42) can be selected such that each sacrificial material layer 42 that forms an innermost material portion within a lateral indentation has a width that is greater than the width of the top surface of a portion of the respective sacrificial material layer 42 that extends parallel to the lengthwise direction of the non-horizontal sub-portions of the sacrificial material layers 42 within the contact region 20, which is the second horizontal direction HD2. The first horizontal direction HD1 is perpendicular to the second horizontal direction HD2.

Thus, each spacer material layer (i.e., each sacrificial material layer 42) can have respective elongated portions that protrude into respective lateral indentations. The areas of the innermost material portions can be employed to form word line contact via structures thereupon, and are herein referred to as word line contact regions (CA1, CA2, CA3). The word line contact regions (CA1, CA2, CA3) can have rectangular shapes. In one embodiment, each innermost material region (which is a portion of a respective sacrificial material layer 42) within the lateral indentations can have a width that in a range from 101% to 200% (such as from 120% to 180%) of the width of the top surface of the non-horizontal sub-portion of the respective sacrificial material layer 42 that extends along the second horizontal direction HD2 within the contact region 20.

Support pillar structures 20 can be formed employing the same methods as in the first and second embodiments.

Subsequently, the processing steps of FIGS. 6, 7A, 7B, 8A, 8B, 9, 10, 11, and 12A-12C can be sequentially performed to provide the structure illustrated in FIGS. 19A and 19B.

The top surface of a non-horizontal sub-portion of each electrically conductive layer 46 that extends along the second horizontal direction HD2 within the contact region 20 can have a first width w1. The innermost material portion of same electrically conductive layer 46 within a respective lateral indentation can have a second width w2, which can be a range from 101% to 200% (such as from 120% to 180%) of the first width w1. Thus, each word line contact region (CA1, CA2, CA3) can provide a greater width than the top surface of the non-horizontal sub-portion of each electrically conductive layer 46 that extends parallel to at least one sidewall of the dielectric pillar structure 270 that is most proximal to the memory stack structures 55. Generally speaking, at least one of the electrically conductive layers 46 can have a top surface including a first region located outside of the lateral indentations and having a first width w1 and a second region extending into one of the lateral indentations and having a second width w2 that is greater than the first width w1.

Figure 20A:
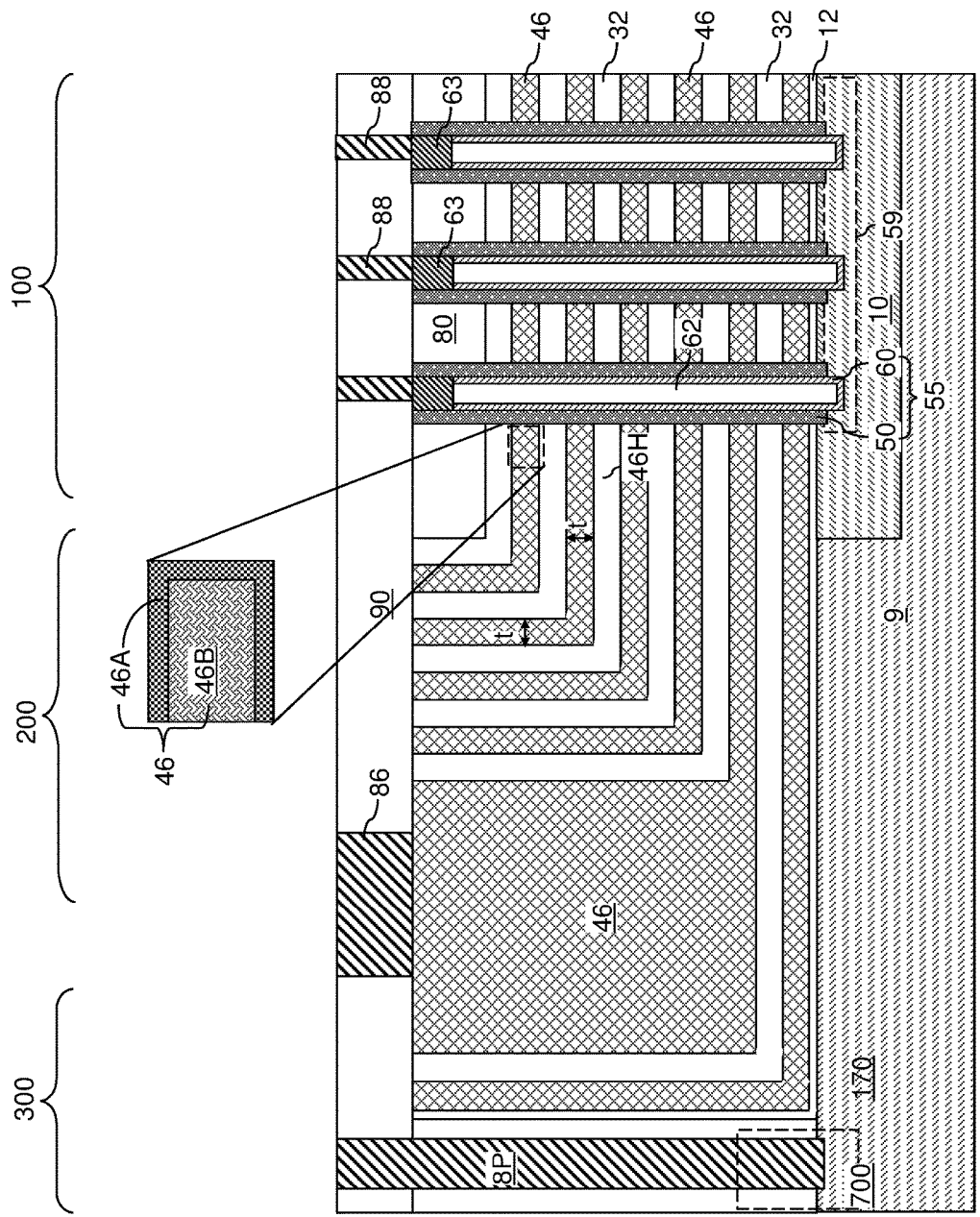
FIG. 20A is a vertical cross-sectional view of the third exemplary structure after formation of various contact via structures according to the third embodiment of the present disclosure.
Figure 20B:
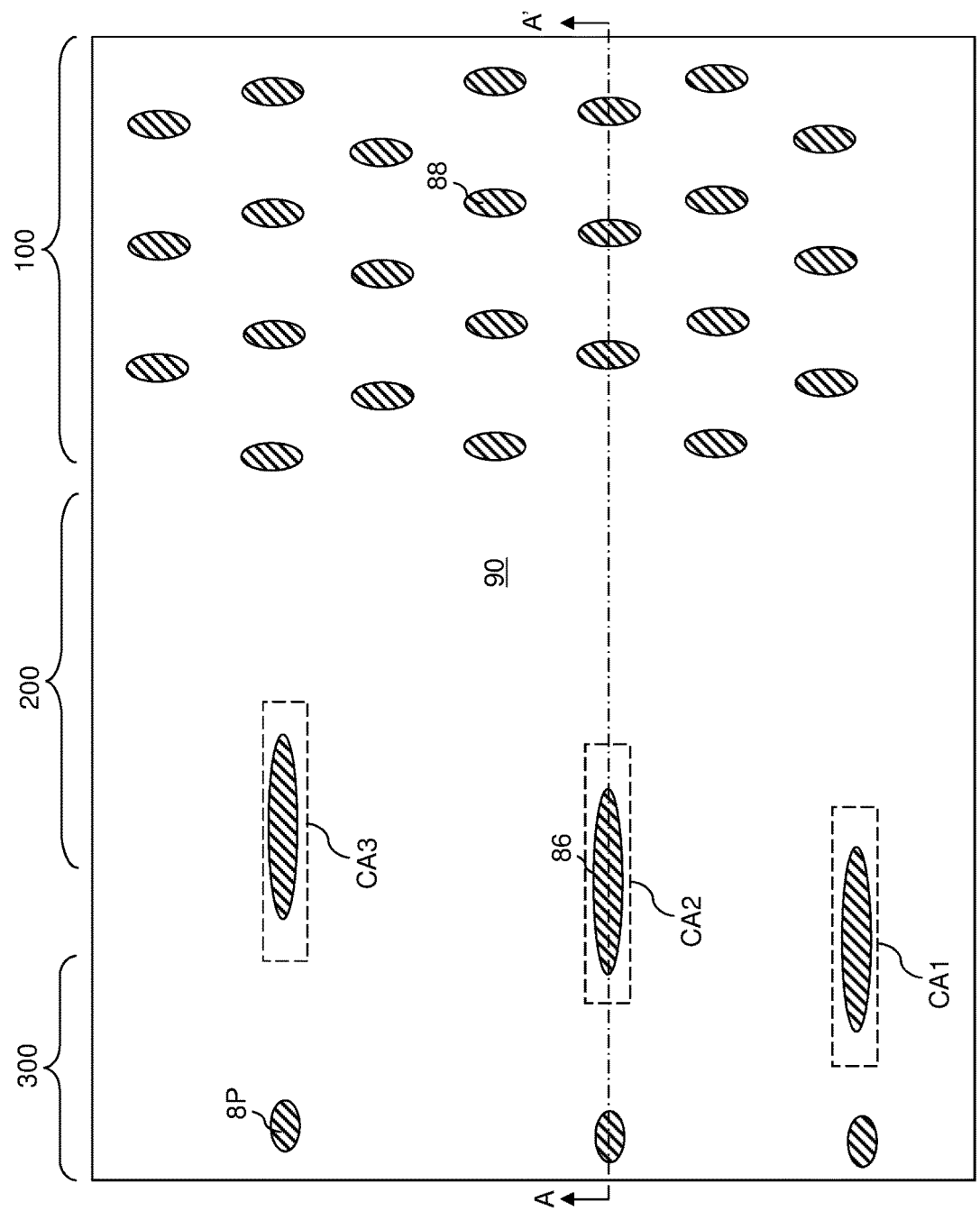
FIG. 20B is a top-down view of the third exemplary structure of FIG. 20A.

Referring to FIGS. 20A and 20B, the processing steps of FIGS. 13A and 13B can be performed to form a contact level dielectric layer 90, drain contact via structures 88, word line contact via structures 86, and the device contact via structures 8P. The word line contact via structures 88 can be formed within the word line contact regions (CA1, CA2, CA3) with a greater overly tolerance during lithographic patterning of via cavities for the word line contact via structures 88. Subsequently, the processing steps of FIGS. 14A and 14B can be performed.

Figure 19A:
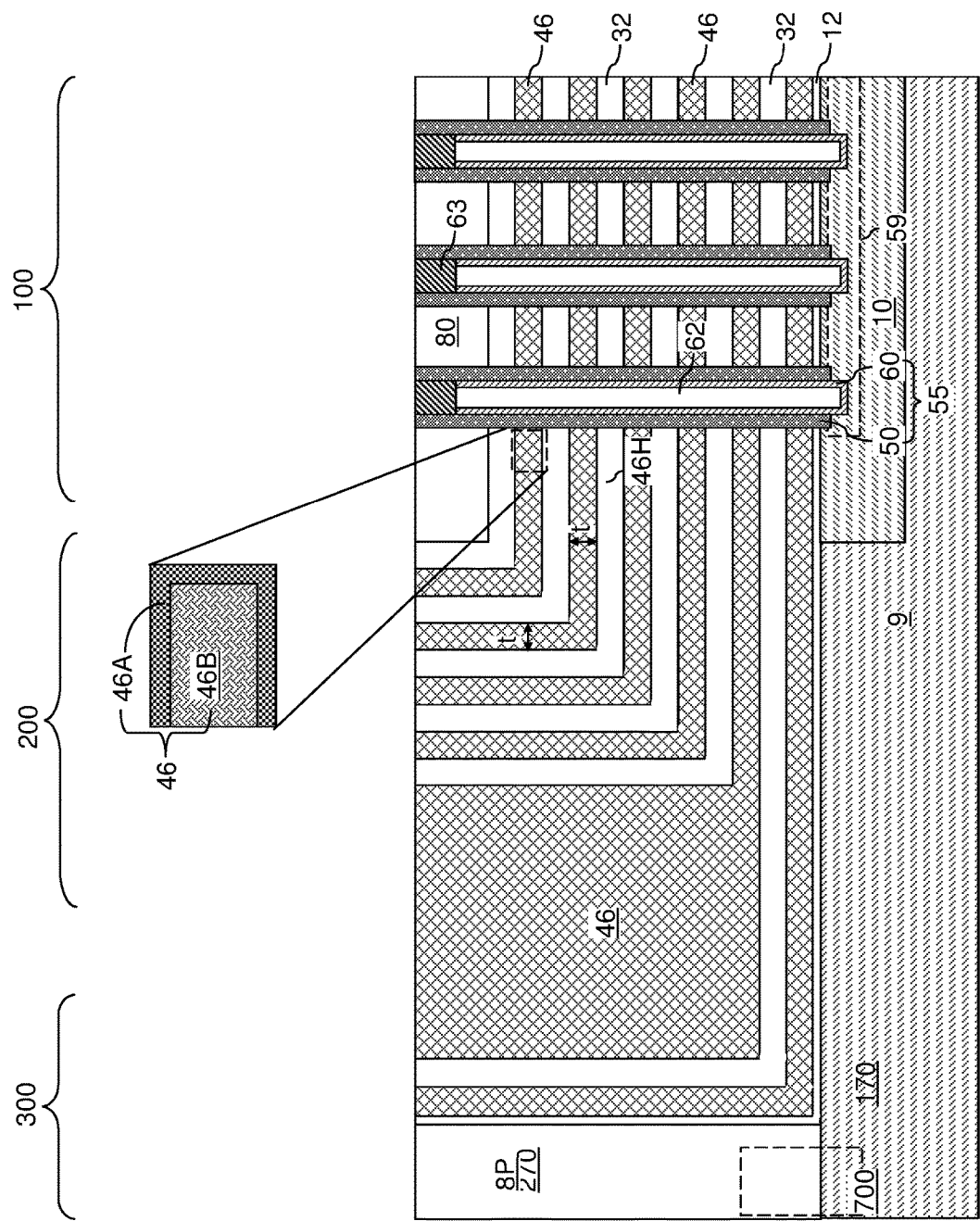
FIG. 19A is a vertical cross-sectional view of the third exemplary structure after formation of backside contact via structures according to the third embodiment of the present disclosure.
Figure 19B:
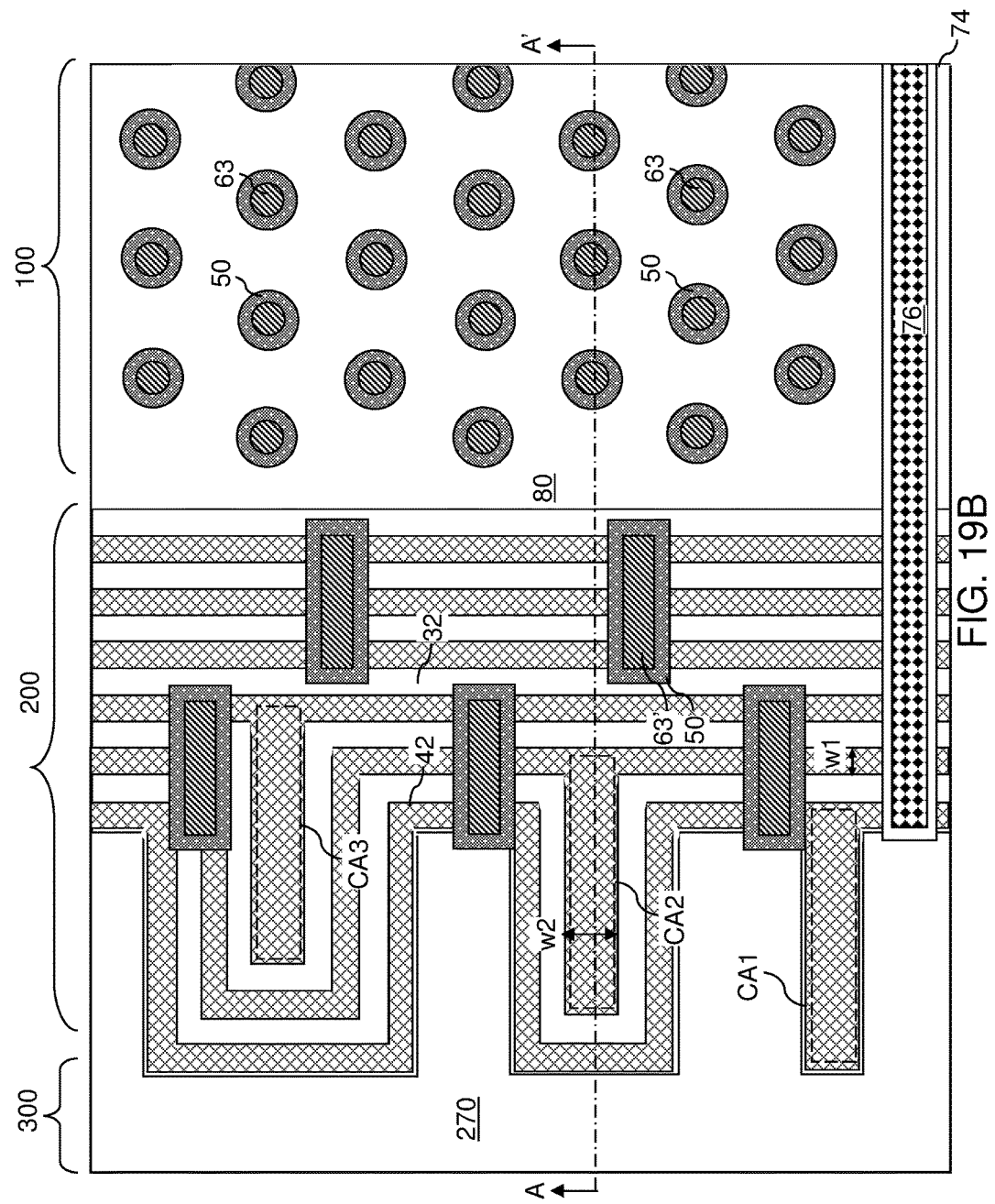
FIG. 19B is a top-down view of the third exemplary structure of FIG. 19A.
Figure 21:
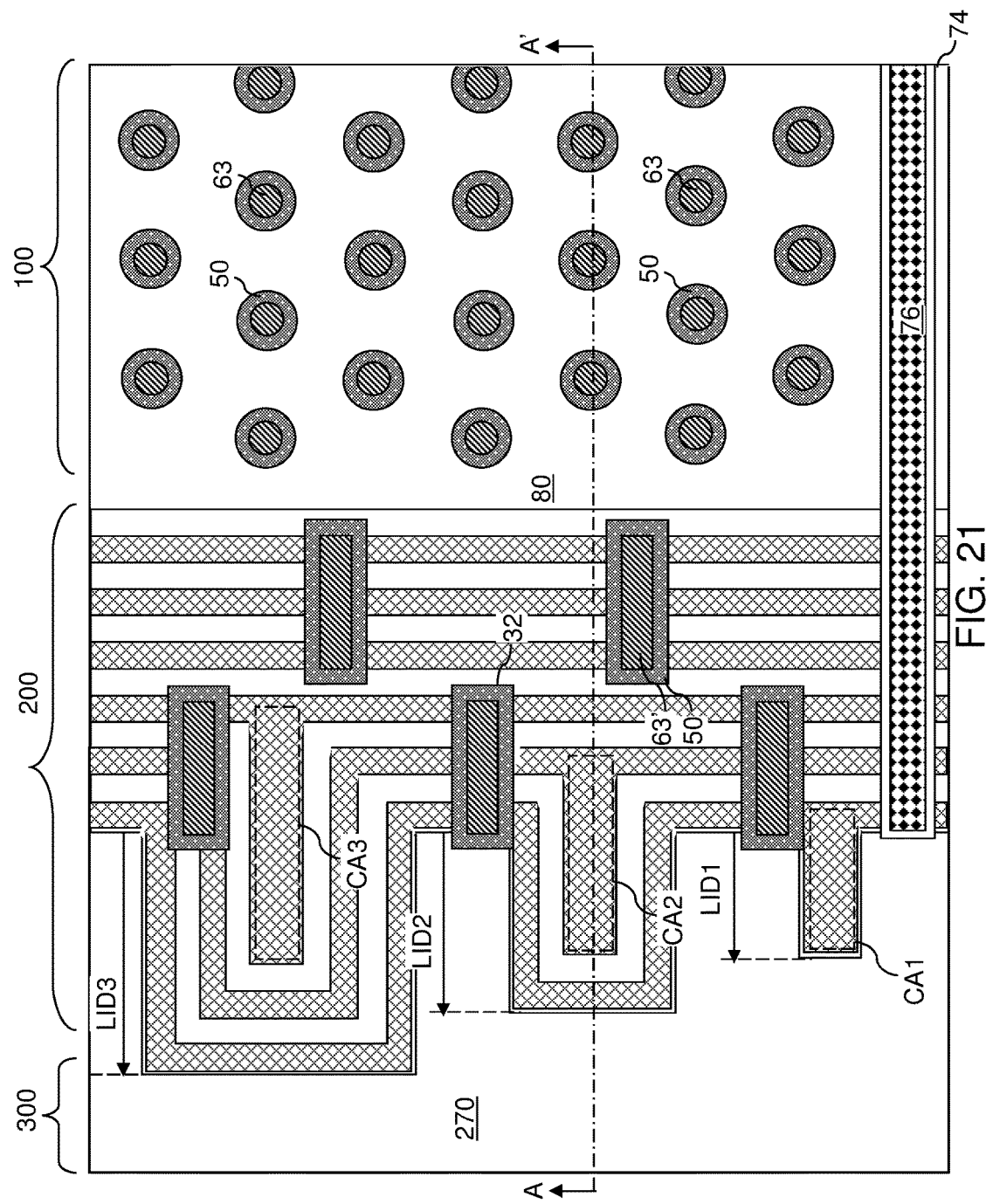
FIG. 21 is a top-down view of an alternate embodiment of the third exemplary structure after formation of backside contact via structures according to the third embodiment of the present disclosure.

Referring to FIG. 21, an alternate embodiment of the third exemplary structure is illustrated at the processing steps of FIGS. 19A and 19B. In the alternate embodiment, the lateral indentations can be formed with different lateral indentation depths (LID1, LID2, LID3). Further, the support pillar structures 20 may be omitted if collapse of the non-horizontal sub-portions of the insulating layers 32 can be prevented during replacement of the sacrificial material layers 42 with electrically conductive layers 46.

Figure 22:
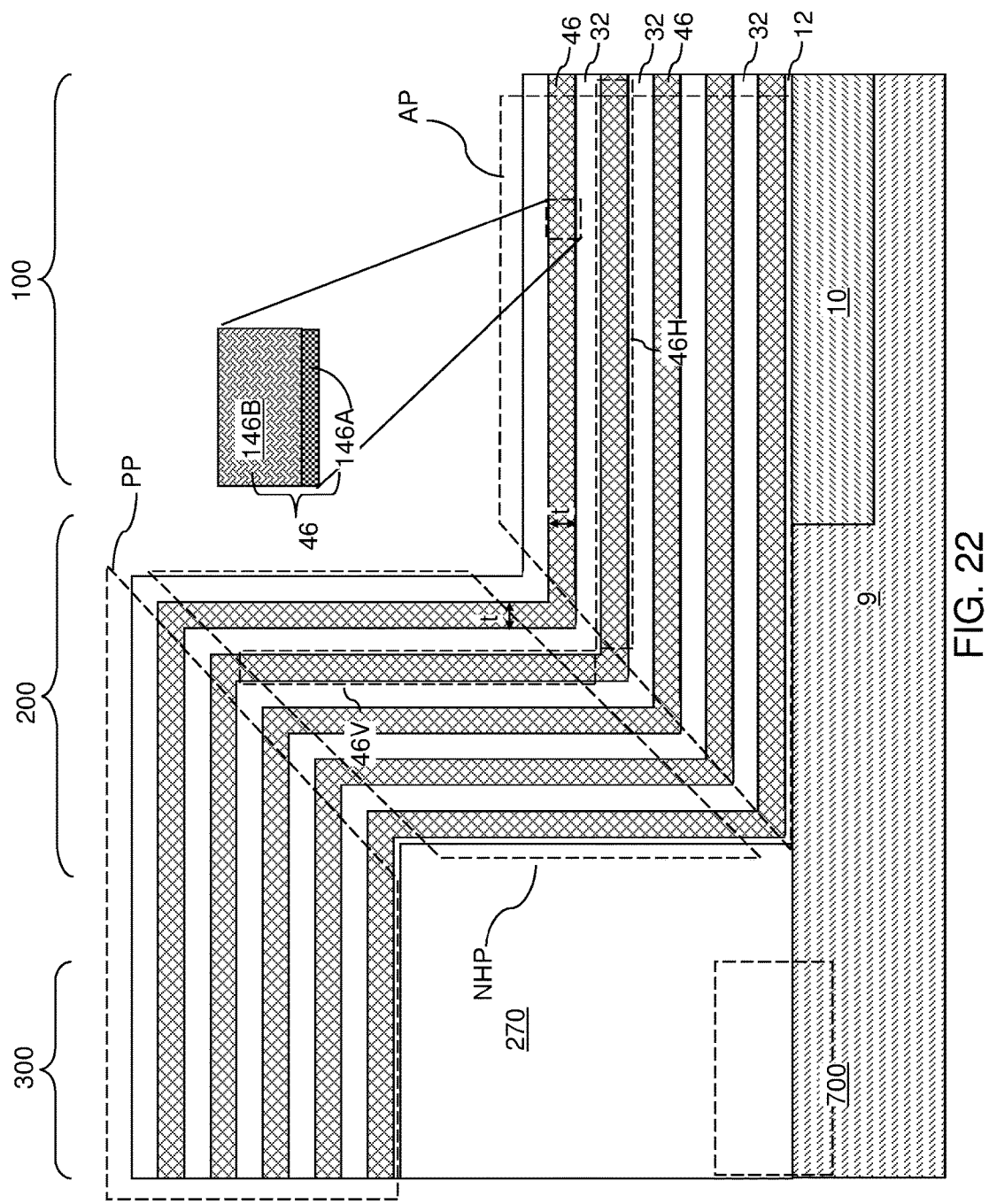
FIG. 22 is a vertical cross-sectional view of a fourth exemplary structure after formation of a dielectric mesa structure and an alternating stack of insulating layers and electrically conductive layers according to a fourth embodiment of the present disclosure.

Referring to FIG. 22, a fourth exemplary structure according to a fourth embodiment of the present disclosure can be derived from any of the first, second, and third exemplary structure by employing electrically conductive layers 46 as the spacer material layers at the processing steps of formation of an alternating stack of insulating layers and spacer material layers, i.e., at the processing steps of FIG. 3, FIG. 16, or FIGS. 18A and 18B. In other words, an alternating stack of insulating layers 32 and spacer material layers as embodied as the electrically conductive layers 46 can be formed over a top surface of the substrate (9, 10), the top surface of the dielectric mesa structure 270, and the at least one sidewall of the dielectric mesa structure 270. The alternating stack of insulating layers 32 and electrically conductive layers include an array portion AP, a non-horizontally extending portion NHP, and a peripheral portion PP.

Each of the electrically conductive layers 46 comprises a respective continuously-extending conductive material portion of a homogeneous composition that includes a respective horizontal sub-portion that extends parallel to the top surface of the substrate (9, 10) and a respective non-horizontal sub-portion that extends parallel to the at least one sidewall of the dielectric mesa structure 270. In one embodiment, each electrically conductive layer 46 can include a metallic liner layer 146A that include the metallic liner material (such as a conductive metal nitride) and a metallic material layer 146B that includes a metallic material (such as an elemental metal or an intermetallic alloy). In this case, each metallic material layer 146B within the electrically conductive layers 46 is a continuously-extending conductive material portion of a homogeneous composition that includes a respective horizontal sub-portion that extends parallel to the top surface of the substrate (9, 10) (and located within a first horizontal sub-portion 46H of the respective electrically conductive layer 46) and a respective non-horizontal sub-portion that extends parallel to the at least one sidewall of the dielectric mesa structure 270 (and located within a non-horizontal sub-portion 46V of the respective electrically conductive layer 46). Further, each metallic liner layer 146A within the electrically conductive layers 46 is a continuously-extending conductive material portion of a homogeneous composition that includes a respective horizontal sub-portion that extends parallel to the top surface of the substrate (9, 10) (and located within a first horizontal sub-portion 46H of the respective electrically conductive layer 46) and a respective non-horizontal sub-portion that extends parallel to the at least one sidewall of the dielectric mesa structure 270 (and located within a non-horizontal sub-portion 46V of the respective electrically conductive layer 46). Each of the continuously-extending conductive material portions, as embodied as a metallic liner layer 146A or as a metallic material layer 146B, is free of any physical interface therein.

Figure 23:
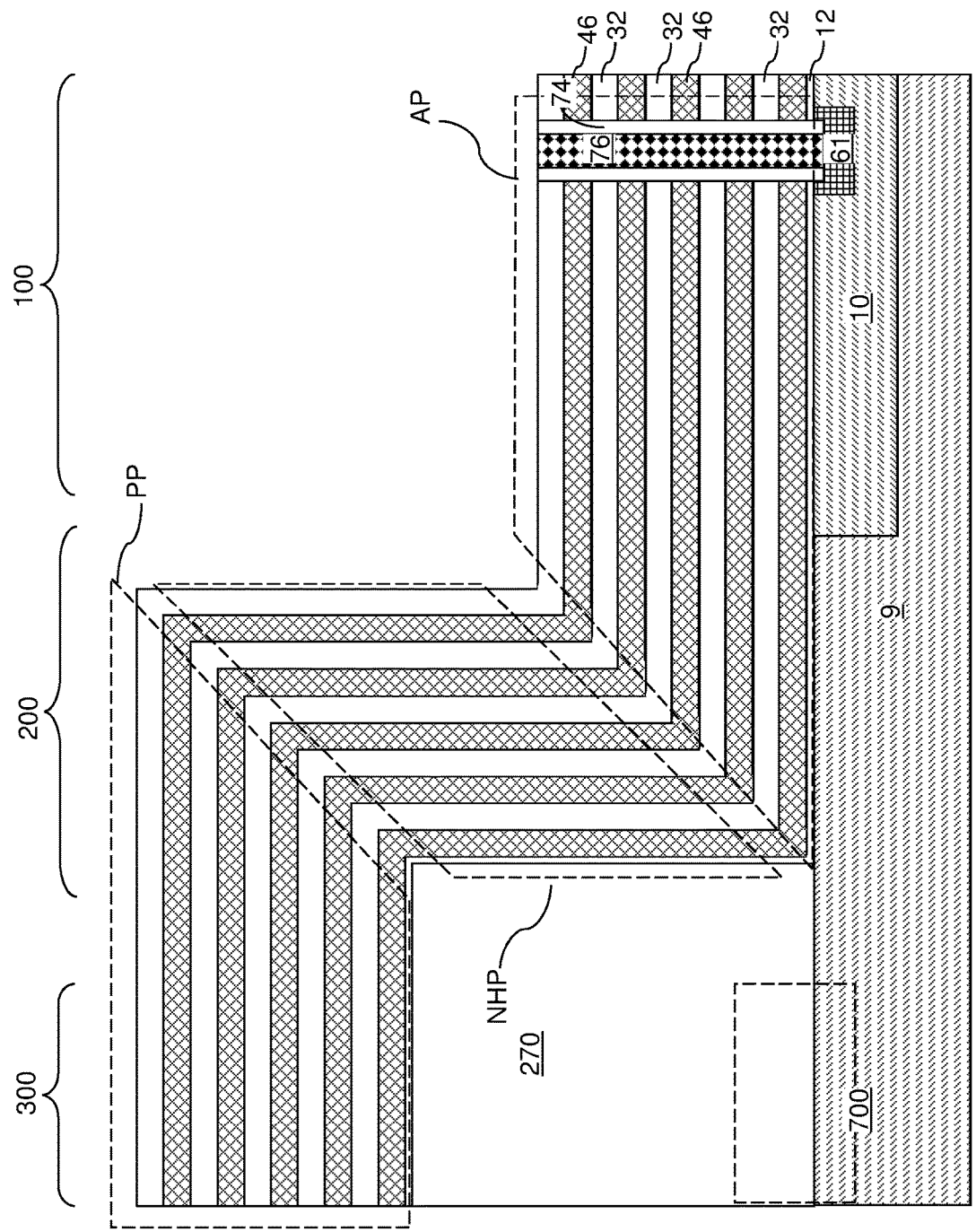
FIG. 23 is a vertical cross-sectional view of the fourth exemplary structure after formation of a backside contact via structure according to the fourth embodiment of the present disclosure.

Referring to FIG. 23, backside trenches can be formed in regions of the backside trenches 79 of the first through third embodiments by application of a photoresist layer, patterning of the photoresist layer, transfer of the pattern of openings in the photoresist layer through the alternating stack (32, 46), and removal of the photoresist layer. An insulating spacer 74 can be formed within each backside trench by deposition and anisotropic etching of a conformal dielectric material layer. Source regions 61 can be formed by implantation of electrical dopants. Each surface portion of the doped semiconductor well 10 that is located between each source region 61 and vertical semiconductor channels 60 within adjacent memory stack structures 55 constitutes a horizontal semiconductor channel 59. A backside contact via structure 76 can be formed within each backside trench by deposition of a conductive material and removal of the excess conductive material from above the alternating stack (32, 42).

Figure 24:
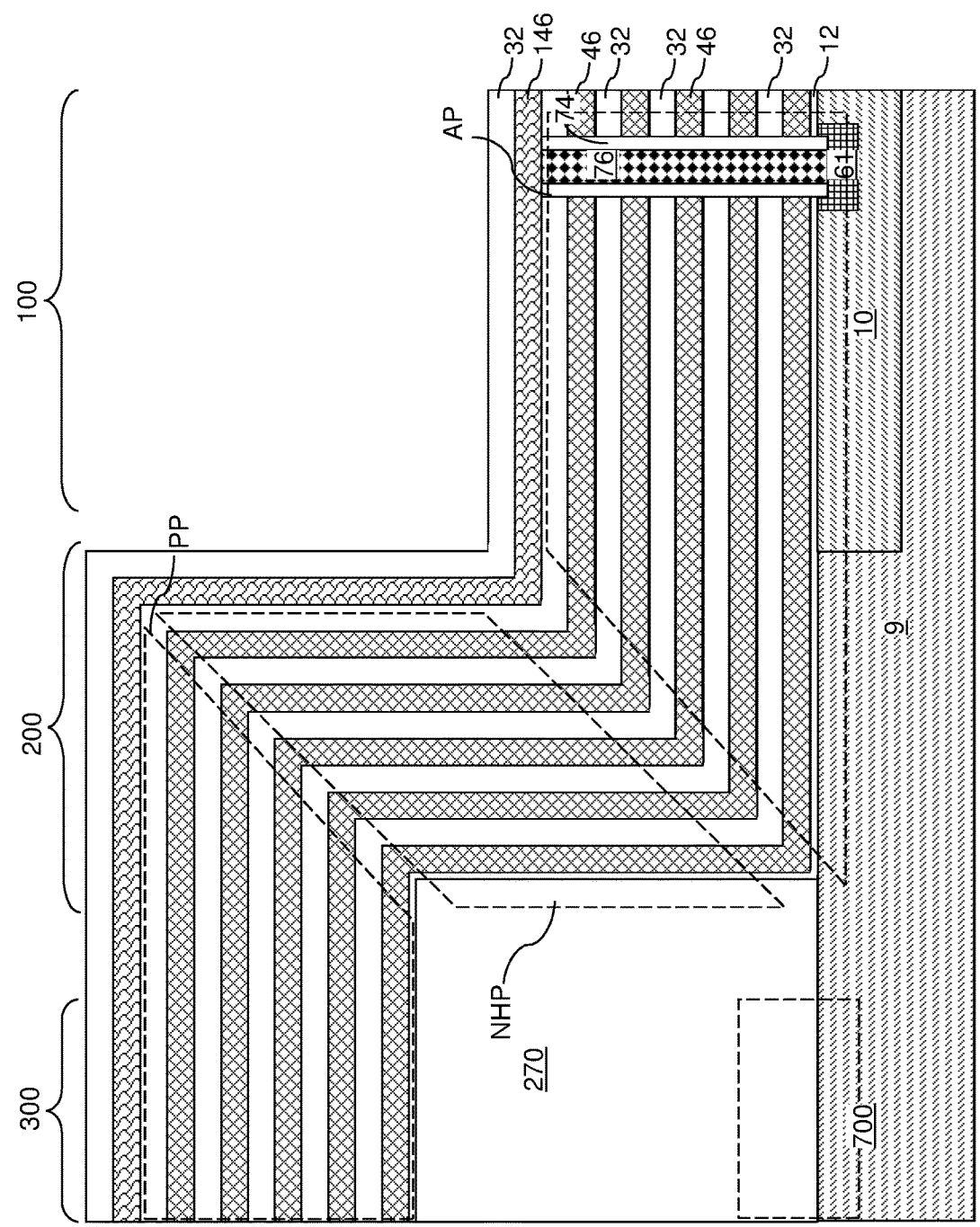
FIG. 24 is a vertical cross-sectional view of the fourth exemplary structure after formation of a select gate conductive layer and an insulating layer according to the fourth embodiment of the present disclosure.

Referring to FIG. 24, at least one select gate level conductive layer 146 and at least one additional insulating layer 32 can be optionally formed over the alternating stack (32, 42) by conformal deposition processes. In one embodiment, the select gate level conductive layer 146 can be formed from a different material than the electrically conductive layers 46. For example, layer 146 may comprise heavily doped polysilicon. The select gate level conductive layer 146 functions as a drain side select gate electrode of the NAND device.

Figure 25:
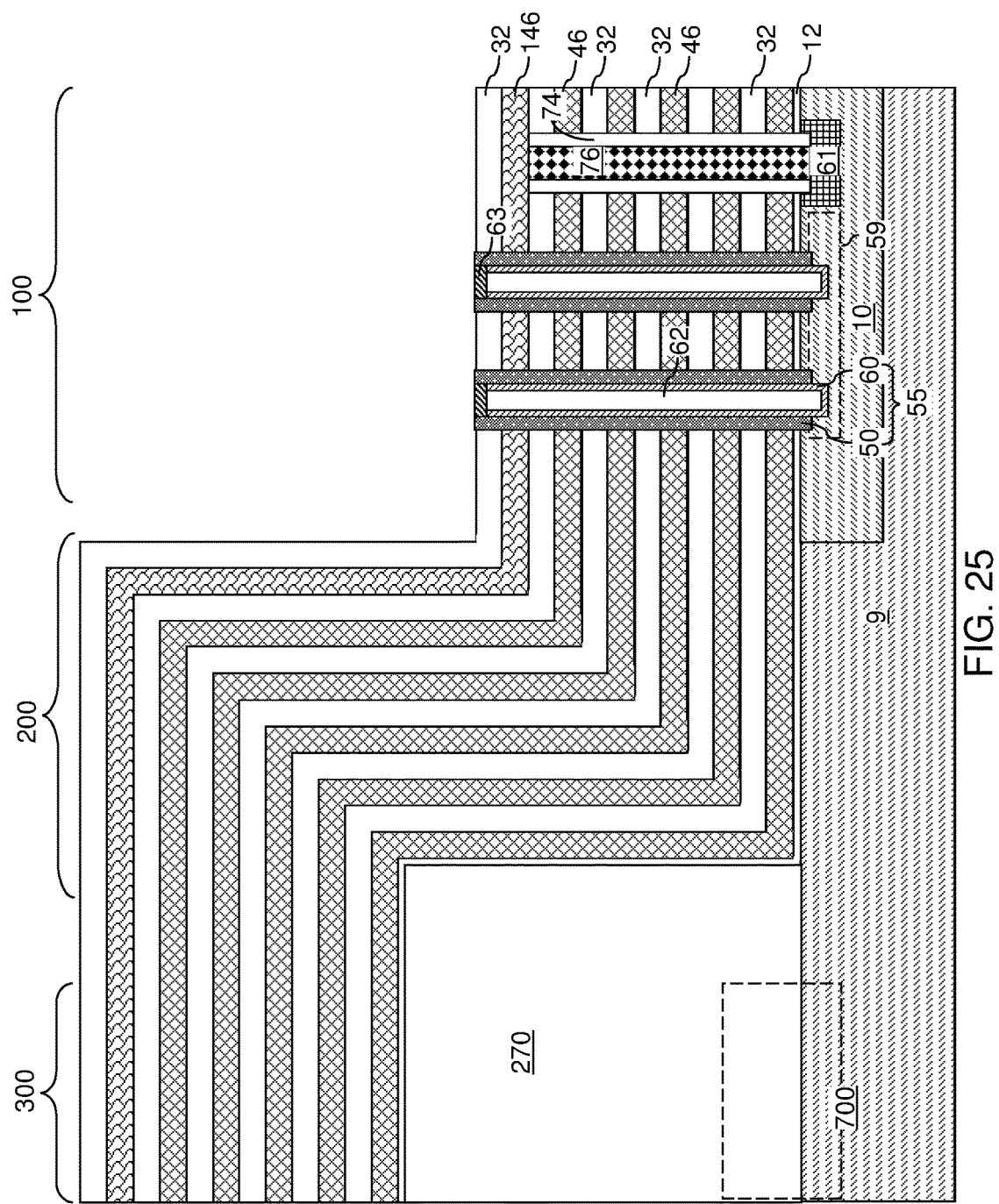
FIG. 25 is a vertical cross-sectional view of the fourth exemplary structure after formation of memory stack structures according to the fourth embodiment of the present disclosure.

Referring to FIG. 25, the processing steps of FIG. 6 can be performed to form memory openings. A top surface of the substrate (9, 10) is physically exposed at a bottom of each of the memory openings. Subsequently, the processing steps of FIGS. 7A and 7B can be performed to form memory stack structures 55, dielectric cores 62, and drain regions 63. Each of the memory stack structures 55 comprises a memory film 50 and a vertical semiconductor channel 60.

Figure 26:
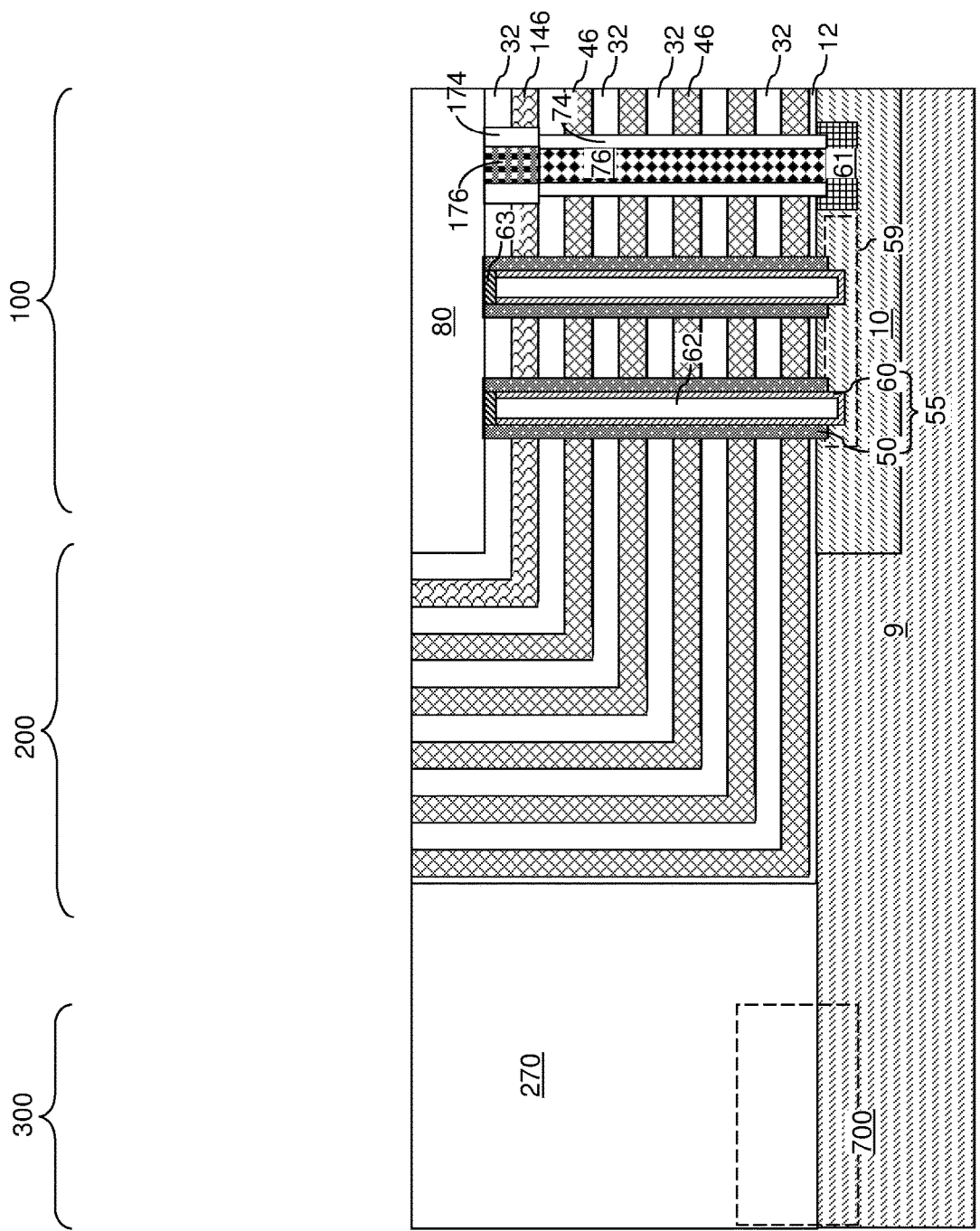
FIG. 26 is a vertical cross-sectional view of the fourth exemplary structure after a planarization process according to the fourth embodiment of the present disclosure.

Referring to FIG. 26, a dielectric cap layer 80 can be formed over the first horizontal sub-portions of the insulating layers 32 and the electrically conductive layers 46 in the memory array region 100. The dielectric cap layer 80 can be deposited by a self-planarizing process such as spin coating. For example, the dielectric cap layer 80 can include spin-on glass (SOG). The thickness of the dielectric cap layer 80 can be selected such that the top surface of the dielectric cap layer 80 is formed at, or below, the horizontal plane including the top surface of the dielectric mesa structure 270. Thus, the dielectric cap layer 80 is formed over a region of the alternating stack (32, 46) that is laterally offset from the dielectric mesa structure 270. Alternatively, the dielectric cap layer 80 may comprise a silicon nitride or silicon oxynitride etch stop layer deposited over the peripheral portion PP, the non-horizontally extending portion NHP and the array portion AP of the alternating stack (32, 42).

The peripheral portion PP of the alternating stack (32, 46) is removed by a planarization process that employs the dielectric cap layer 80 as a stopping structure. For example, the peripheral portion PP of the alternating stack (32, 46) can be removed from above the horizontal plane including the top surface of the dielectric mesa structure 270, while the array portion AP of the alternating stack (32, 46) underneath the horizontal plane is not removed. In one embodiment, a patterned recess etch may be employed. In this case, a photoresist layer may be applied and to cover the area overlying the dielectric cap layer 80 and not to cover the peripheral portion PP of the alternating stack (32, 46), and an isotropic etch or an anisotropic etch may be performed to remove the peripheral portion PP of the alternating stack (32, 46) while the photoresist layer protects the array portion AP of the alternating stack (32, 46). The photoresist layer can be subsequently removed, for example, by ashing. Additionally or alternatively, chemical mechanical planarization (CMP) can be employed to remove all, or a residual portion, of the peripheral portion PP of the alternating stack (32, 46).

Use of the dielectric cap layer 80 as a stopping structure during the planarization process can provide a planarized structure in which top surfaces of the various layers in the non-horizontally extending portion NHP of the alternating stack (32, 46) are within the same horizontal plane as a top surface of the dielectric cap layer 80, which may be recessed with respect to the top surface of the dielectric cap layer 80 as formed at the processing step of FIG. 3. Optionally, the dielectric mesa structure 270 may be employed as an additional stopping structure during the planarization process. In one embodiment, the top surfaces of the remaining portions of the dielectric cap layer 80, the non-horizontally extending portion NHP of the alternating stack (32, 46), and the dielectric mesa structure 270 can be located within a same horizontal plane after the planarization process. However, the non-horizontally extending portion NHP of the alternating stack (32, 46) can be recessed below the horizontal plane of the top of the mesa structure 270 during the etching and/or planarization step(s). Top surfaces of the electrically conductive layers 46 are physically exposed at the horizontal plane including the top surface of the dielectric cap layer 80.

Figure 27:
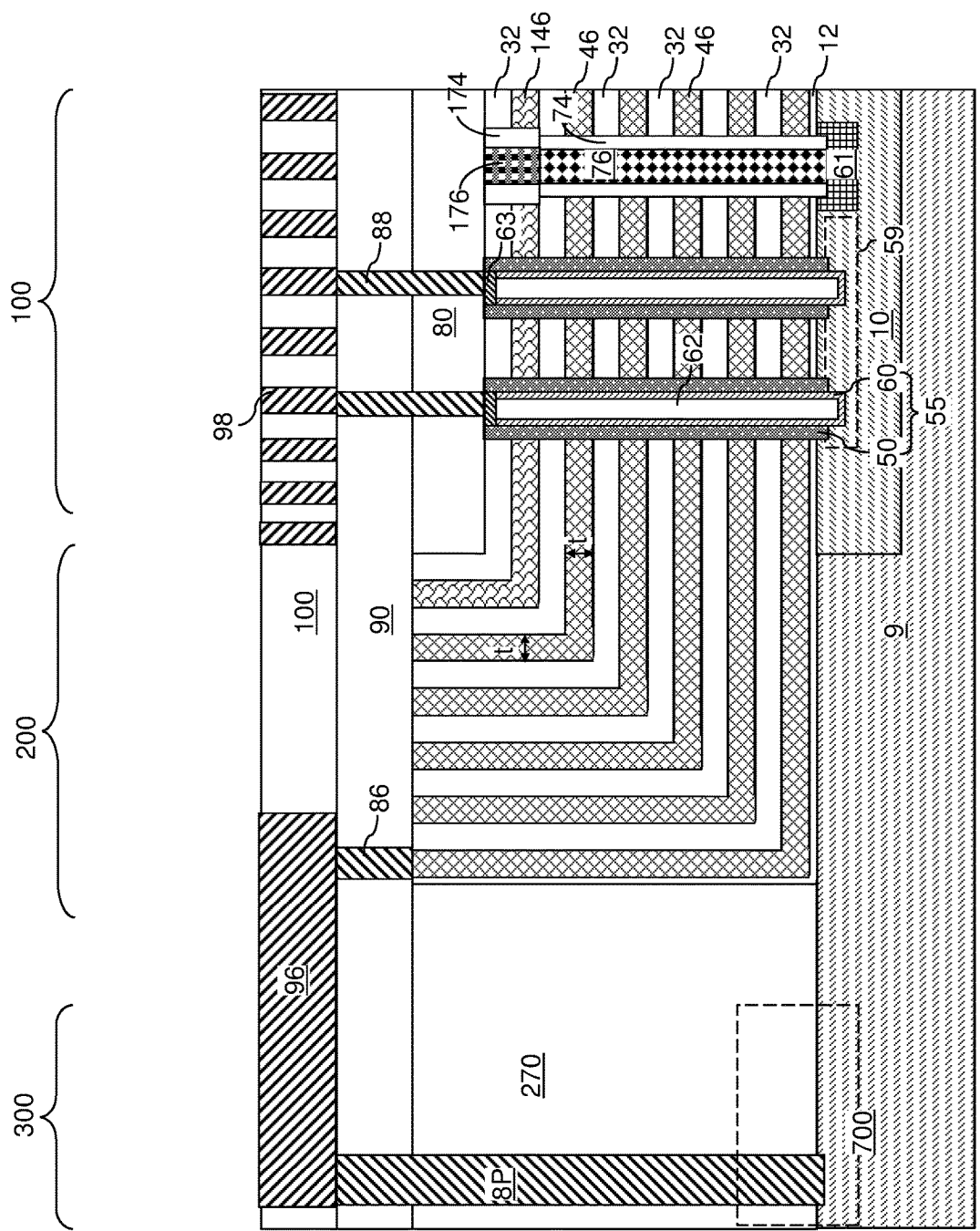
FIG. 27 is a vertical cross-sectional view of the fourth exemplary structure after formation of interconnect line structures according to the fourth embodiment of the present disclosure.

Referring to FIG. 27, the processing steps of FIGS. 13A, 13B, 14A, and 14B can be performed with a modification that extends the drain contact via structures 88 through the contact level dielectric layer 90 and the dielectric cap layer 80.

Figure 28:
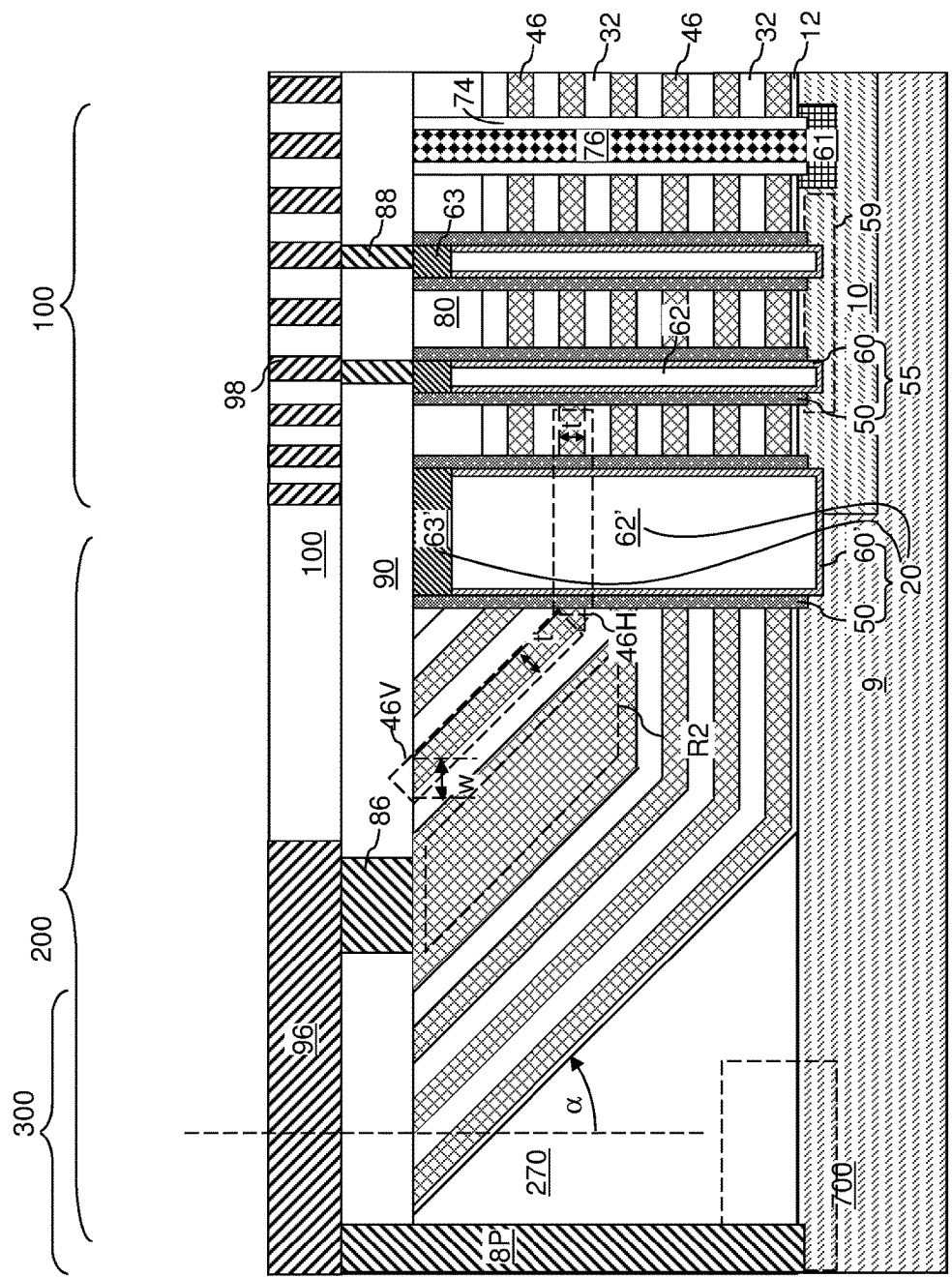
FIG. 28 is a vertical cross-sectional view of an exemplary structure incorporating features of the first, second, and third embodiments of the present disclosure.

The features of the various embodiments of the present disclosure can be combined into a same structure. For example, the features of the first, second, and third exemplary structures can be combined to provide an exemplary structure illustrated in FIG. 28, which includes dielectric pillar structures 20 from the first and second embodiment, at least one tapered sidewall of a dielectric mesa structure 270 from the second embodiment, and lateral indentations formed on the dielectric mesa structure and at least one electrically conductive layers 46 having a top surface including a first region located outside of the lateral indentations (and off the plane of the vertical cross-sectional view of FIG. 28) and having a first width and a second region R2 extending into one of the lateral indentations and having a second width that is greater than the first width.

Each of the various embodiments of the present disclosure provides a three-dimensional memory device comprising: a mesa structure 270 located over a substrate (9, 10) and having a top surface and at least one dielectric sidewall; an alternating stack (32, 46) of insulating layers 32 and electrically conductive layers 46 located over the substrate (9, 10) and on the at least one sidewall of the dielectric mesa structure 270, wherein each of the electrically conductive layers 46 comprises a respective continuously-extending conductive material portion (46A, 46B, 146A, or 146B) of a homogeneous composition that includes a respective horizontal sub-portion that extends parallel to a top surface of the substrate (9, 10) and a respective non-horizontal sub-portion that extends parallel to the at least one sidewall of the dielectric mesa structure 270; memory stack structures 55 extending through a region of the alternating stack (32, 42) that includes the horizontal sub-portions of the electrically conductive layers 46, wherein each of the memory stack structures 55 comprises a memory film 50 and a vertical semiconductor channel 60; and word line contact via structures 86 that contact top surfaces of non-horizontal sub-portions of the electrically conductive layers 46 and embedded in a contact level dielectric layer 90 overlying the alternating stack (32, 46).

In one embodiment, the mesa structure 270 comprises a dielectric mesa structure, and each of the continuously-extending conductive material portions (46A, 46B, 146A, or 146B) is free of any physical interface therein. In one embodiment, a top surface of the dielectric mesa structure 270 and a top surface of a first region of the alternating stack (32, 46) that includes the non-horizontal sub-portions 46V of the electrically conductive layers 46 (i.e., the portion of the alternating stack (32, 46) within the contact region 200) are located within a first horizontal plane that is parallel to the top surface of the substrate (9, 10). In one embodiment, a topmost surface of a second region of the alternating stack (32, 46) that includes the horizontal sub-portions 46H of the electrically conductive layers 46 (i.e., the portion of the alternating stack (32, 46) in the memory array region 100) is located within a second horizontal plane that is located below the first horizontal plane, i.e., at the horizontal plane including the bottom surface of the dielectric cap layer 80. In one embodiment, a dielectric cap layer 80 can overlie the second region of the alternating stack (32, 46). Drain contact via structures 88 extend through the dielectric cap layer, overly the memory stack structures 55, and can have a bottom surface located within the first horizontal plane.

In one embodiment, each electrically conductive layer has a respective uniform thickness throughout a respective horizontal sub-portion and a region of a respective non-horizontal sub-portion. The three-dimensional memory device can further include a semiconductor device 700 located on the substrate (9, 10); a device contact via structure 8P extending through the dielectric mesa structure 270 and contacting the semiconductor device 700; and an interconnect line structure 96 contacting a top surface of the device contact via structure 8P and one of the word line contact via structures 86.

In one embodiment, each layer within the alternating stack (32, 46) includes as many openings therethrough as a total number of the memory stack structures 55 that the layer laterally surrounds, and each of the memory stack structures 55 is laterally surrounded by each layer within the alternating stack (32, 46).

In one embodiment, the three-dimensional memory device can include support pillar structures 20 extending through a first region of the alternating stack (32, 46) that includes the non-horizontal sub-portions of the electrically conductive layers 46 and laterally separating a subset of the electrically conductive layers 46.

In one embodiment, the at least one sidewall of the dielectric mesa structure 270 can have a taper angle in a range from 30 degrees to 75 degrees with respect to a vertical direction that is perpendicular to the top surface of the substrate (9, 10).

In one embodiment, the at least one sidewall of the dielectric mesa structure 270 comprises multiple sets of sidewalls; each set of sidewalls forms a respective lateral indentation having a respective indentation width; and the electrically conductive layers 46 have respective elongated portions that protrude into respective lateral indentations. In one embodiment, one of the electrically conductive layers 46 has a top surface including a first region located outside of the lateral indentations and having a first width and a second region extending into one of the lateral indentations and having a second width that is greater than the first width.

In one embodiment, the three-dimensional memory structure comprises a vertical NAND memory device. The electrically conductive layers 46 can comprise, or can be electrically connected to, a respective word line of the monolithic three-dimensional NAND memory device. The substrate (9, 10) can comprise a silicon substrate. The vertical NAND memory device can comprise an array of monolithic three-dimensional NAND strings over the silicon substrate. At least one memory cell (as embodied as a portion of a charge storage layer 54 at a level of an electrically conductive layer 46) in a first device level of the array of monolithic three-dimensional NAND strings can be located over another memory cell (as embodied as another portion of a charge storage layer 54 at a level of another electrically conductive layer 46) in a second device level of the array of monolithic three-dimensional NAND strings. The silicon substrate can contain an integrated circuit comprising a driver circuit for the memory device located thereon. The electrically conductive layers 46 can comprise a plurality of control gate electrodes having a strip shape extending substantially parallel to the top surface of the substrate (9, 10), e.g., along the first horizontal direction HD1 between a pair of backside trenches 79. The plurality of control gate electrodes comprises at least a first control gate electrode located in a first device level and a second control gate electrode located in a second device level. The array of monolithic three-dimensional NAND strings can comprise: a plurality of semiconductor channels (59, 60), wherein at least one end portion 60 of each of the plurality of semiconductor channels (59, 60) extends substantially perpendicular to a top surface of the substrate (9, 10); and a plurality of charge storage elements (as embodied as portions of the charge storage layer 54 that are located at each level of the electrically conductive layers 46). Each charge storage element can be located adjacent to a respective one of the plurality of semiconductor channels (59, 60).

The various embodiments of the present disclosure provide schemes for formatting an alternating stack of insulating layers 32 and electrically conductive layers 42 such that end portions of the electrically conductive layers 42 extend along a non-horizontal direction and provide top surfaces within a same horizontal plane that is elevated at least to the height of the top surfaces of drain regions 63 that are formed in memory openings 49. The electrically conductive layers 46 including non-horizontal sub-portions function as angled word lines that facilitate formation of word line contact via structures 88 thereupon. Thus, formation of staircases or a terrace region in which electrically conductive layers 46 extent to different lateral extents is not necessary. By eliminating the need to form a terrace region, the various embodiments of the present disclosure can simplify the process flow for manufacture of word line contact via structures, and thus, reduce the manufacturing cost and/or enhance the yield and/or reliability of the word line contact via structures 86 of a three-dimensional memory device.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device comprising:
   a mesa structure located over a substrate and having a top surface and at least one dielectric sidewall;
   an alternating stack of insulating layers and electrically conductive layers located over the substrate and on the at least one dielectric sidewall of the mesa structure, wherein each of the electrically conductive layers comprises a respective continuously-extending conductive material portion of a homogeneous composition that includes a respective horizontal sub-portion that extends parallel to a top surface of the substrate and a respective non-horizontal sub-portion that extends parallel to the at least one dielectric sidewall of the mesa structure;
   memory stack structures extending through a region of the alternating stack that includes the horizontal sub-portions of the electrically conductive layers, wherein each of the memory stack structures comprises a memory film and a vertical semiconductor channel;
   word line contact via structures that contact top surfaces of non-horizontal sub-portions of the electrically conductive layers and embedded in a contact level dielectric layer overlying the alternating stack; and
   support pillar structures extending through a first region of the alternating stack that includes the non-horizontal sub-portions of the electrically conductive layers and laterally separating vertical sub-portions of at least one of the electrically conductive layers,
   wherein the mesa structure comprises a dielectric mesa structure.

2. The three-dimensional memory device of claim 1, wherein:
   each of the continuously-extending conductive material portions is free of any physical interface therein; and
   a top surface of the dielectric mesa structure and a top surface of a first region of the alternating stack that includes the non-horizontal sub-portions of the electrically conductive layers are located within a first horizontal plane that is parallel to the top surface of the substrate.

3. The three-dimensional memory device of claim 2, wherein a topmost surface of a second region of the alternating stack that includes the horizontal sub-portions of the electrically conductive layers is located within a second horizontal plane that is located below the first horizontal plane.

4. The three-dimensional memory device of claim 3, further comprising:
   a dielectric cap layer overlying the second region of the alternating stack; and
   drain contact via structures extending through the dielectric cap layer, overlying the memory stack structures, and having a bottom surface located within the first horizontal plane.

5. The three-dimensional memory device of claim 1, wherein each electrically conductive layer has a respective uniform thickness throughout a respective horizontal sub-portion and a region of a respective non-horizontal sub-portion.

6. The three-dimensional memory device of claim 1, further comprising:
   a semiconductor device located on the substrate;
   a device contact via structure extending through the dielectric mesa structure and contacting the semiconductor device; and
   an interconnect line structure contacting a top surface of the device contact via structure and one of the word line contact via structures.

7. The three-dimensional memory device of claim 1, wherein:
   the electrically conductive layers comprise word lines;
   each of the support pillar structures comprises a semiconductor fill structure that is not electrically active, a dielectric fill structure, and the memory film;
   the support pillar structures have substantially rectangular horizontal cross-sectional areas having a length which is greater than the width by at least two times.

8. The three-dimensional memory device of claim 1, wherein the at least one dielectric sidewall of the dielectric mesa structure has a taper angle in a range from 30 degrees to 75 degrees with respect to a vertical direction that is perpendicular to the top surface of the substrate.

9. The three-dimensional memory device of claim 1, wherein:
   the at least one dielectric sidewall of the dielectric mesa structure comprises multiple sets of sidewalls;
   each set of sidewalls forms a respective lateral indentation having a respective indentation width; and the electrically conductive layers have respective elongated portions that protrude into respective lateral indentations.

10. The three-dimensional memory device of claim 9, wherein one of the electrically conductive layers has a top surface including a first region located outside of the lateral indentations and having a first width and a second region extending into one of the lateral indentations and having a second width that is greater than the first width.

11. The three-dimensional memory device of claim 1, wherein:
the three-dimensional memory device comprises a vertical NAND device located over the substrate;
the electrically conductive layers comprise, or are electrically connected to, a respective word line of the NAND device;
the substrate comprises a silicon substrate;
the vertical NAND device comprises an array of monolithic three-dimensional NAND strings over the silicon substrate;
at least one memory cell in a first device level of the array of monolithic three-dimensional NAND strings is located over another memory cell in a second device level of the array of monolithic three-dimensional NAND strings;
the silicon substrate contains an integrated circuit comprising a driver circuit for the memory device located thereon;
the electrically conductive layers comprise a plurality of control gate electrodes having a strip shape extending substantially parallel to the top surface of the substrate, the plurality of control gate electrodes comprise at least a first control gate electrode located in a first device level and a second control gate electrode located in a second device level; and
the array of monolithic three-dimensional NAND strings comprises:
a plurality of semiconductor channels, wherein at least one end portion of each of the plurality of semiconductor channels extends substantially perpendicular to a top surface of the substrate, and
a plurality of charge storage elements, each charge storage element located adjacent to a respective one of the plurality of semiconductor channels.

12. A three-dimensional memory device comprising:
a mesa structure located over a substrate and having a top surface and at least one dielectric sidewall;
an alternating stack of insulating layers and electrically conductive layers located over the substrate and on the at least one dielectric sidewall of the mesa structure, wherein each of the electrically conductive layers comprises a respective continuously-extending conductive material portion of a homogeneous composition that includes a respective horizontal sub-portion that extends parallel to a top surface of the substrate and a respective non-horizontal sub-portion that extends parallel to the at least one dielectric sidewall of the mesa structure;
memory stack structures extending through a region of the alternating stack that includes the horizontal sub-portions of the electrically conductive layers, wherein each of the memory stack structures comprises a memory film and a vertical semiconductor channel; and
word line contact via structures that contact top surfaces of non-horizontal sub-portions of the electrically conductive layers and embedded in a contact level dielectric layer overlying the alternating stack,
wherein:
the mesa structure comprises a dielectric mesa structure;
the at least one dielectric sidewall of the dielectric mesa structure comprises multiple sets of sidewalls;
each set of sidewalls forms a respective lateral indentation having a respective indentation width; and
the electrically conductive layers have respective elongated portions that protrude into respective lateral indentations.

13. The three-dimensional memory device of claim 12, wherein:
each of the continuously-extending conductive material portions is free of any physical interface therein; and
a top surface of the dielectric mesa structure and a top surface of a first region of the alternating stack that includes the non-horizontal sub-portions of the electrically conductive layers are located within a first horizontal plane that is parallel to the top surface of the substrate.

14. The three-dimensional memory device of claim 13, wherein a topmost surface of a second region of the alternating stack that includes the horizontal sub-portions of the electrically conductive layers is located within a second horizontal plane that is located below the first horizontal plane.

15. The three-dimensional memory device of claim 14, further comprising:
a dielectric cap layer overlying the second region of the alternating stack; and
drain contact via structures extending through the dielectric cap layer, overlying the memory stack structures, and having a top surface located within the first horizontal plane.

16. The three-dimensional memory device of claim 12, wherein each electrically conductive layer has a respective uniform thickness throughout a respective horizontal sub-portion and a region of a respective non-horizontal sub-portion.

17. The three-dimensional memory device of claim 12, further comprising:
a semiconductor device located on the substrate;
a device contact via structure extending through the dielectric mesa structure and contacting the semiconductor device; and
an interconnect line structure contacting a top surface of the device contact via structure and one of the word line contact via structures.

18. The three-dimensional memory device of claim 12, further comprising support pillar structures extending through a first region of the alternating stack that includes the non-horizontal sub-portions of the electrically conductive layers and laterally separating vertical sub-portions of at least one of the electrically conductive layers.

19. The three-dimensional memory device of claim 18, wherein:
the electrically conductive layers comprise word lines;
each of the support pillar structures comprises a semiconductor fill structure that is not electrically active, a dielectric fill structure, and the memory film;
the support pillar structures have substantially rectangular horizontal cross-sectional areas having a length which is greater than the width by at least two times.

20. The three-dimensional memory device of claim 12, wherein the at least one dielectric sidewall of the dielectric mesa structure has a taper angle in a range from 30 degrees to 75 degrees with respect to a vertical direction that is perpendicular to the top surface of the substrate.

21. The three-dimensional memory device of claim 12, wherein one of the electrically conductive layers has a top surface including a first region located outside of the lateral indentations and having a first width and a second region extending into one of the lateral indentations and having a second width that is greater than the first width.

22. The three-dimensional memory device of claim 12, wherein:

the three-dimensional memory device comprises a vertical NAND device located over the substrate;

the electrically conductive layers comprise, or are electrically connected to, a respective word line of the NAND device;

the substrate comprises a silicon substrate;

the vertical NAND device comprises an array of monolithic three-dimensional NAND strings over the silicon substrate;

at least one memory cell in a first device level of the array of monolithic three-dimensional NAND strings is located over another memory cell in a second device level of the array of monolithic three-dimensional NAND strings;

the silicon substrate contains an integrated circuit comprising a driver circuit for the memory device located thereon;

the electrically conductive layers comprise a plurality of control gate electrodes having a strip shape extending substantially parallel to the top surface of the substrate, the plurality of control gate electrodes comprise at least a first control gate electrode located in a first device level and a second control gate electrode located in a second device level; and the array of monolithic three-dimensional NAND strings comprises:

a plurality of semiconductor channels, wherein at least one end portion of each of the plurality of semiconductor channels extends substantially perpendicular to a top surface of the substrate, and a plurality of charge storage elements, each charge storage element located adjacent to a respective one of the plurality of semiconductor channels.

\* \* \* \* \*